(12) United States Patent
Chibahara et al.

(10) Patent No.: US 8,829,679 B2
(45) Date of Patent: *Sep. 9, 2014

(54) SEMICONDUCTOR DEVICE AND METHOD FOR MANUFACTURING THE SAME

(75) Inventors: Hiroyuki Chibahara, Tokyo (JP); Atsushi Ishii, Tokyo (JP); Naoki Izumi, Tokyo (JP); Masahiro Matsumoto, Tokyo (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/534,844

(22) Filed: Jun. 27, 2012

(65) Prior Publication Data

US 2012/0267793 A1 Oct. 25, 2012

Related U.S. Application Data

(63) Continuation of application No. 13/180,202, filed on Jul. 11, 2011, now Pat. No. 8,232,650, which is a continuation of application No. 12/821,703, filed on Jun. 23, 2010, now Pat. No. 7,998,839, which is a continuation of application No. 12/426,588, filed on Apr. 20, 2009, now Pat. No. 7,759,798.

(30) Foreign Application Priority Data

May 30, 2008 (JP) ................. 2008-142872

(51) Int. Cl.
 *H01L 23/48* (2006.01)
(52) U.S. Cl.
 USPC ............... 257/758; 257/618; 257/760
(58) Field of Classification Search
 USPC ............ 257/618, 620, 211, 758, 760
 See application file for complete search history.

(56) References Cited

U.S. PATENT DOCUMENTS 6,849,888 B2 2/2005 Ooishi
6,858,914 B2 2/2005 Nanjo et al.
(Continued)

FOREIGN PATENT DOCUMENTS

CN 1499626 A 5/2004
JP 2004-153015 5/2004
(Continued)

OTHER PUBLICATIONS

Chinese Office Action, and English translation thereof, issued in Chinese Patent Application No. 200910203111.1 dated Jun. 20, 2012.

(Continued)

*Primary Examiner* — Kevin M Picardat
(74) *Attorney, Agent, or Firm* — McDermott Will & Emery LLP

(57) ABSTRACT

A semiconductor device wherein destruction of a sealing ring caused by cracking of an interlayer dielectric film is difficult to occur, as well as a method for manufacturing the semiconductor device, are provided. A first laminate comprises first interlayer dielectric films having a first mechanical strength. A second laminate comprises second interlayer dielectric films having a mechanical strength higher than the first mechanical strength. A first region includes first metallic layers and vias provided within the first laminate. A second region includes second metallic layers and vias provided within the second laminate. When seen in plan, the second region overlaps at least a part of the first region, is not coupled with the first region by vias, and sandwiches the second interlayer dielectric film between it and the first region.

7 Claims, 52 Drawing Sheets

(56) References Cited

U.S. PATENT DOCUMENTS

| | | |
|---|---|---|
| 7,211,897 B2 | 5/2007 | Yamanoue et al. |
| 7,235,864 B2 | 6/2007 | Lee |
| 7,294,932 B2 | 11/2007 | Hiroi |
| 7,400,028 B2 | 7/2008 | Tomita |
| 7,420,278 B2 | 9/2008 | Tomita |
| 7,626,268 B2 | 12/2009 | Goebel et al. |
| 7,696,607 B2 | 4/2010 | Sano et al. |
| 7,759,798 B2 | 7/2010 | Chibahara et al. |
| 7,777,340 B2 | 8/2010 | Nakao et al. |
| 7,777,341 B2 | 8/2010 | Kumagai |
| 7,998,839 B2 * | 8/2011 | Chibahara et al. ............ 438/462 |
| 8,232,650 B2 * | 7/2012 | Chibahara et al. ............ 257/758 |
| 2004/0084777 A1 | 5/2004 | Yamanoue et al. |
| 2005/0263855 A1 | 12/2005 | Fu et al. |
| 2006/0022224 A1 | 2/2006 | Hiroi |
| 2007/0001308 A1 | 1/2007 | Takemura |
| 2007/0018331 A1 | 1/2007 | Chen |
| 2007/0202792 A1 | 8/2007 | Shimizu et al. |
| 2007/0278559 A1 | 12/2007 | Saito |

FOREIGN PATENT DOCUMENTS

| | | |
|---|---|---|
| JP | 2006-005288 A | 1/2006 |
| JP | 2006-041244 A | 2/2006 |
| JP | 2007-005536 A | 1/2007 |
| JP | 2008-066716 A | 3/2008 |
| JP | 2008-124070 A | 5/2008 |

OTHER PUBLICATIONS

Chinese Office Action with English translation issued in Chinese Application No. 200910203111.1 mailed Dec. 31, 2012.

Japanese Office Action with English Translation issued in Japanese Application No. 2008-142872 mailed Feb. 26, 2013.

* cited by examiner

SEMICONDUCTOR DEVICE AND METHOD FOR MANUFACTURING THE SAME

CROSS-REFERENCE TO RELATED APPLICATIONS

This application is a Continuation of U.S. application Ser. No. 13/180,202, filed on Jul. 11, 2011, now U.S. Pat. No. 8,232,650, which is a Continuation of U.S. application Ser. No. 12/821,703, filed on Jun. 23, 2010, now U.S. Pat. No. 7,998,839, which is a Continuation of U.S. application Ser. No. 12/426,588, filed on Apr. 20, 2009, now U.S. Pat. No. 7,759,798, claiming priority of Japanese Patent Application 2008-142872, filed on May 30, 2008, the entire contents of each of which are hereby incorporated by reference.

BACKGROUND OF THE INVENTION

The present invention relates to a semiconductor device and a method for manufacturing the same. Particularly, the present invention is concerned with a semiconductor device having a sealing ring which surrounds a chip region, as well as a method for manufacturing the semiconductor device.

There is known a semiconductor device having a sealing ring region formed so as to surround a chip region in plan to prevent the entry of water into the chip region in which an electric circuit is formed. The sealing ring region has a sealing ring formed on a substrate so as to extend in the thickness direction of the substrate. The sealing ring functions as a protection wall against water, whereby the entry of water into the chip region is suppressed.

There sometimes occurs a case where the sealing ring is destroyed in a dicing process during manufacture of a semiconductor device. This destruction phenomenon will be explained in regular order. First, the dicing operation causes chipping at an end portion of a substrate. With this chipping as a starting point, a crack is developed in an interlayer dielectric film formed on the substrate. When the crack reaches the sealing ring, there occurs destruction of the sealing ring. Once this destruction occurs, water is apt to get into the chip region, thus giving rise to the problem that the reliability of the semiconductor device is deteriorated.

This problem is more likely to occur when a low dielectric constant film formed of a low-k material or ULK (Ultra Low-k) material is used as an interlayer dielectric film to decrease parasitic capacitance. This is because the low-k or ULK material is low in mechanical strength and therefore a crack is more likely to occur. For example, in case of using Young's modulus as an index of mechanical strength, Young's modulus of SiO (silicon oxide), which is the material of a conventional interlayer dielectric film (non-low-k film), is 75 Gpa or so, while that of organic silica glass, which is one of low-k materials, is about 10 to 25 GPa. ULK material, which is a material rendered porous for attaining a still lower dielectric constant, has a smaller Young's modulus. Thus, in a semiconductor device using a low dielectric constant film, the destruction problem of the sealing ring caused by cracking is more likely to occur.

In a semiconductor device there often is adopted a configuration wherein on one interlayer dielectric film formed of a low dielectric constant material there is disposed another interlayer dielectric film of a higher mechanical strength. In this case, a crack developed in one interlayer dielectric film is difficult to expand into the other interlayer dielectric film having a higher mechanical strength. Consequently, the crack is difficult to advance upwards through the semiconductor device and it is apt to advance in the intra-plane direction of the substrate in the interior of the semiconductor device. As a result, the crack reaches the sealing ring and hence the possibility of the sealing ring being destroyed becomes still higher.

As described above, a crack developed in the interlayer dielectric film exerts a bad influence on the reliability of the semiconductor device. In view of this point there have been proposed techniques for suppressing the formation of a crack. For example, in Japanese Unexamined Patent Publication No. 2004-153015 (Patent Literature 1) it is proposed to form a dummy pattern-forming region around a guard ring (sealing ring). The dummy pattern-forming region has plural dummy patterns in each of plural places in plan. The plural dummy patterns are arranged in the thickness direction and are rendered integral by via coupling made in the thickness direction. According to the publication, since an interlayer dielectric film located near the dummy patterns can be reinforced by via coupling, the occurrence of a crack in the interlayer dielectric film is prevented.

Patent Literature 1

Japanese Unexamined Patent Publication No. 2004-153015 (FIGS. 1 to 3)

SUMMARY OF THE INVENTION

The technique disclosed in the above publication intends to prevent the occurrence of a crack in the interlayer dielectric film. However, in a dicing process, there often occurs a case where a large stress is developed. Therefore, even if the technique disclosed in the above publication is applied, it is difficult to fully prevent the occurrence of a crack in the interlayer dielectric film.

Once a crack is developed, the crack can expand like weaving beside the reinforced portion of the interlayer dielectric film. That is, the crack can expand while sidestepping the dummy patterns rendered integral by via coupling and can finally reach the sealing ring. As a result, there arises the problem that the sealing ring can be destroyed.

The present invention has been accomplished in view of the above-mentioned problem and it is an object of the invention to provide a semiconductor device wherein the destruction of a sealing ring caused by cracking of an interlayer dielectric film is difficult to occur, as well as a method for manufacturing the semiconductor device.

In one aspect of the present invention there is provided a semiconductor device comprising a chip region, a sealing ring region which surrounds the chip region in plan, and a dummy region which surrounds an outer periphery of the sealing ring region in plan. The dummy region comprises a semiconductor substrate, first and second laminates, at least one first region, and at least one second region. The first laminate is provided over the semiconductor substrate and includes a first interlayer dielectric film having a first mechanical strength. The second laminate is provided over the first laminate and includes a second interlayer dielectric film having a mechanical strength higher than the first mechanical strength. The first region includes a plurality of first metallic layers which are provided within the first laminate so as to mutually overlap in plan and also includes vias for mutually coupling the first metallic layers. The second region includes a plurality of second metallic layers which are provided within the second laminate so as to mutually overlap in plan and also includes vias for mutually coupling the second metallic layers. The second region overlaps at least a part of the first region in plan, is not coupled with the first region by vias, and sandwiches the second interlayer dielectric film between it and the first region.

In another aspect of the present invention there is provided a semiconductor device comprising a chip region, a sealing ring region which surrounds the chip region in plan, and a dummy region which surrounds an outer periphery of the sealing ring region in plan. The dummy region comprises a semiconductor substrate, first and second laminates, at least one first region, and at least one second region. The first laminate is provided over the semiconductor substrate and includes a first interlayer dielectric film having a first mechanical strength. The second laminate is provided over the first laminate and includes a second interlayer dielectric film having a mechanical strength higher than that of the first mechanical strength. The first region includes a plurality of first metallic layers which are provided within the first laminate so as to mutually overlap in plan. The second region includes a plurality of second metallic layers which are provided within the second laminate so as to mutually overlap in plan. The second region, in plan, is provided at a position deviated from the position of the first region so as to overlap a part of the first region and be spaced away from the sealing ring region.

In a further aspect of the present invention there is provided a method for manufacturing a semiconductor device, comprising the following steps.

There is formed a wafer comprising a chip region, a sealing ring region which surrounds the chip region in plan, and a dummy region which surrounds an outer periphery of the sealing ring in plan. The wafer is cut along an outer periphery of the dummy region. The dummy region comprises a semiconductor substrate, first and second laminates, and first and second regions. The first laminate is provided over the semiconductor substrate and includes a first interlayer dielectric film having a first mechanical strength. The second laminate is provided over the first laminate and includes a second interlayer dielectric film having a mechanical strength higher than the first mechanical strength. The first region includes a plurality of first metallic layers which are provided within the first laminate so as to mutually overlap in plan and also includes vias for mutually coupling the first metallic layers. The second region includes a plurality of second metallic layers which are provided within the second laminate so as to mutually overlap in plan and also includes vias for mutually coupling the second metallic layers. The second region overlaps at least a part of the first region in plan, is not coupled with the first region by vias, and sandwiches the second interlayer dielectric film between it and the first region.

In a still further aspect of the present invention there is provided a method for manufacturing a semiconductor device, comprising the following steps.

There is formed a wafer comprising a chip region, a sealing ring region which surrounds the chip region, and a dummy region which surrounds an outer periphery of the sealing ring region. The wafer is cut along an outer periphery of the dummy region. The dummy region comprises a semiconductor substrate, first and second laminates, and first and second regions. The first laminate is provided over the semiconductor substrate and includes a first interlayer dielectric film having a first mechanical strength. The second laminate is provided over the first laminate and includes a second interlayer dielectric film having a mechanical strength higher than the first mechanical strength. The first region includes a plurality of first metallic layers which are provided within the first layer so as to mutually overlap in plan. The second region includes a plurality of second metallic layers which are provided within the second laminate so as to mutually overlap in plan. The second region, in plan, is provided at a position deviated from the position of the first region so as to overlap a part of the first region and be spaced away from the sealing ring region.

According to the semiconductor device in one aspect of the present invention described above, in part of the second laminate there is formed a portion wherein a dielectric film including the second interlayer dielectric film is sandwiched in between the first and second regions. This portion has a small film thickness because it is sandwiched in between the first and second regions, and is not reinforced by via coupling. Thus, this portion in the second laminate is apt to be cracked locally. In the presence of such an easily cracked portion, a crack is easier to be developed and expand from the first laminate including the first interlayer dielectric film of a low mechanical strength to the second laminate including the second interlayer dielectric film of a higher mechanical strength. That is, a crack is easier to advance upwards and hence easier to advance upwards through the semiconductor device before reaching the sealing ring. Consequently, the occurrence of destruction of the sealing ring caused by cracking is suppressed, so that a high reliability of the semiconductor device is ensured.

According to the semiconductor device in another aspect of the present invention described above, the second region which closes from above the portion sandwiched in between the first and second regions is provided at a position deviated from the position of the first region so as to be spaced away from the sealing ring in plan. Therefore, a crack developed and expanded in this sandwiched portion can advance upwards at a position spaced away from the sealing ring region without being obstructed by the second region. As a result, it becomes easier for the crack to advance upwards through the semiconductor device before reaching the sealing ring. Thus, since the occurrence of destruction of the sealing ring caused by cracking is suppressed, a high reliability of the semiconductor device is ensured.

DETAILED DESCRIPTION OF PREFERRED EMBODIMENTS

Embodiments of the present invention will be described below with reference to the accompanying drawings.

First Embodiment

First, with reference to FIGS. 1 to 3, a description will be given about a schematic configuration of a semiconductor device embodying the present invention.

Figure 1:
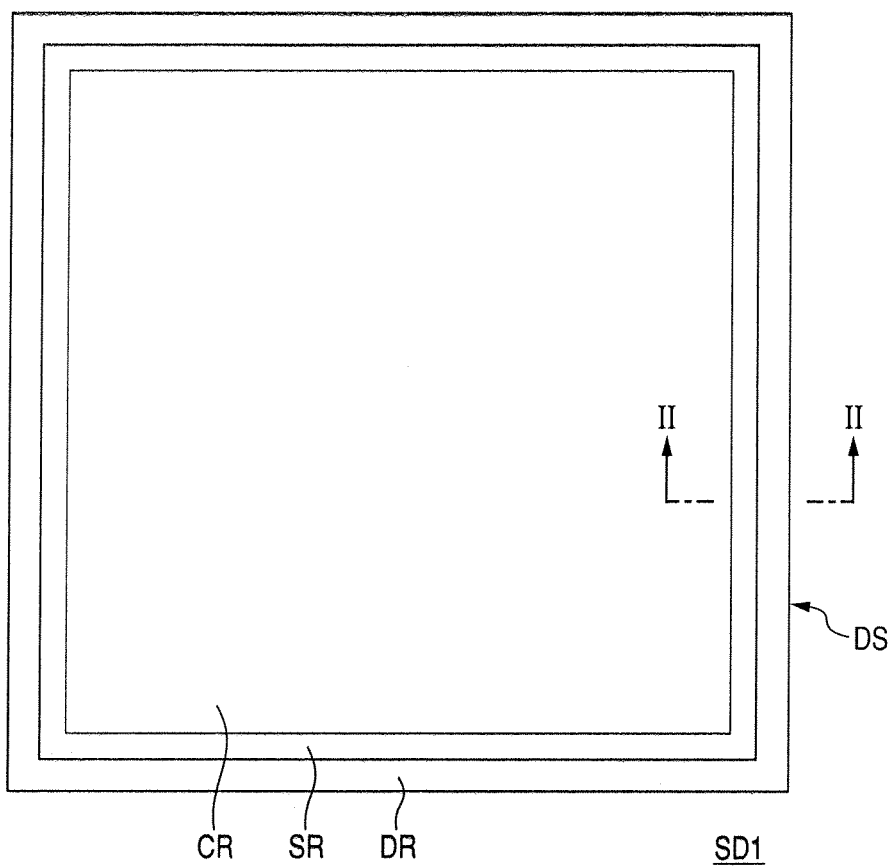
FIG. 1 is a diagram showing schematically a planar layout of a semiconductor device according to a first embodiment of the present invention.

FIG. 1 is a diagram showing schematically a planar layout of a semiconductor device according to a first embodiment of the present invention. Referring to FIG. 1, the semiconductor device, indicated at SD1, according to this first embodiment includes a chip region CR, a sealing ring region SR, and a dummy region DR, in a planar layout. The sealing ring region SR surrounds the chip region CR when seen in plan. The dummy region DR surrounds an outer periphery of the sealing ring region SR when seen in plan. Outer side faces of the dummy region DR are dicing faces DS which are cut faces in a dicing process.

Figure 2:
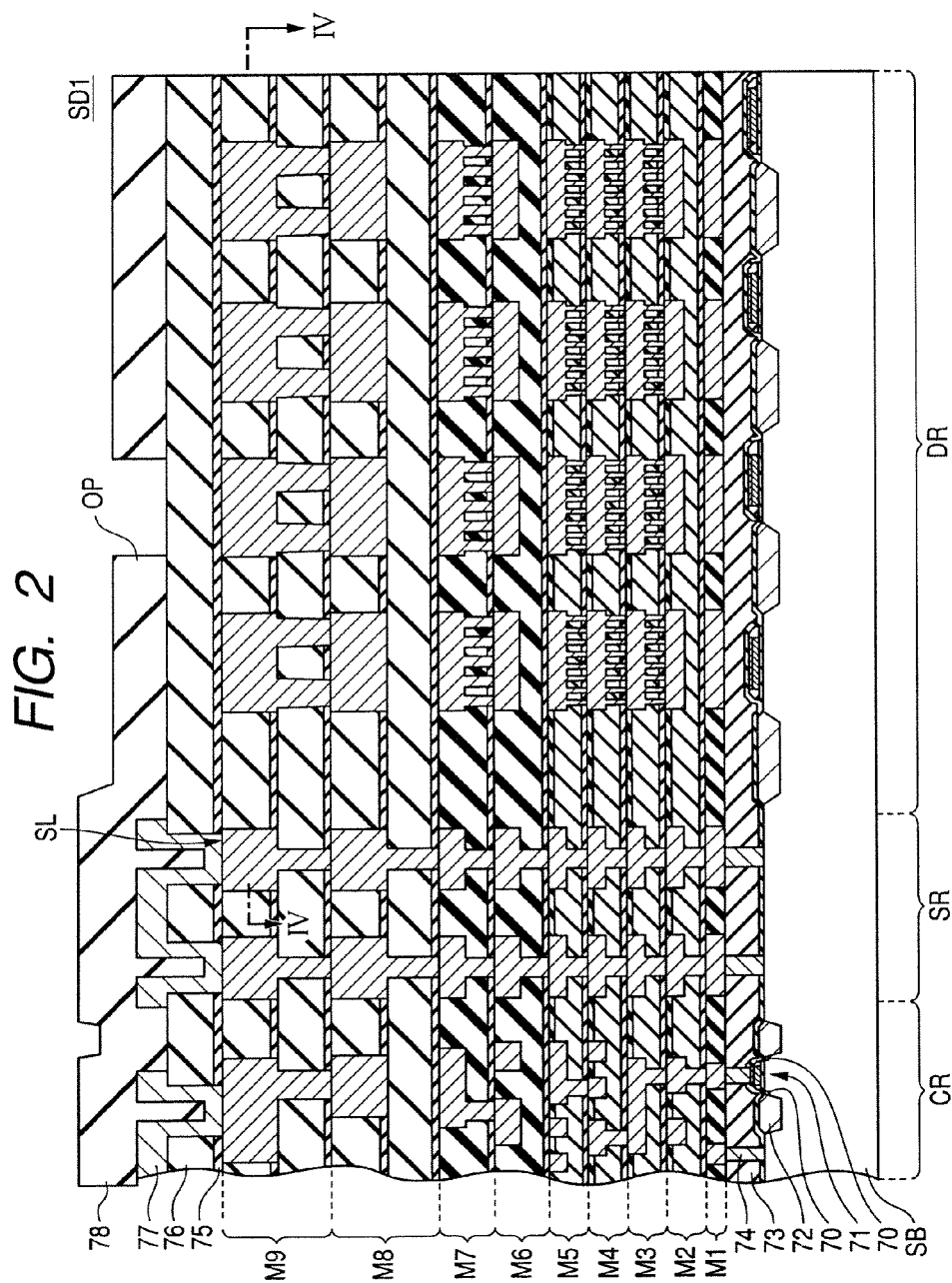
FIG. 2 is a schematic sectional view taken along line II-II in FIG. 1.

FIG. 2 is a schematic sectional view taken along line II-II in FIG. 1. Referring to FIG. 2, the semiconductor device SD1 includes a semiconductor substrate SB, a semiconductor element 71, an element isolation film 72, insulation films 73, 75, 76, contacts 74, wiring 77, a protective film 78, and layers M1 to M9. In the chip region CR, the semiconductor element 71, which has a source/drain region 70, is formed on the semiconductor substrate SB. The protective film 78 is formed of silicon nitride. The contacts 74 are formed so as to extend through the insulation film 73. The layers M1 to M9 are formed in this order on both insulation film 73 and contacts 74. Each of the layers M1 to M9 has a metal portion and an insulator portion. With the layers M1 to M9, an electric circuit including the semiconductor element 71 is formed in the chip region CR, and a sealing ring SL is formed in the sealing ring region SR. Further, an opening OP is formed in the protective film 78 in such a form as extends in parallel with the sealing ring SL and surrounds the sealing ring SL and so as to expose the insulation film 76. The opening OP is for preventing the occurrence of destruction of the sealing ring SL and the wiring 77 caused by transmission of stress of a sealing material such as resin to the sealing ring and the wiring along the protective film 78 which is a hard film at the time of sealing of the semiconductor device SD1 into a package. The opening OP further functions to prevent the occurrence of destruction of the sealing ring SL and the wiring 77 caused by transmission of stress related to dicing to the sealing ring and the wiring along the hard protective film 78 when the protective film is cut in the dicing process during manufacture of the semiconductor device.

Figure 3:
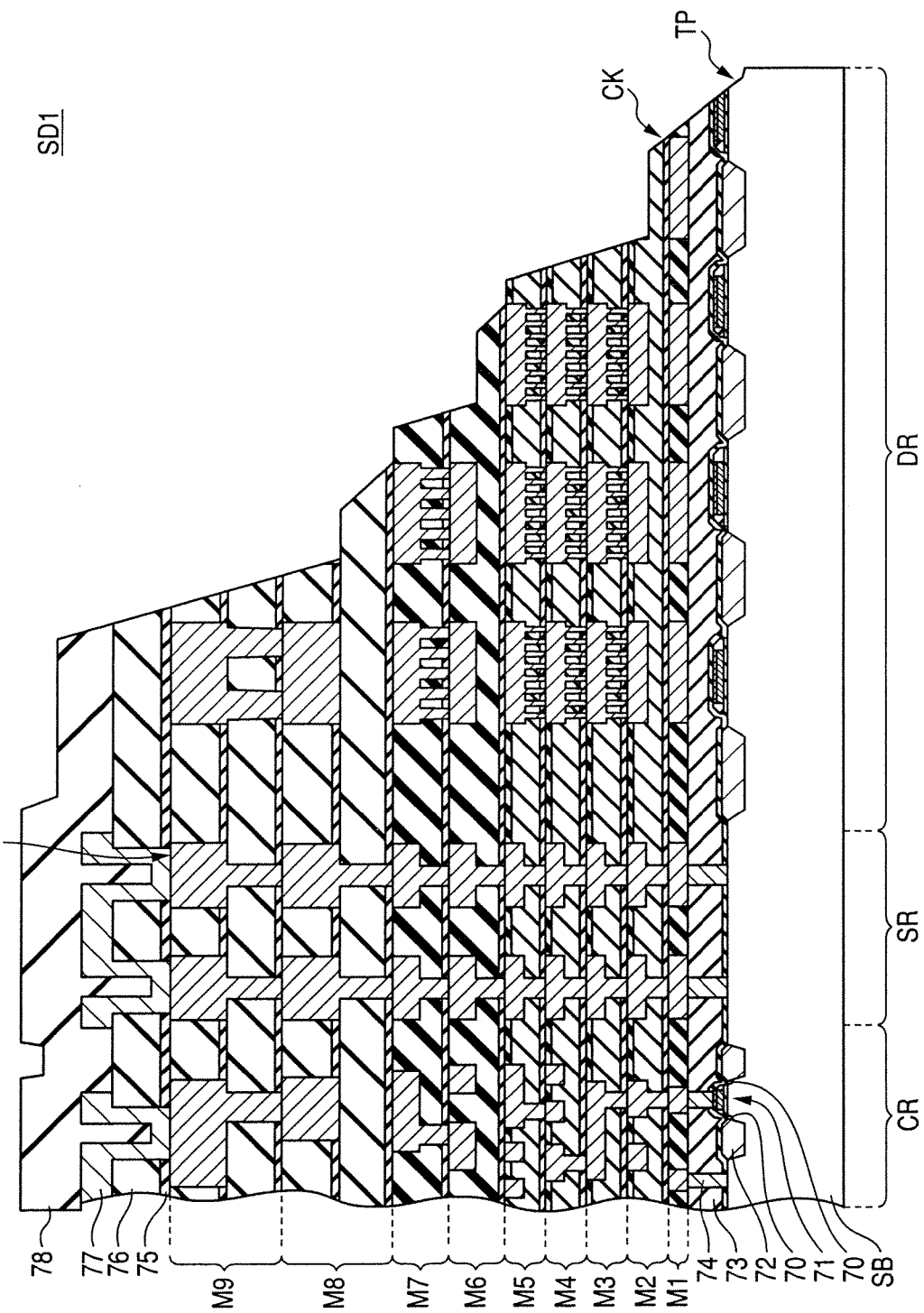
FIG. 3 is a sectional view showing schematically a cracked state in FIG. 2.

FIG. 3 is a sectional view showing schematically a cracked state in FIG. 2. Referring to FIG. 3, there sometimes is a case where the semiconductor device SD1 has a chipping TP and a crack CK which are attributable to the dicing process in the manufacture of the semiconductor device. The chipping TP occurs at a side face of the semiconductor substrate SB. With the chipping TP as a starting point, the crack CK advances upwards (to the protective film 78 side) in the dummy region DR of the semiconductor device SD1. That is, the crack CK occurs only within the dummy region DR and does not reach the sealing ring SL provided in the sealing ring region SR. Thus, the sealing ring SL is not damaged by the crack CK and retains its function of preventing the entry of water into the chip region CR, whereby the semiconductor device SD1 possesses a high reliability.

Figure 5:
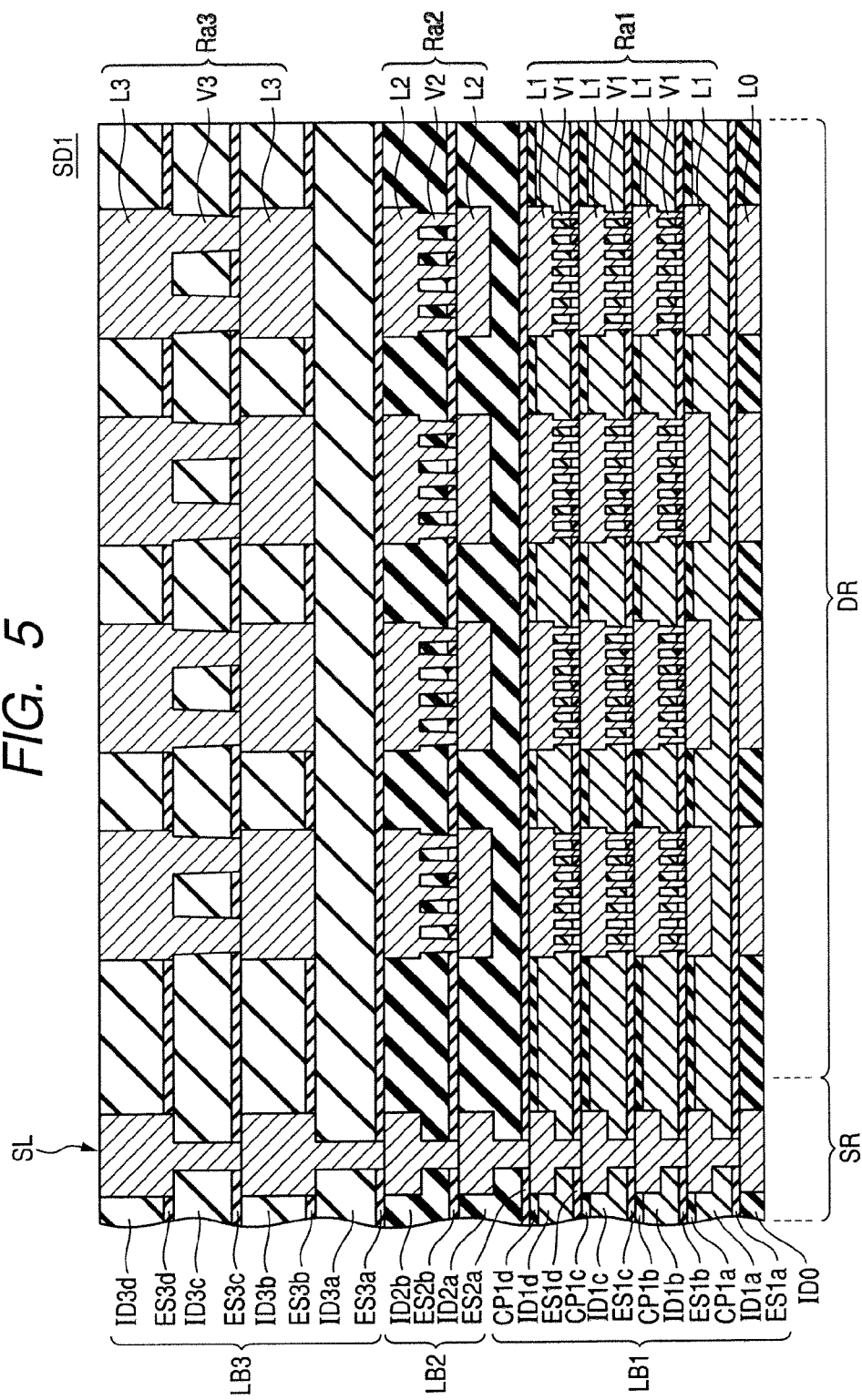
FIG. 5 is a schematic sectional view taken along line V-V in FIG. 4.
Figure 6:
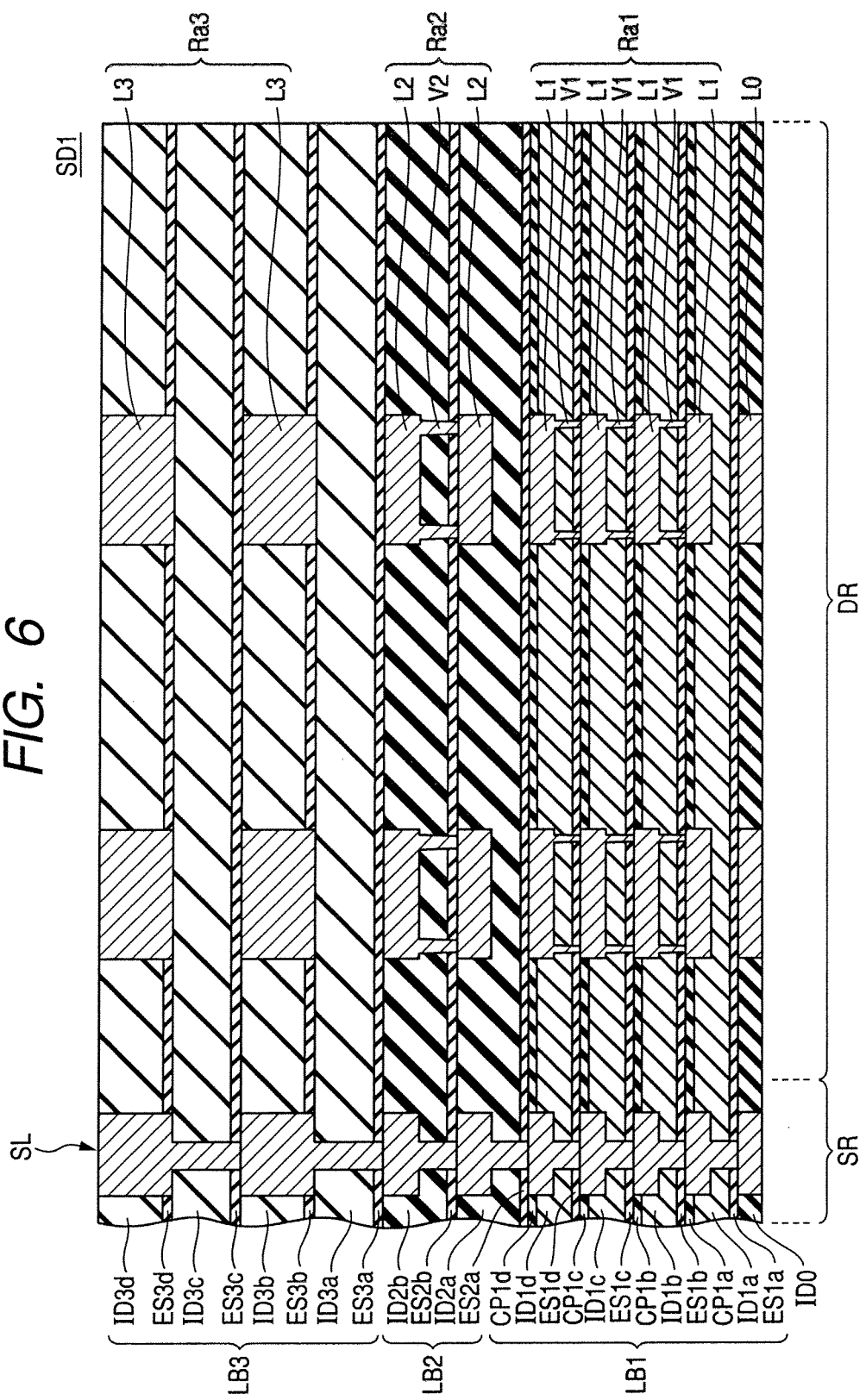
FIG. 6 is a schematic sectional view taken along line VI-VI in FIG. 4.
Figure 7:
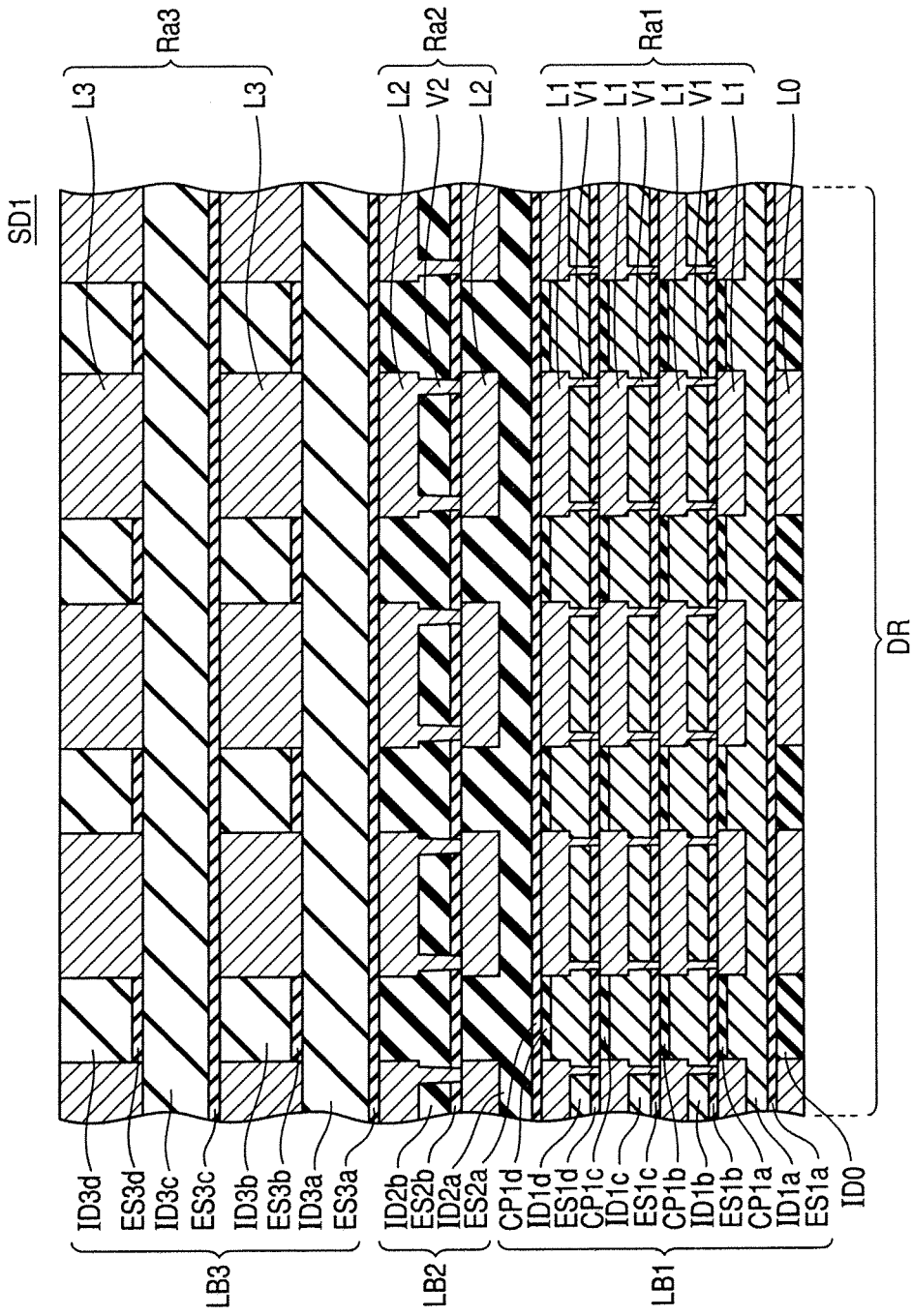
FIG. 7 is a schematic sectional view taken along line VII-VII in FIG. 4.

A more detailed description will now be given about the configuration of the semiconductor device SD1. Referring mainly to FIGS. 2 and 5, in designing a wiring structure of the semiconductor device SD1, the layers M1 to M9, forming a multilayer wiring structure, is treated in a classified manner into a portion comprising the layer M1, a portion comprising the layers M2 to M5, a portion comprising the layers M6 and M7, and a portion comprising the layers M8 and M9. For each of the portions there are selected the material and size rule of an interlayer dielectric film.

Figure 8:
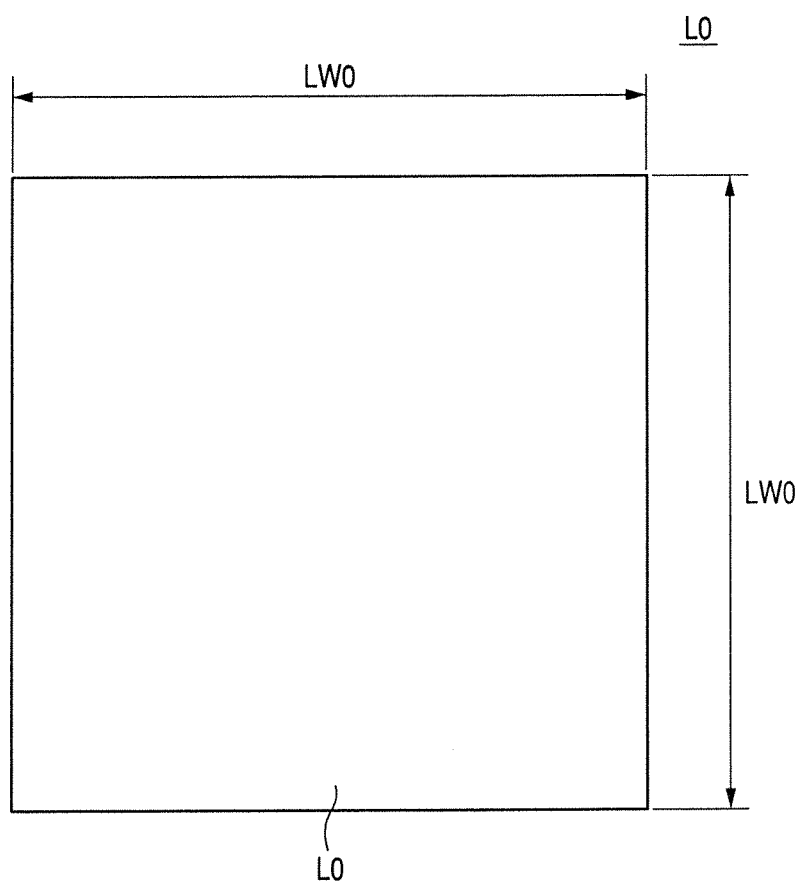
FIG. 8 is a schematic diagram showing a planar layout of a metallic layer provided within an interlayer insulating film in the semiconductor device of the first embodiment.

An interlayer dielectric film ID0 as an insulator portion in the layer M1 is formed of a non-low-k material such as SiO or a low-k material such as SiOC. The layer M1 has a function as a local wiring for constituting a basic circuit including the semiconductor element 71 in the chip region CR. Also, the layer M1 has a metal portion as part of the sealing ring SL in the sealing ring region SR. Further, the layer M1 has a metal layer L0 in the dummy region DR. The metal layer L0 is formed in the interlayer dielectric film ID0 by a single damascene process. As shown in FIG. 8, a planar layout of the metal layer L0 is a square shape having a one side length of LW0. The length LW0 is, for example, 1.5 µm.

The layers M2 to M5 have a first laminate LB1 as an insulator portion. The first laminate LB1 is a laminate in which an etching stopper film ES1a, a first interlayer dielectric film ID1a, a cap film CP1a, an etching stopper film ES1b, a first interlayer dielectric film ID1b, a cap film CP1b, an etching stopper film ES1c, a first interlayer dielectric film ID1c, a cap film CP1c, an etching stopper film ES1d, a first interlayer dielectric film ID1d, and a cap film CP1d, are laminated in this order. The material of the first interlayer dielectric films ID1a to ID1d is a ULK material having a smaller relative dielectric constant and a lower mechanical strength than those of the material of the interlayer dielectric film ID0. The etching stopper films ES1a to ES1d are formed of SiCO/SiCN laminate material. The material of the cap films CP1a to CP1d is SiOC.

The layers M2 to M5 have metal portions formed by a dual damascene process. The metal portions each have a function as an intermediate wiring on a local wiring in the chip region CR. The metal portions constitute a part of the sealing ring SL in the sealing ring region SR. In the dummy region DR the metal portions constitute first regions Ra1 provided within the first laminate LB1.

Figure 9:
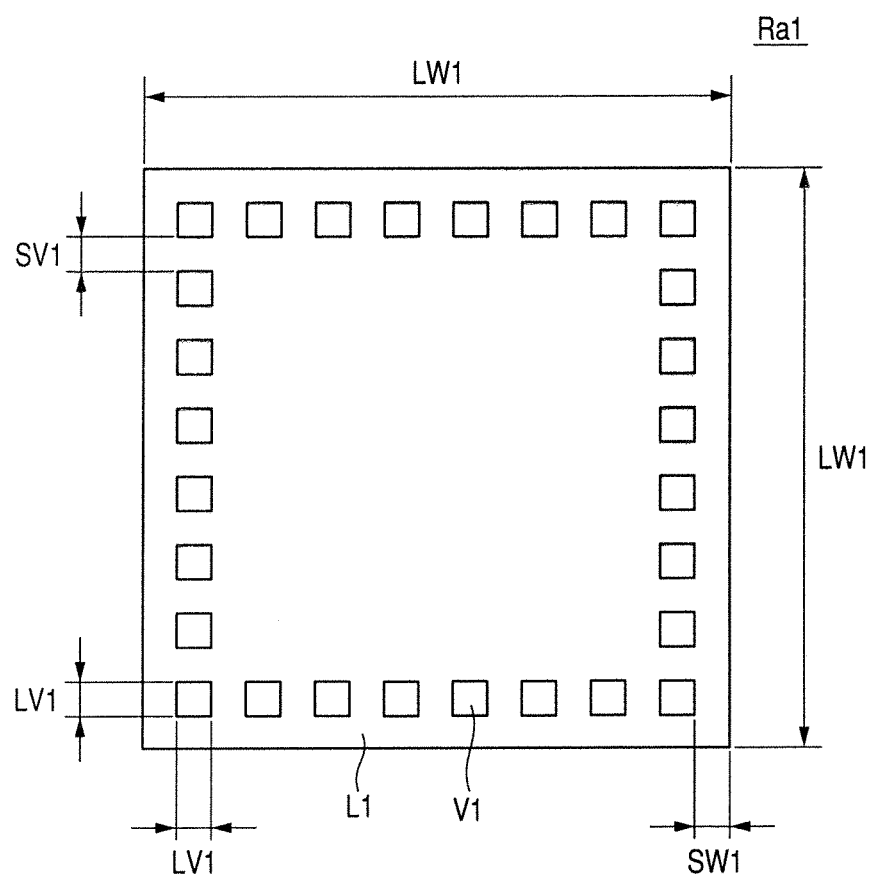
FIG. 9 is a schematic diagram showing a planar layout of a first region provided within a first laminate in the semiconductor device of the first embodiment.

The first regions Ra1 have a plurality of first metallic layers L1 which are formed within the first laminate LB1 so as to overlap each other in plan and also have vias V1 for coupling the first metallic layers L1. As shown in FIG. 9, a planar layout of each first region Ra1 comprises a square having a one side length of LW1 and corresponding to the first metallic layers L1 and squares having a one side length of LV1 and corresponding to the vias V1. The squares corresponding to the vias V1 are arranged plurally along the outer periphery portion of the square corresponding to the first metallic layers L1. The length LW1 is equal to the length LW0 (FIG. 8) and is, for example, 1.5 µm. In the drawing, for example, the length SV1 is 0.12 µm and the length SW1 is 0.05 µm. When seen in plan, the vias V1 are arranged on the periphery of each first metallic layer L1 along the four sides of the first metallic layer (this layout will hereinafter be referred to as the "via V1 periphery layout").

The layers M6 and M7 have a second laminate LB2 as an insulator portion. The second laminate LB2 is a laminate in which an etching stopper film ES2a, a second interlayer dielectric film ID2a, an etching stopper film ES2b, and a second interlayer dielectric film ID2b, are laminated in this order. The material of the second interlayer dielectric films ID2a and ID2b is a low-k material having a larger relative dielectric constant and a higher mechanical strength than those of the ULK material of the first interlayer dielectric films ID1a to ID1d. For example, it is SiOC. The etching stopper films ES2a and ES2b are formed of SiCO/SiCN laminate material.

The layers M6 and M7 have metal portions formed by a dual damascene process. The metal portions each function as a first semiglobal wiring on the intermediate wiring in the chip region CR. Also, the metal portions constitute a part of the sealing ring SL in the sealing ring region SR. Further, the metal portions constitute second regions Ra2 provided within the second laminate LB2 in the dummy region DR.

Figure 10:
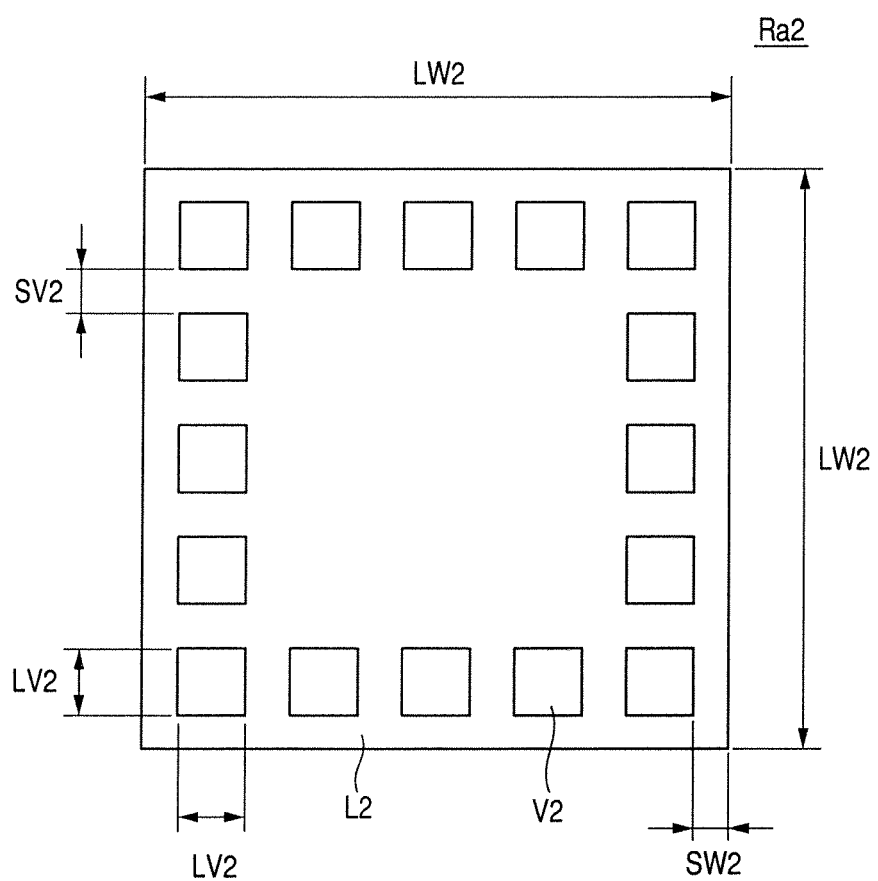
FIG. 10 is a schematic diagram showing a planar layout of a second region provided within a second laminate in the semiconductor device of the first embodiment.

The second regions Ra2 include a plurality of second metallic layers L2 which are provided within the second laminate LB2 so as to overlap each other in plan and also include vias V2 for coupling the second metallic layers L2. As shown in FIG. 10, a planar layout of each second region Ra2 comprises a square having a one side length of LW2 and corresponding to the second metallic layers L2 and squares having a one side length of LV2 and corresponding to the vias V2. The squares corresponding to the vias are arranged plurally along the outer periphery portion of the square corresponding to the second metallic layers L2. The length LW2 is equal to each of the lengths LW0 (FIG. 8) and LW1 (FIG. 9) and is, for example, 1.5 µm. In the drawing, for example, the length SV2 is 0.18 µm and the length SW2 is 0.065 µm. When seen in plan, the vias V2 are arranged on the periphery of each second metallic layer L2 along the four sides of the second metallic layer (this layout will hereinafter be referred to as the "via V2 periphery layout").

The second regions Ra2 overlap the first regions Ra1 in plan. The second regions Ra2 are not coupled through vias to the first regions Ra1 and they sandwich a second interlayer dielectric film ID2a between them and the first regions Ra1.

The layers M8 and M9 have a third laminate LB3 as an insulator portion. The third laminate LB3 is a laminate in which an etching stopper film ES3a, a third interlayer dielectric film ID3a, an etching stopper film ES3b, a third interlayer dielectric film ID3b, an etching stopper film ES3c, a third interlayer dielectric film ID3c, an etching stopper film ES3d, and a third interlayer dielectric film ID3d, are laminated in this order. The material of the third interlayer dielectric films ID3a to ID3d is a non-low-k material, e.g., SiO, having a larger relative dielectric constant and a higher mechanical strength than those of the low-k material of the second interlayer dielectric films ID2a and ID2b. The etching stopper films ES3a to ES3d are formed of SiCO/SiCN laminate material or SiCN single layer material.

The layers M8 and M9 have metal portions formed by a dual damascene process. The metal portions each function as a second semiglobal wiring on the first semiglobal wiring in the chip region CR. Also, the metal portions constitute a part of the sealing ring SL in the sealing ring region SR. Further, the metal portions constitute third regions Ra3 provided within the third laminate LB3 in the dummy region DR.

Figure 11:
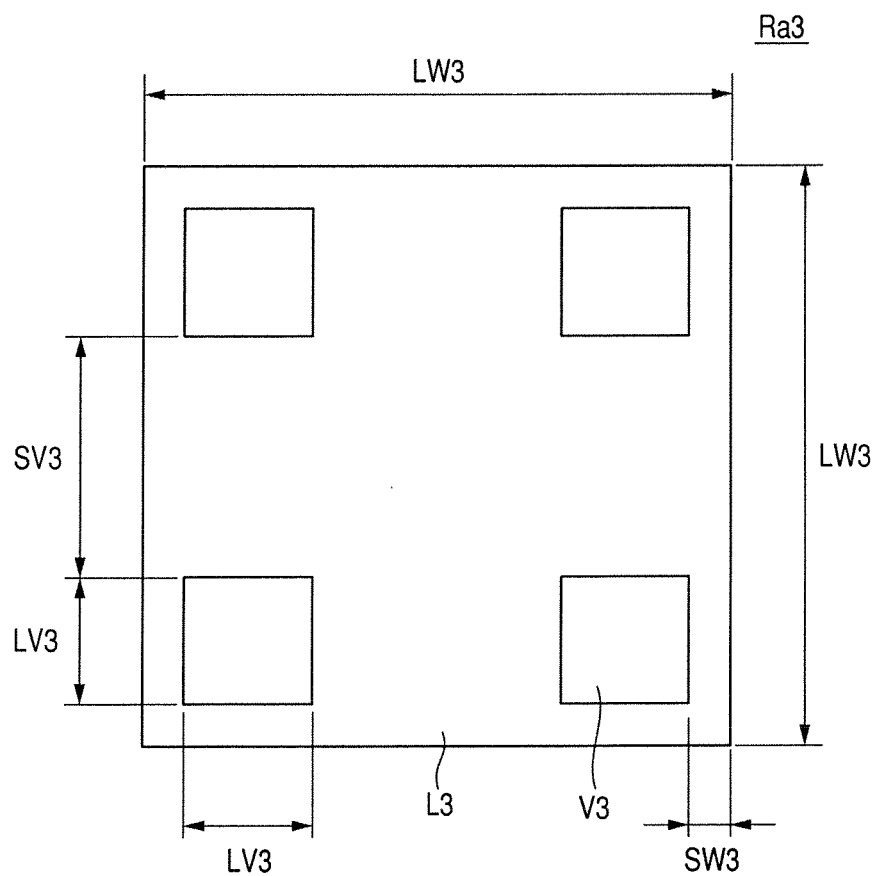
FIG. 11 is a schematic diagram showing a planar layout of a third region provided within a third laminate in the semiconductor device of the first embodiment.

The third regions Ra3 include a plurality of third metallic layers L3 which are provided within the third laminate LB3 so as to overlap each other in plan and also include vias V3 for coupling the third metallic layers L3. As shown in FIG. 11, a planar layout of each third region Ra3 comprises a square having a one side length of LW3 and corresponding to the third metallic layers L3 and squares having a one side length of LV3 and corresponding to the vias V3. The squares corresponding to the vias V3 are arranged plurally along the outer periphery portion of the square corresponding to the third metallic layers L3. The length LW3 is equal to each of the lengths LW0 to LW2 (FIGS. 8 to 10) and is, for example, 1.5 µm. In the drawing, for example, the length SV3 is 0.68 µm and the length SW3 is 0.5 µm. When seen in plan, the vias V3 are arranged on the periphery of each third metallic layer L3 along the four sides of the third metallic layer (this layout will hereinafter be referred to as the "via V3 periphery layout").

The third regions Ra3 overlap the second regions Ra2 in plan. The third regions Ra3 are not coupled through vias to the second regions Ra2 and they sandwich a third interlayer dielectric film ID3a between them and the second regions Ra2.

Figure 4:
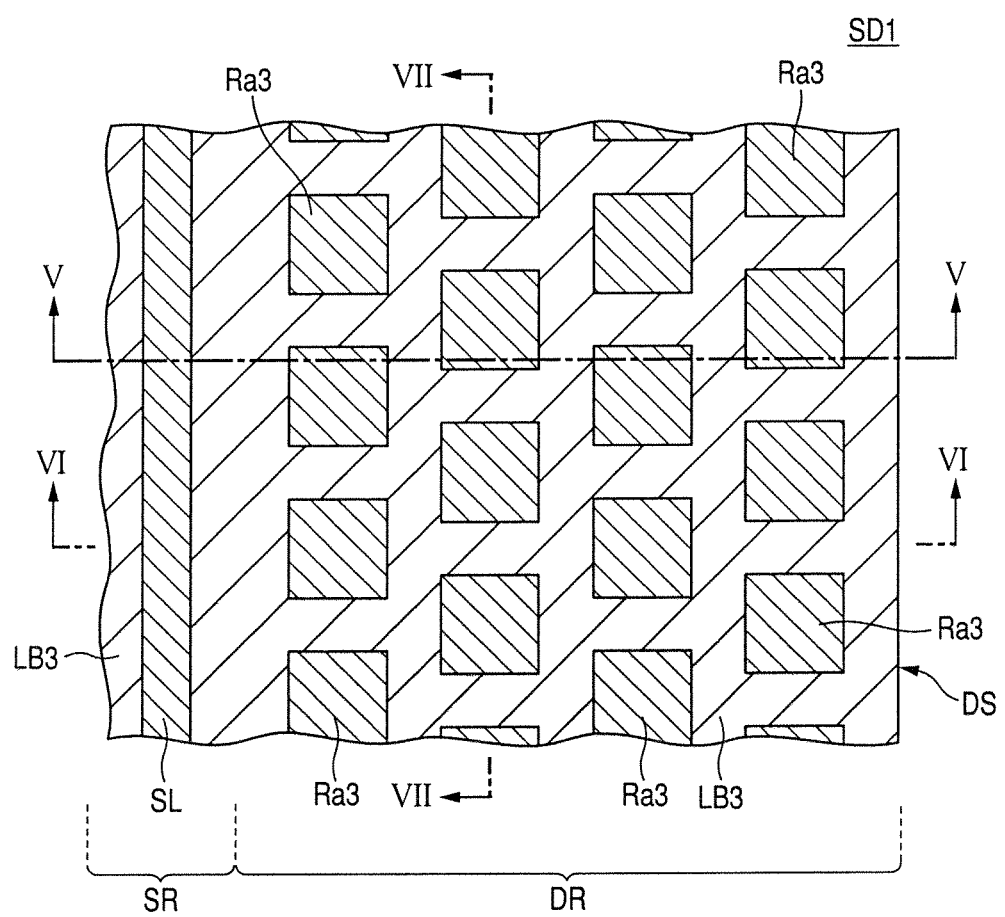
FIG. 4 is a schematic sectional view taken along line IV-IV in FIG. 2.

Referring mainly to FIG. 4, the third regions Ra3, when seen in plan, have an occupancy area ranging from 30% to 50% in the dummy region DR and have a pattern ranging from 1 to 4 square micrometers. The first regions Ra1 and the second regions Ra2 also have the same occupancy area and area pattern.

The third regions Ra3 are arranged regularly in plan. In the extending direction of the sealing ring SL the third regions Ra3 are arranged linearly at equal intervals. In a direction (the lateral direction in FIG. 4) orthogonal to the extending direction of the sealing ring SL the third regions Ra3 are arranged in a zigzag fashion at equal intervals. In other words, the third regions Ra3 formed in adjacent rows are shifted by a predetermined pitch from each other. More particularly, when seen in plan, the third regions Ra3 are arranged along plural rows and the third regions Ra3 positioned in adjacent rows are arranged in an alternate manner, thus affording the zigzag arrangement. With this zigzag arrangement, the sealing ring SL and the dicing faces DS are prevented from being linearly coupled together through an interlayer dielectric film in the direction orthogonal to the extending direction of the sealing ring SL. This layout is also true of the first and second regions Ra1, Ra2.

Figure 12:
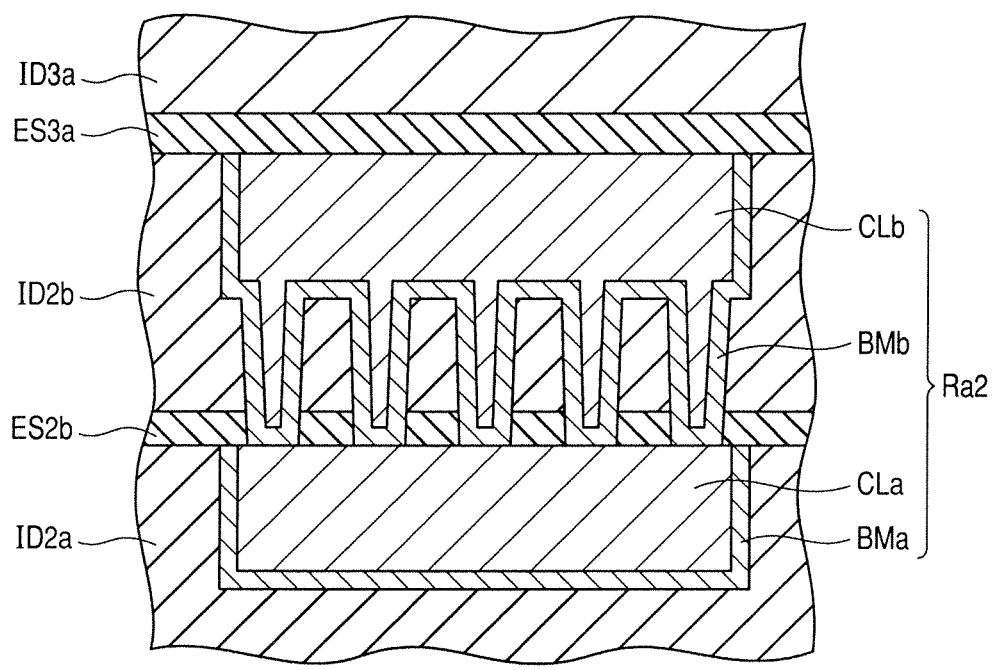
FIG. 12 is an enlarged diagram of the second region and the environs thereof shown in FIG. 5.

The metal portions of the layers M1 to M9 include barrier metal portions positioned at bottom and side face portions and Cu (copper) portions covered with the barrier metal portions. For example, as shown in FIG. 12, each second region Ra2 includes barrier metal portions BMa, BMb and Cu portions CLa, CLb.

Just under the opening OP, the first, second and third regions Ra1, Ra2, Ra3 may be omitted. In this case, the state of peeling of an interlayer dielectric film caused by chipping TP to be described later can be observed more easily by an automatic visual inspection apparatus. Thus, there accrues an effect that the analysis of defect becomes easier.

Figure 13:
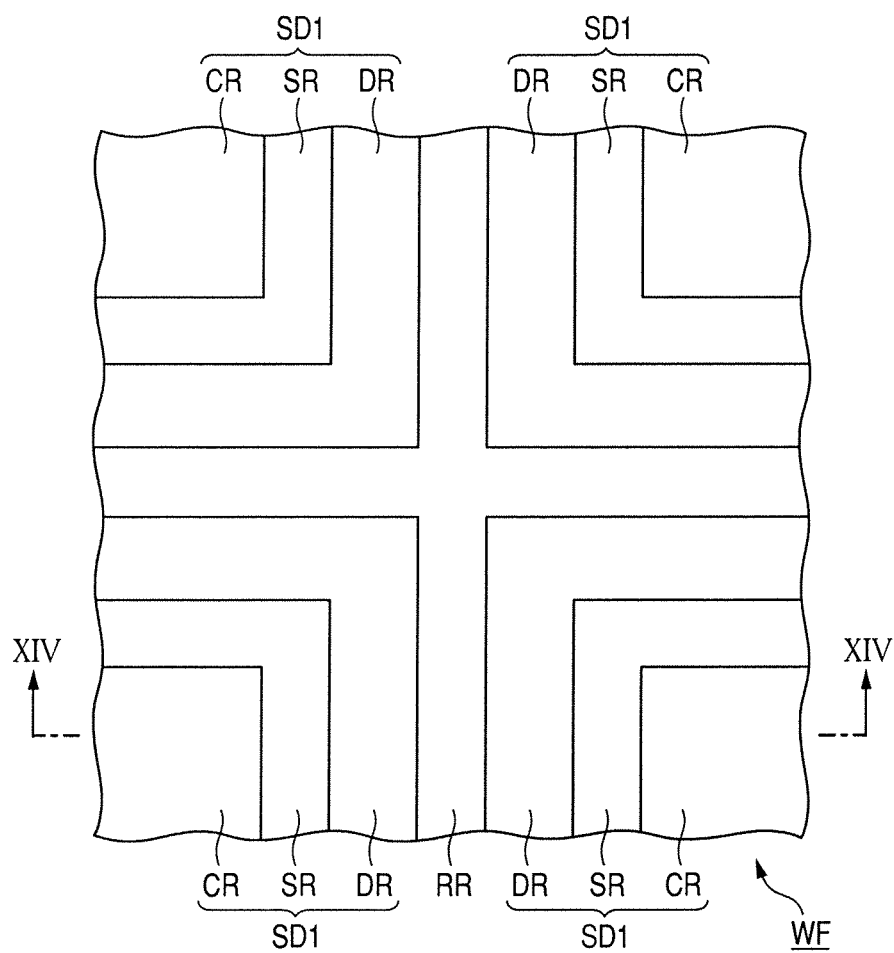
FIG. 13 is a schematic diagram showing a planar layout of a wafer used in a method for manufacturing the semiconductor device according to the first embodiment.

The following description is now provided about a method for manufacturing the semiconductor device SD1. FIG. 13 is a diagram showing schematically a planar layout of a wafer which is used in a method for manufacturing the semiconductor device according to the first embodiment of the present invention. Referring to FIG. 13, first a wafer WF is formed by a conventional wafer process. The wafer WF includes, in a planar layout, a plurality of semiconductor devices SD1 and a cutting region RR. Each semiconductor device SD1, in a planar layout, includes a chip region CR, a sealing ring region SR which surrounds the chip region CR, and a dummy region DR which surrounds the outer periphery of the sealing ring region SR.

Figure 14:
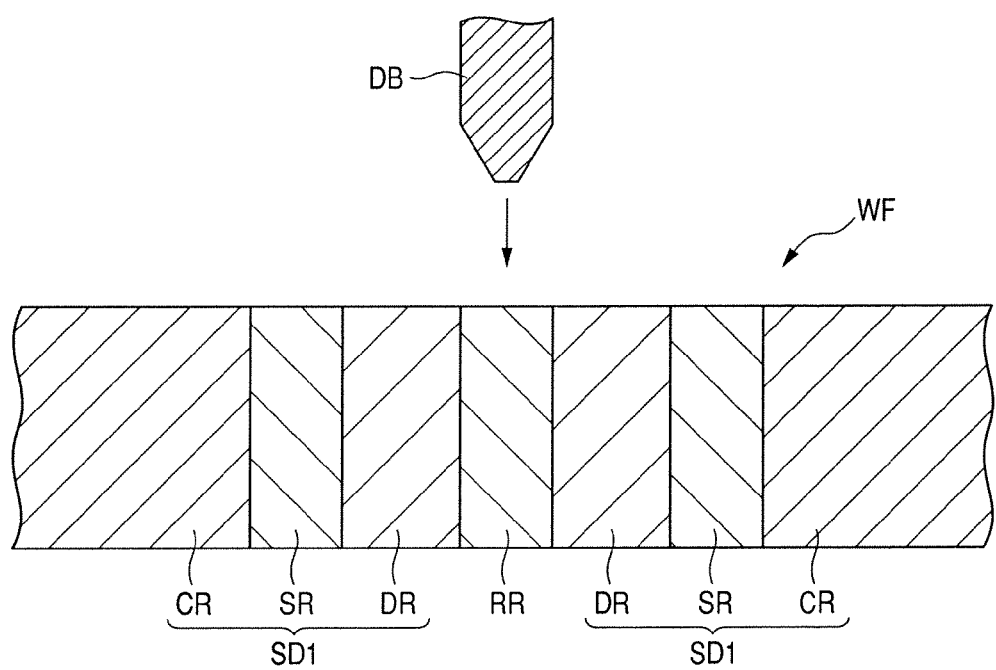
FIG. 14 is a partial sectional view showing schematically a dicing process carried out in the method for producing the semiconductor device according to the first embodiment.

FIG. 14 is a partial sectional view showing schematically a dicing process in the method for manufacturing the semiconductor device according to the first embodiment. Referring to FIG. 14, a dicing blade DB is pushed against the cutting region RR, whereby the wafer WF is cut along the outer periphery of the dummy region DR. The semiconductor devices SD1 are cut out from the wafer WF by this dicing process.

Figure 15:
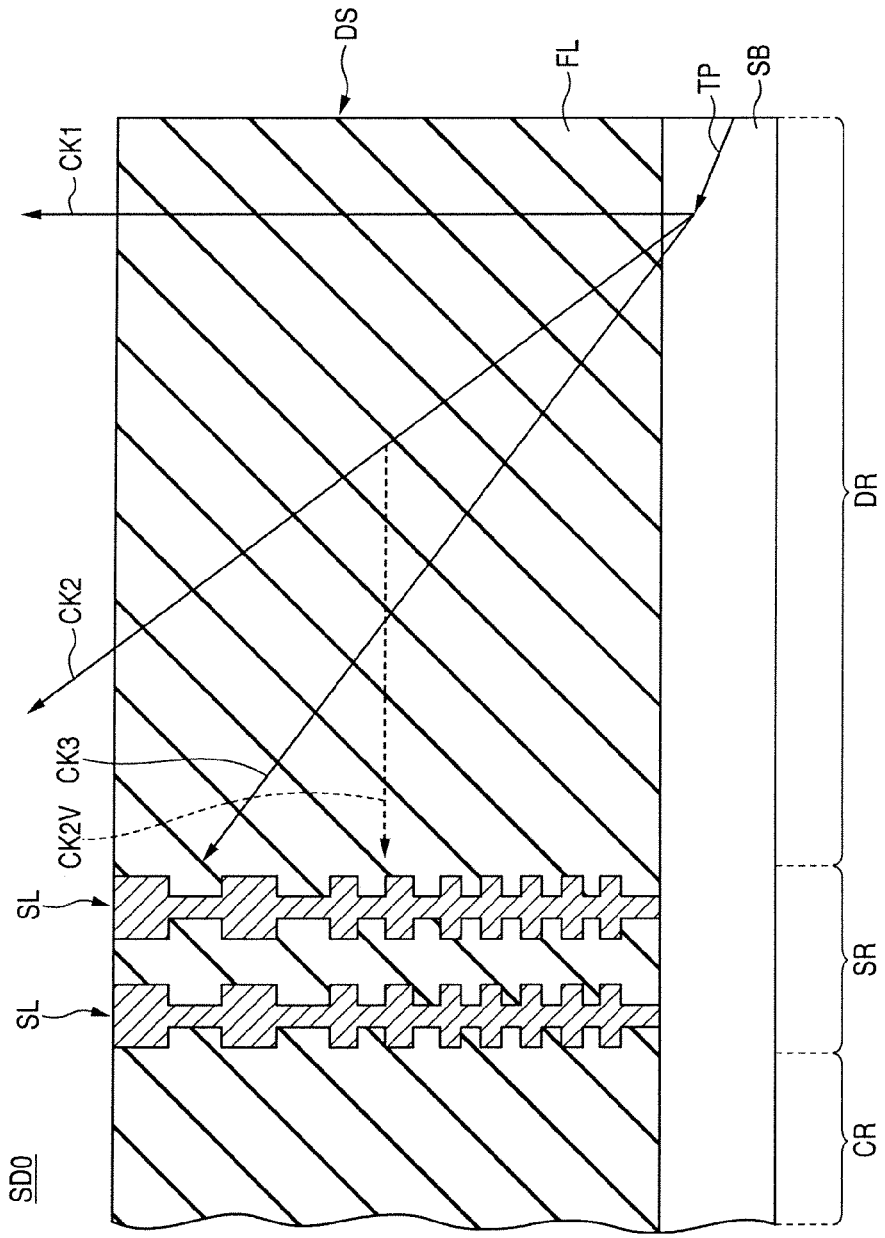
FIG. 15 is a schematic partial sectional view for explaining crack expanding courses in a conventional semiconductor device.

A detailed description will now be given about an expanding course of a crack which can be developed in the dicing process. First a general consideration will be given about the crack expanding course. FIG. 15 is a schematic partial sectional view for explaining a crack expanding course in a conventional semiconductor device.

Referring to FIG. 15, the conventional semiconductor device SDO includes a semiconductor substrate SB, an insulation film FL formed on the semiconductor substrate SB, and a sealing ring SL formed within the insulation film FL. In a dicing process in this semiconductor device SDO manufacturing method, there may occur chipping TP on a dicing face DS side of the semiconductor substrate SB. In this case, with the chipping TP as a starting point, such a stress as expands a crack upwards is applied to the insulation film FL. The crack in the insulation film FL induced by the stress is classified, in an early stage of the crack, into three types of cracks CK1, CK2 and CK3.

The crack CK1 tends to expand approximately just above the semiconductor substrate SB. Since the crack CK1 expands without approaching the sealing ring region SR, it does not cause destruction of the sealing ring SL. On the other hand, the crack CK3 passes the dummy region DR obliquely upwards and tends to advance toward the sealing ring region SR. The crack CK3 is likely to reach and destroy the sealing ring SL.

The crack CK2 passes only the dummy region DR obliquely upwards and tends to leave the semiconductor device SDO. In the case where the insulation film FL has an approximately uniform mechanical strength, the crack CK2 maintains its initial-stage course, passes only the dummy region DR obliquely upwards and leaves the semiconductor device SDO. However, in the case where the insulation film FL has such a laminate structure as is higher in mechanical strength toward the upper portion, the upward advancing of the crack is obstructed halfway and may change into a crack CK2V (a broken line arrow in the drawing) having an advancing course toward the sealing ring SL. As examples of such a laminate structure are mentioned a structure in which a film formed of a low-k material is laminated onto a film formed of a ULK material and a structure in which a film formed of a non-low-k material is laminated onto a film formed of a low-k material. In the semiconductor device having such a laminate structure there is the possibility the sealing ring SL may be destroyed by the crack CK2V.

The following description is now provided about an example of an actual crack expanding course in the case where a stress tending to generate the crack CK2 (FIG. 15) is applied to the semiconductor device SD1. If it is assumed that the first to third regions Ra1 to Ra3 are not provided, then it is possible that the crack CK will change into the crack CK2V (FIG. 15) and that the crack CK2V will reach the sealing ring SL, between the first and second laminates LB1, LB2 or between the second and third laminates LB2, LB3. In this embodiment, however, a crack is conducted upwards through the semiconductor device SD1 before reaching the sealing ring SL. A detailed description will be given below about this crack expanding course.

Figure 16:
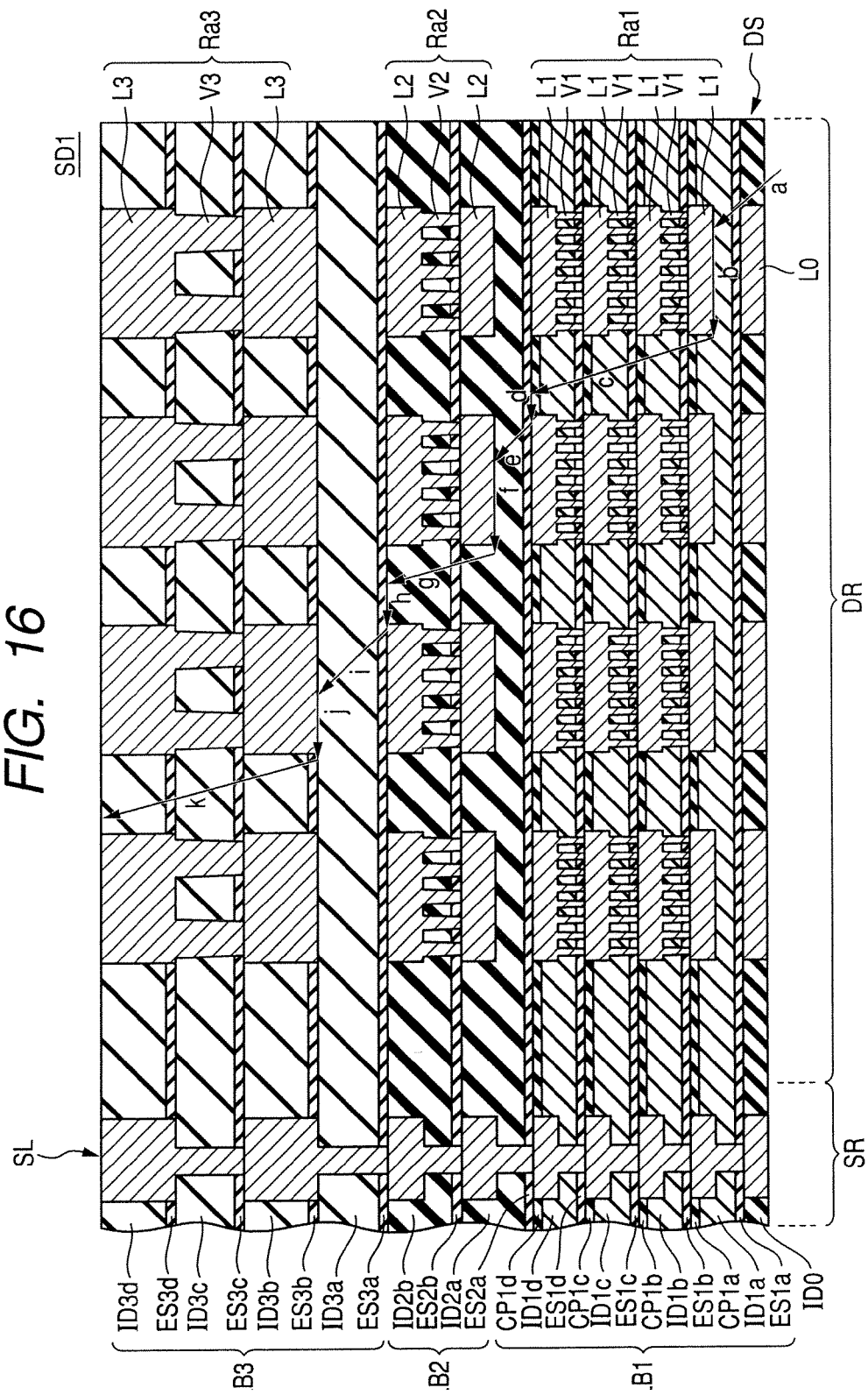
FIG. 16 is a partial sectional view showing schematically an example of a crack expanding course in the semiconductor device of the first embodiment.

Referring to FIG. 16, as an initial stage, a crack passes the interlayer dielectric film ID0, the etching stopper film ES1a and the first interlayer dielectric film ID1a and reaches the bottom of the first region Ra1, like an arrow, a.

Then, like an arrow, b, the crack advancing course changes to a lateral direction along the bottom of the first region Ra1. This is because the crack cannot advance into the first regions Ra1 which have a high mechanical strength due to being formed of metal, but advances along an interface between the first regions Ra1 and the first interlayer dielectric film ID1a. Besides, the interface is low in adhesion strength because it is a metal-insulator interface. Due to this low adhesion strength the crack's tendency to advancing along this interface increases.

Then, like an arrow, c, the advancing course of the crack which has passed the bottom of a first region Ra1 returns to the obliquely upward course (the advancing direction of the crack CK2 in FIG. 15) which is the original course proportional to the state of stress. The crack passes the cap film CP1a, etching stopper film ES1b, first interlayer dielectric film ID1b, cap film CP1b, etching stopper film ES1c, first interlayer dielectric film ID1c, cap film CP1c, etching stopper film ES1d, first interlayer dielectric film ID1d, and cap film CP1d, and reaches the bottom of the second laminate LB2. The crack is less likely to pass between the first metallic layers L1 in the first region Ra1 immediately adjacent to the arrow, c, on the sealing ring SL side (left side in the drawing). The reason is that the region between a pair of first metallic layers L1 opposed to each other is reinforced by vias V1 and that therefore a crack is difficult to occur therein.

Then, like an arrow, d, the crack advancing course changes to a lateral direction along an interface between the first and second laminates LB1, LB2. That is, the crack is difficult to advance upwards in the drawing. This is because the region above the arrow, d, is large in the insulation film thickness and the mechanical strength in material characteristics is high. Further, since the interface corresponds to a CMP (Chemical Mechanical Polishing) surface in the dual damascene process for forming the first regions Ra1, the interfacial strength is relatively low, with the result that the crack's tendency to advancing along this interface increases.

Then, like an arrow, e, in the region sandwiched in between the first and second regions Ra1, Ra2, the crack advances into the second laminate LB2. This is because the insulation film thickness is small in the region sandwiched in between the first and second regions Ra1, Ra2, thus facilitating generation of a crack. The advancing course of the crack having thus entered into the second laminate LB2 returns to the obliquely upward course (the advancing direction of the crack CK2 in FIG. 15) which is the original course proportional to the state of stress. Then, the crack passes the etching stopper film ES2a and the second interlayer dielectric film ID2a and reaches the bottom of a second region Ra2.

As indicated with arrows f to i, the crack advances like the above arrows b to e, and as indicated with arrows j and k, the crack advances like the above arrows b and c. That is, in the dummy region DR the crack advances upwards through the semiconductor device SD1 without reaching the sealing ring region SR. As a result, the crack CK (FIG. 3) is formed in the semiconductor device SD1.

When a stress intending to generate the crack CK2 (FIG. 15) is applied to the semiconductor device SD1 of this embodiment, the occurrence of the crack CK2V (FIG. 15) which reaches the sealing ring SL is prevented and instead there is developed within the dummy region DR such a crack CK (FIG. 3) as advancing upwards through the semiconductor device SD1. Moreover, with the via V1 periphery layout, via V2 periphery layout and via V3 periphery layout, the crack is difficult to advance through the interiors of the first to third regions Ra1 to Ra3, thus permitting the crack to escape upwards more effectively.

The same as above is also true of the case where such a stress as intends to generate the crack CK3 (FIG. 15) is applied to the semiconductor device SD1.

Figure 17:
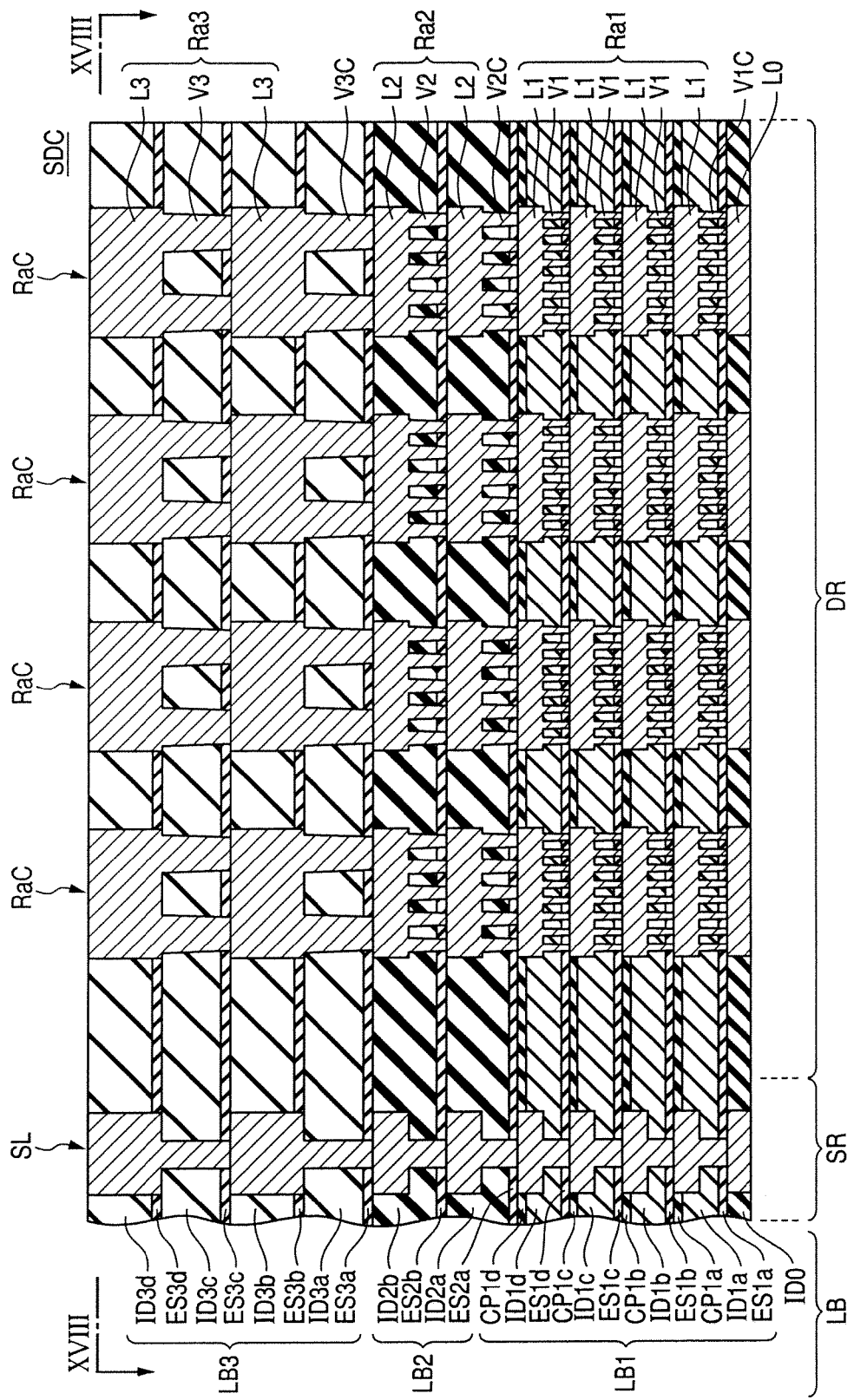
FIG. 17 is a partial sectional view showing schematically the configuration of a semiconductor device as a comparative example.

The following description is now provided about a comparative example in connection with this embodiment. FIG. 17 is a partial sectional view showing schematically the configuration of a comparative semiconductor device. Referring to FIG. 17, the comparative semiconductor device, indicated at SDC, has regions RaC as metal portions. The regions RaC each include a first metallic layer L0, a first region Ra1, a second region Ra2, a third region Ra3, and vias V1C, V2C and V3C. With the vias V1C, V2C and V3C, the metallic layer L0 and the first, second and third regions Ra1, Ra2, Ra3 are rendered integral with one another. Therefore, each region RaC is present as a mass of region difficult to be cracked.

Figure 18:
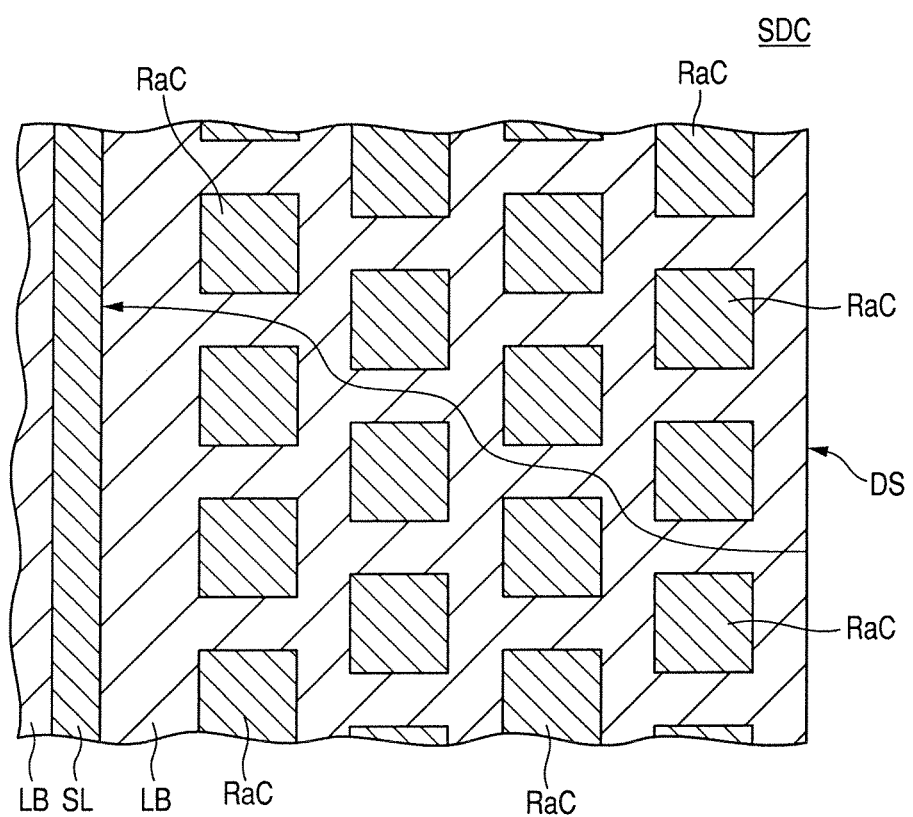
FIG. 18 is an overlapped diagram of both a schematic section taken along line XVIII-XVIII in FIG. 17 and a crack expanding course in plan.

FIG. 18 is an overlapped diagram of both a schematic section taken along line XVIII-XVIII in FIG. 17 and a crack advancing course in plan. Referring mainly to FIG. 18, the regions RaC are difficult to be cracked as noted above and are formed so as to pass in the thickness direction through a laminate LB including an interlayer dielectric film ID0 and further including a first laminate LB1 to a third laminate LB3 (FIG. 17). Therefore, a crack indicated with an arrow in the figure cannot get into the regions RaC. As a result, the crack may advance through the more easily cracked laminate LB rather than through the regions RaC like weaving beside the regions RaC. The crack is likely to reach the sealing ring SL and destroy the same ring.

According to the semiconductor device SD1 of this embodiment, as shown in FIG. 16, in part of the second laminate LB2 there is formed a portion (for example the surrounding portion of the arrow, e) in which a dielectric film including the second interlayer dielectric film ID2a is sandwiched in between the first and second regions Ra1, Ra2. This portion has a small film thickness because it is sandwiched in between the regions Ra1 and Ra2. Besides, this portion is not reinforced by vias. Therefore, this portion is easy to be cracked locally in the second laminate LB2. In the presence of this easily cracked portion, a crack is apt to expand from the first laminate LB1 having the first interlayer dielectric films ID1a to ID1d of a low mechanical strength to the second laminate LB2 having the second interlayer dielectric films ID2a, ID2b of a high mechanical strength, as indicated with arrow, e. Consequently, it becomes easier for the crack to escape upwards through the semiconductor device SD1 before reaching the sealing ring SL. As a result, destruction of the sealing ring SL by the crack is suppressed and hence a high reliability of the semiconductor device SD1 is ensured.

Like the third regions Ra3 shown in FIG. 4, the first and second regions Ra1, Ra2 each occupy an area ranging from 30% to 50% in plan, whereby the cracked regions indicated with arrows, c and e, (FIG. 16) are ensured in a well-balance manner, so that the crack can be conducted upwards through the semiconductor device SD1 as shown in FIG. 16.

The metallic layer L0 and the first, second and third regions Ra1, Ra2, Ra3 (FIGS. 8 to 11) each have a pattern of an area ranging from 1 to 4 square micrometers in plan.

In the case where the metallic layer L0 and the first, second and third regions Ra1, Ra2, Ra3 are scattered at the time of cutting with the dicing blade DB (FIG. 4) in the dicing process, if the aforesaid area is 4 square micrometers or less, the area of this metallic piece is almost equal to the sectional area of abrasive grains which are used in a large quantity in the dicing process. Therefore, this metallic piece scarcely causes any substantial bad effect. If the aforesaid area is smaller than 1 square micrometer, the area of the region for generating the crack of arrow, e, (FIG. 16) becomes insufficient and hence the action of conducting the crack upwards decreases.

On the other hand, if the area in question exceeds 4 square micrometers, the actually machined area with abrasive grains at the time of cutting by the dicing blade DB (FIG. 14) in the dicing process becomes large because the area of this metallic piece is larger than the sectional area of abrasive grains which are used in a large quantity in the dicing process. Consequently, cutting burrs are formed, causing deterioration in reliability of the semiconductor device, or cutting chips adhere to the dicing blade, causing a cutting defect.

The semiconductor device SD1 has the interlayer dielectric film ID0 (FIG. 5) higher in mechanical strength than the first interlayer dielectric films ID1a to ID1d (FIG. 5), so in the layer M1 (FIG. 2) there is used an interlayer dielectric film material higher in mechanical strength than the layers M2 to M5 (FIG. 2). Therefore, it is possible to adopt such a combination of interlayer dielectric film materials as is usually adopted for some reason in the design of the semiconductor device SD1. For example, there may be adopted a combination such that the interlayer dielectric film ID0 is formed of a low-k material and the first interlayer dielectric films ID1a to ID1d are formed of a ULK material. Or, there may be adopted a combination such that the interlayer dielectric film ID0 is formed of a non-low-k material and the first interlayer dielectric films ID1a to ID1d are formed of a low-k material.

Unlike the comparative semiconductor device SDC (FIG. 17) the semiconductor device SD1 (FIG. 5) of this embodiment does not have vias V1C, V2C and V3C and hence the semiconductor device designing work is so much simplified.

In a direction (the lateral direction in FIG. 4) orthogonal to the extending direction of the sealing ring SL, as shown in FIG. 4, third regions Ra3 are arranged in a zigzag fashion, whereby the occurrence of a crack which is rectilinear in the direction (the lateral direction in the figure) orthogonal to the extending direction of the sealing ring SL and which does not undergo the action of the third rings Ra3, between the sealing ring SL and the dicing face DS, is suppressed. This is also true of the first and second regions Ra1, Ra2.

Second Embodiment

Figure 19:
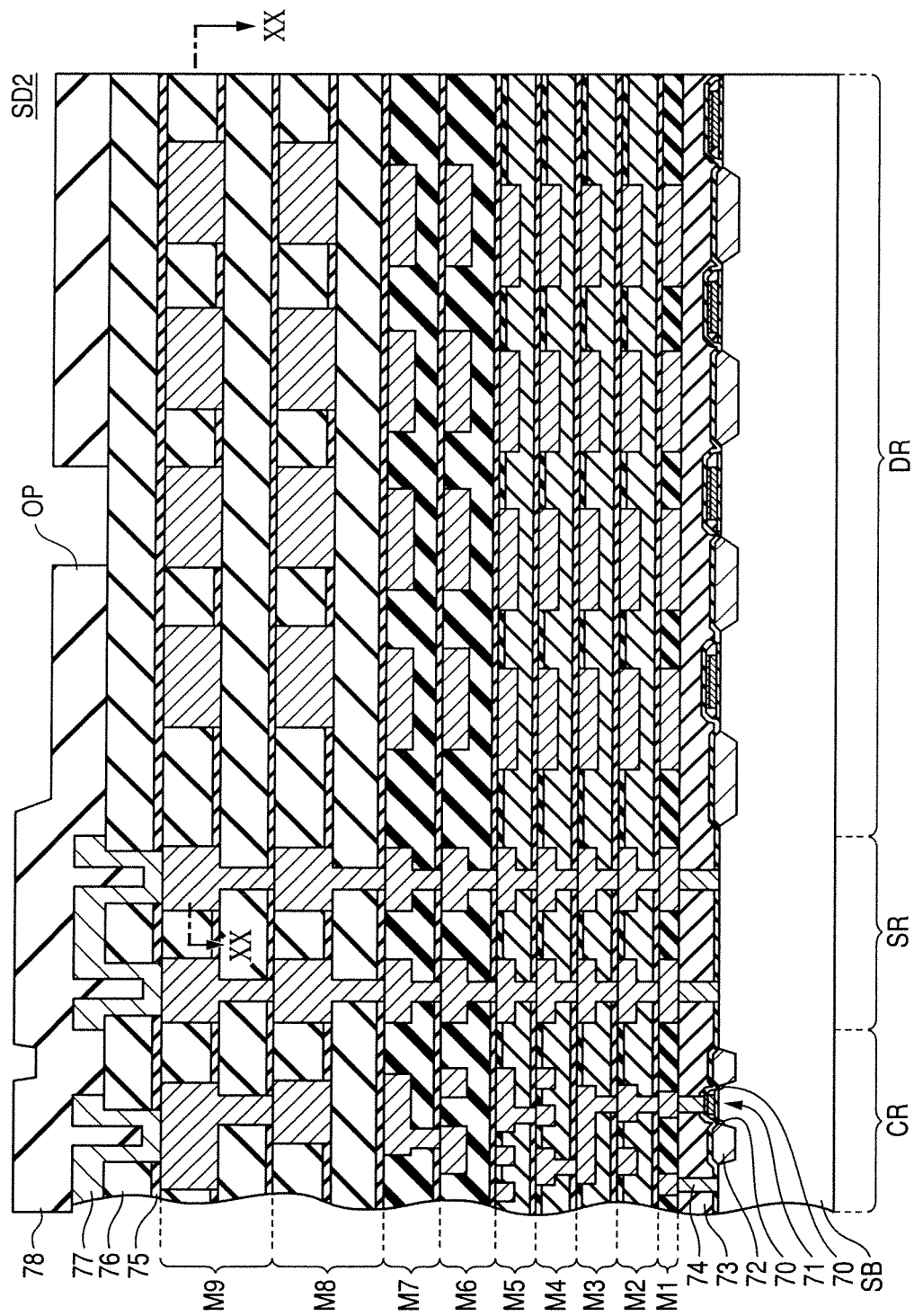
FIG. 19 is a partial sectional view showing schematically the configuration of a semiconductor device according to a second embodiment of the present invention.
Figure 20:
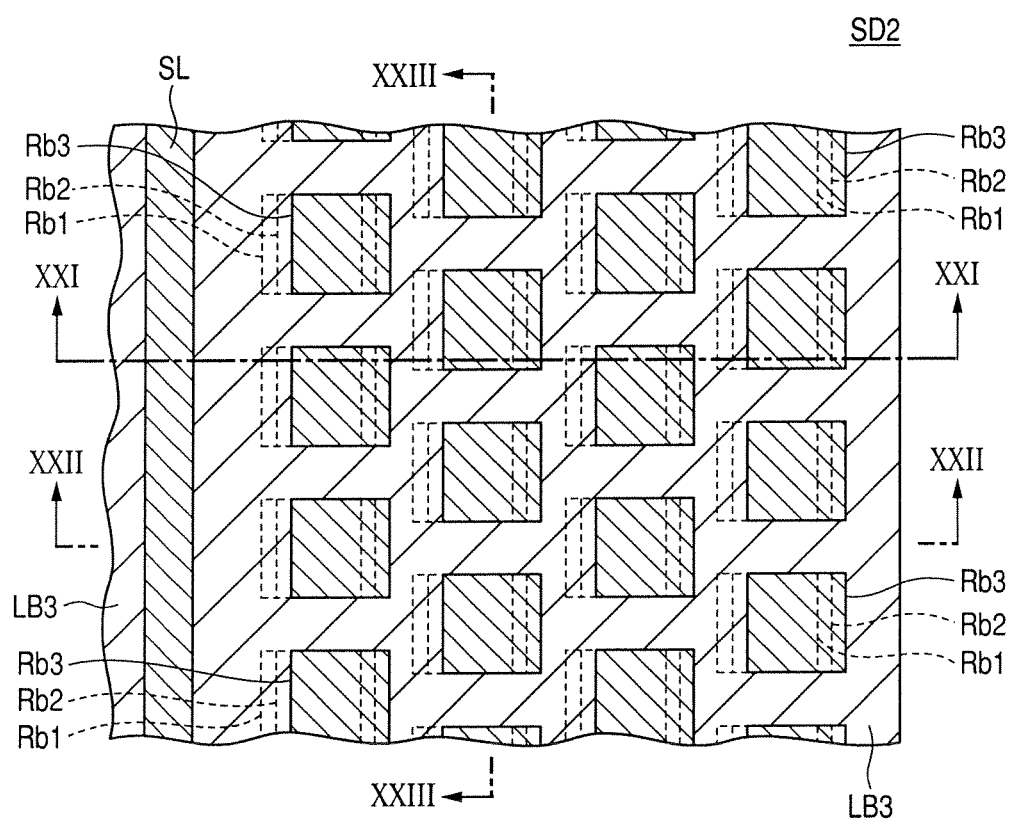
FIG. 20 is a schematic sectional view taken along line XX-XX in FIG. 19.
Figure 21:
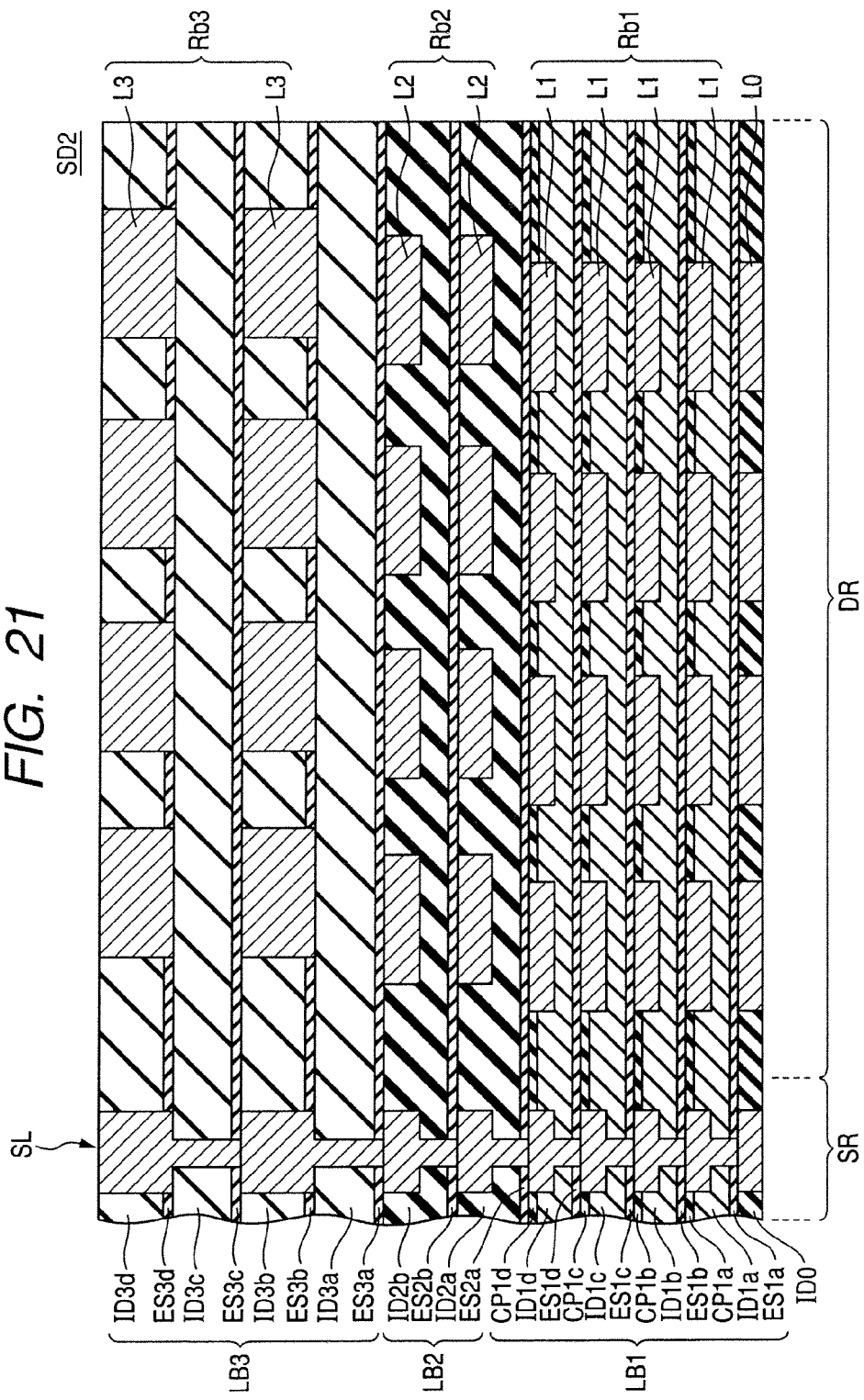
FIG. 21 is a schematic sectional view taken along line XXI-XXI in FIG. 20.
Figure 22:
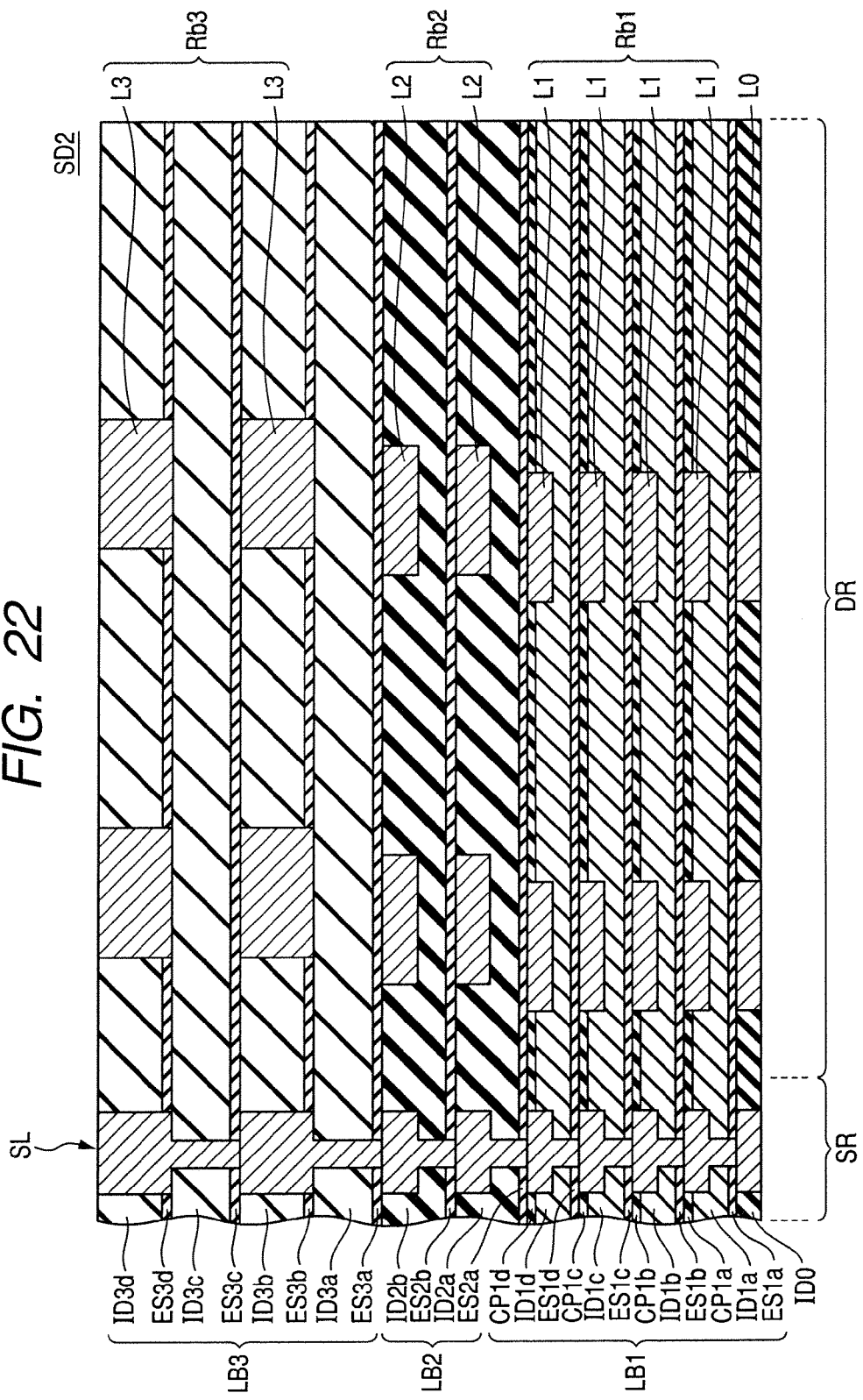
FIG. 22 is a schematic sectional view taken along line XXII-XXII in FIG. 20.
Figure 23:
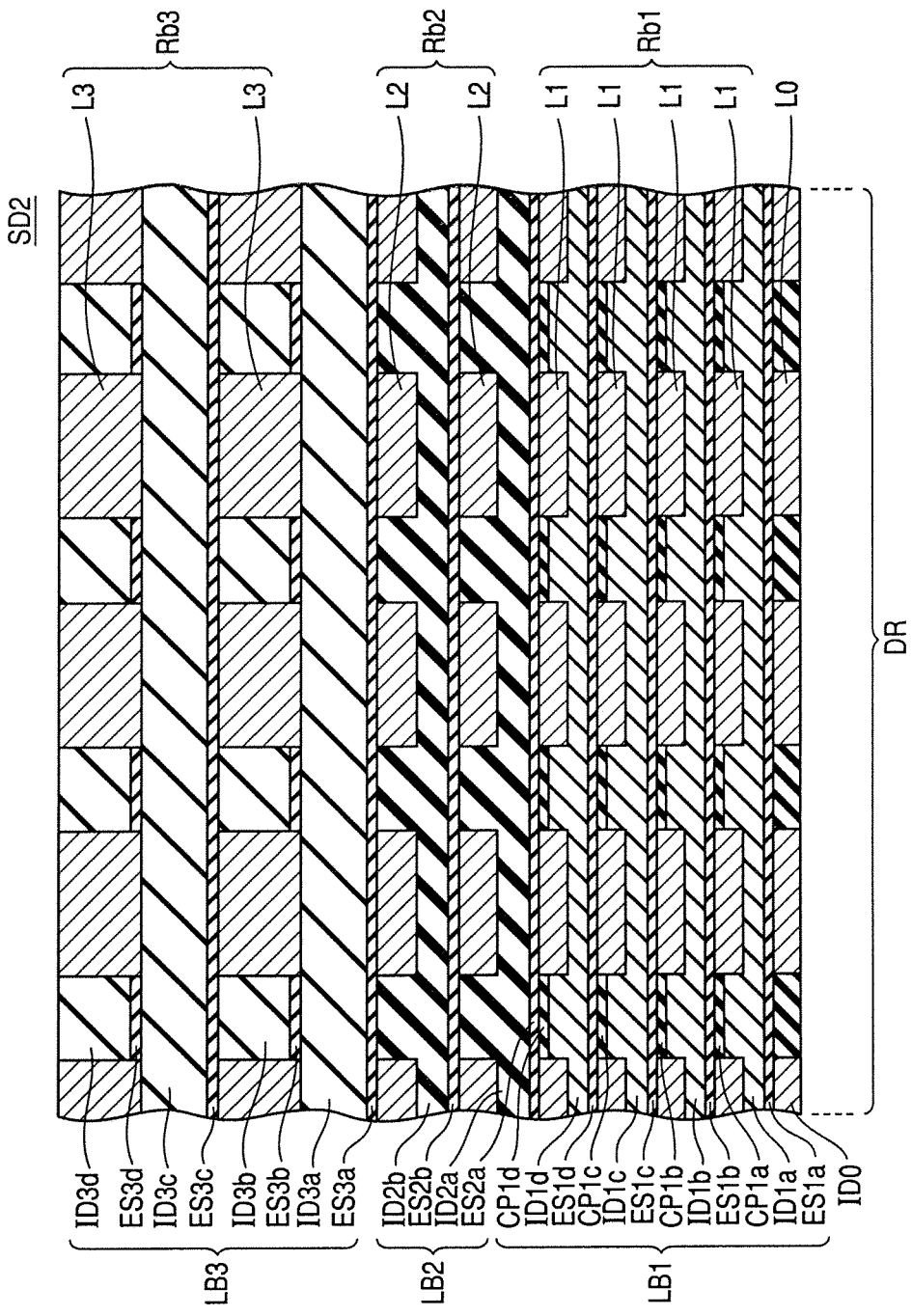
FIG. 23 is a schematic sectional view taken along line XXIII-XXIII in FIG. 20.

FIG. 19 is a partial sectional view showing schematically the configuration of a semiconductor device according to a second embodiment of the present invention. FIG. 20 is a schematic sectional view taken along line XX-XX in FIG. 19. FIGS. 21 to 23 are schematic sectional views taken along lines XXI-XXI, XXII-XXII, and XXIII-XXIII, respectively, in FIG. 20. Sectional positions of FIGS. 20 to 23 correspond to FIGS. 4 to 7, respectively, in the first embodiment.

Referring mainly to FIGS. 20 to 23, the semiconductor device, indicated at SD2, of this second embodiment includes first, second and third regions Rb1, Rb2, Rb3 instead of the first, second and third regions Ra1, Ra2, Ra3, respectively, used in the semiconductor device SD1 (FIG. 5). The first, second and third regions Rb1, Rb2, Rb3 do not have a via.

The second regions Rb2, when seen in plan, partially overlap the first regions Rb1 and are located at positions deviated from the positions of the first regions Rb1 so as to be away from the sealing ring region SR. The third regions Rb3, when seen in plan, partially overlap the second regions Rb2 and are located at positions deviated from the second regions Rb2 so as to be away from the sealing ring region SR.

As to the other points in configuration than the above points, they are almost the same as in the configuration of the above first embodiment. Therefore, the same or corresponding elements are identified by the same reference numerals as in the first embodiment and explanations thereof will be omitted.

Figure 24:
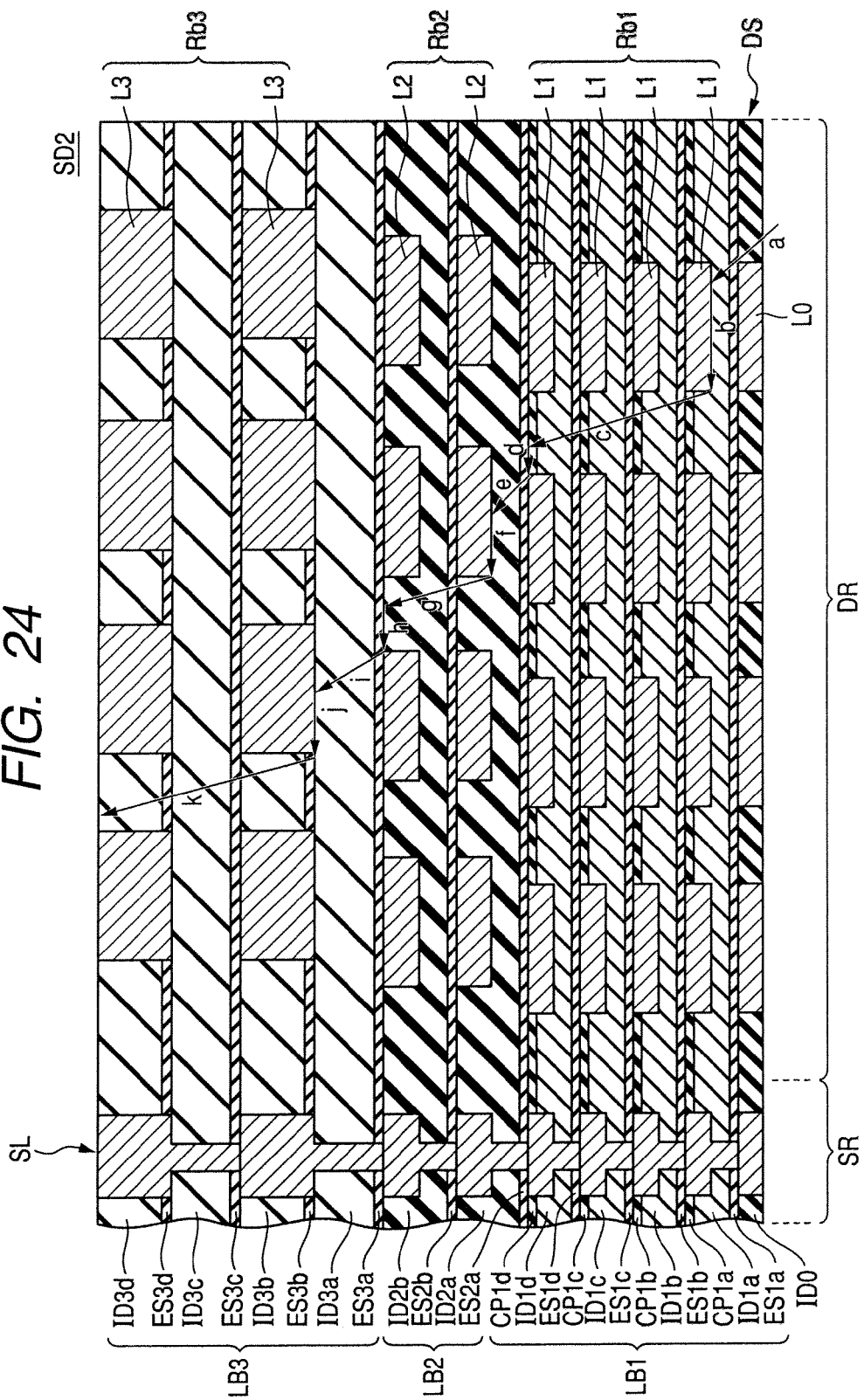
FIG. 24 is a partial sectional view showing schematically an example of a crack expanding course in the semiconductor device of the second embodiment.

FIG. 24 is a partial sectional view showing schematically an example of a crack advancing course in the semiconductor device of the second embodiment. FIG. 24 corresponds to FIG. 16 in the first embodiment.

In FIG. 24, when seen in plan, the second regions Rb2 which close from above the portion sandwiched in between the first and second regions Rb1, Rb2 are provided at positions deviated from the positions of the first regions Rb1 so as to be away from the sealing ring SL. Therefore, a crack of arrow, f, expanding in this sandwiched portion can advance upwards (see arrow, g,) without being obstructed by the second regions Rb2 at a position (a right-hand position in the figure) spaced more distant from the sealing ring region SR.

Likewise, when seen in plan, the third regions Rb3 which close from above the portion sandwiched in between the second and third regions Rb2, Rb3 are provided at positions deviated from the positions of the second regions Rb2 so as to be away from the sealing ring SL. Therefore, a crack of arrow, j, expanding in this sandwiched portion can advance upwards (see arrow, k) without being obstructed by the third regions Rb3 at a position (a right-hand position in the figure) spaced more distant from the sealing ring region SR.

Accordingly, as compared with the case where the position of each second region Rb2 and that of each third region Rb3 are not deviated from each other in plan, a crack is easier to advance upwards through the semiconductor device SD2 before reaching the sealing ring SL. Consequently, the occurrence of destruction of the sealing ring SL by cracking is suppressed and hence a high reliability of the semiconductor device SD2 is ensured.

Third Embodiment

Figure 25:
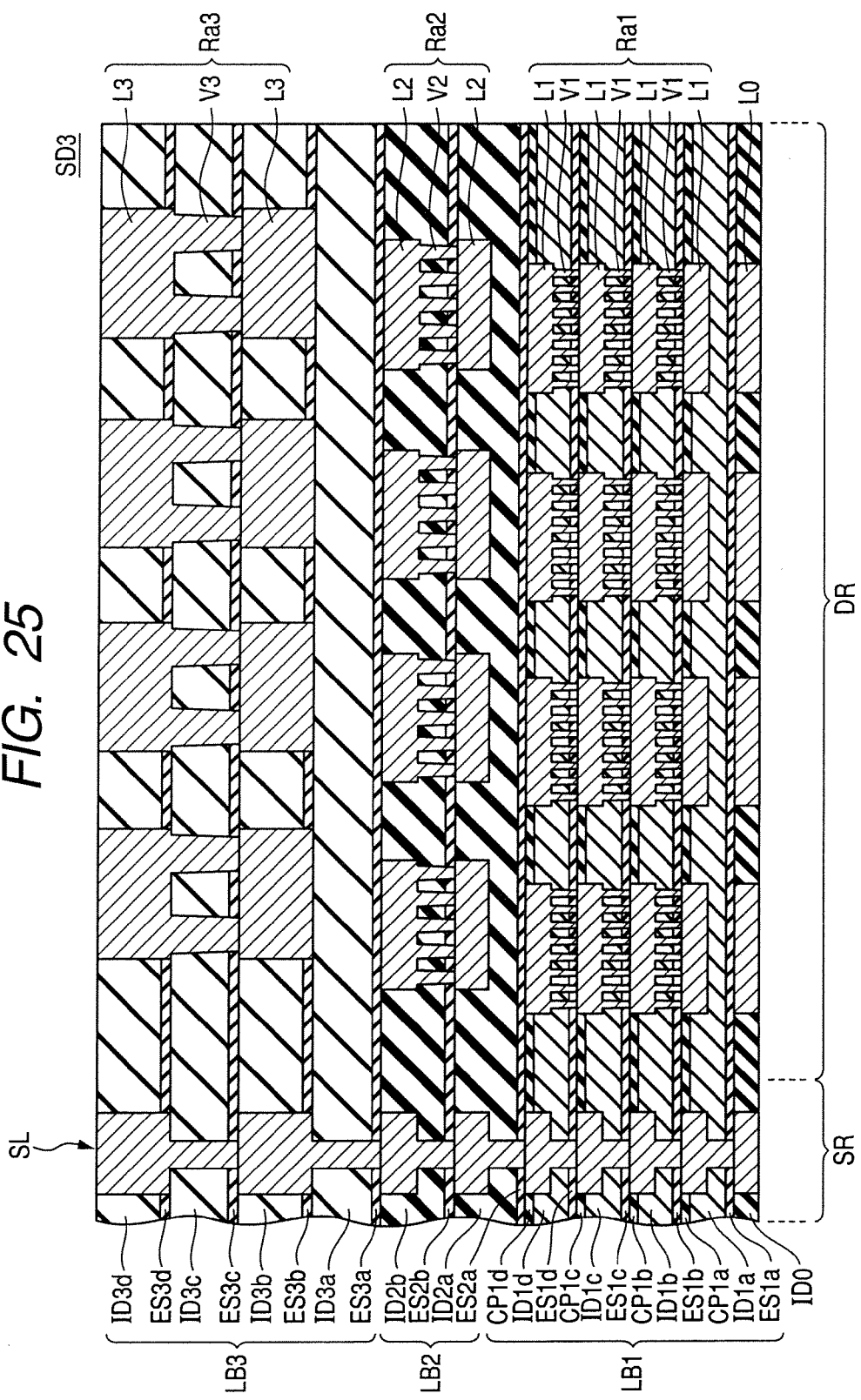
FIG. 25 is a partial sectional view showing schematically the configuration of a semiconductor device according to a third embodiment of the present invention.
Figure 26:
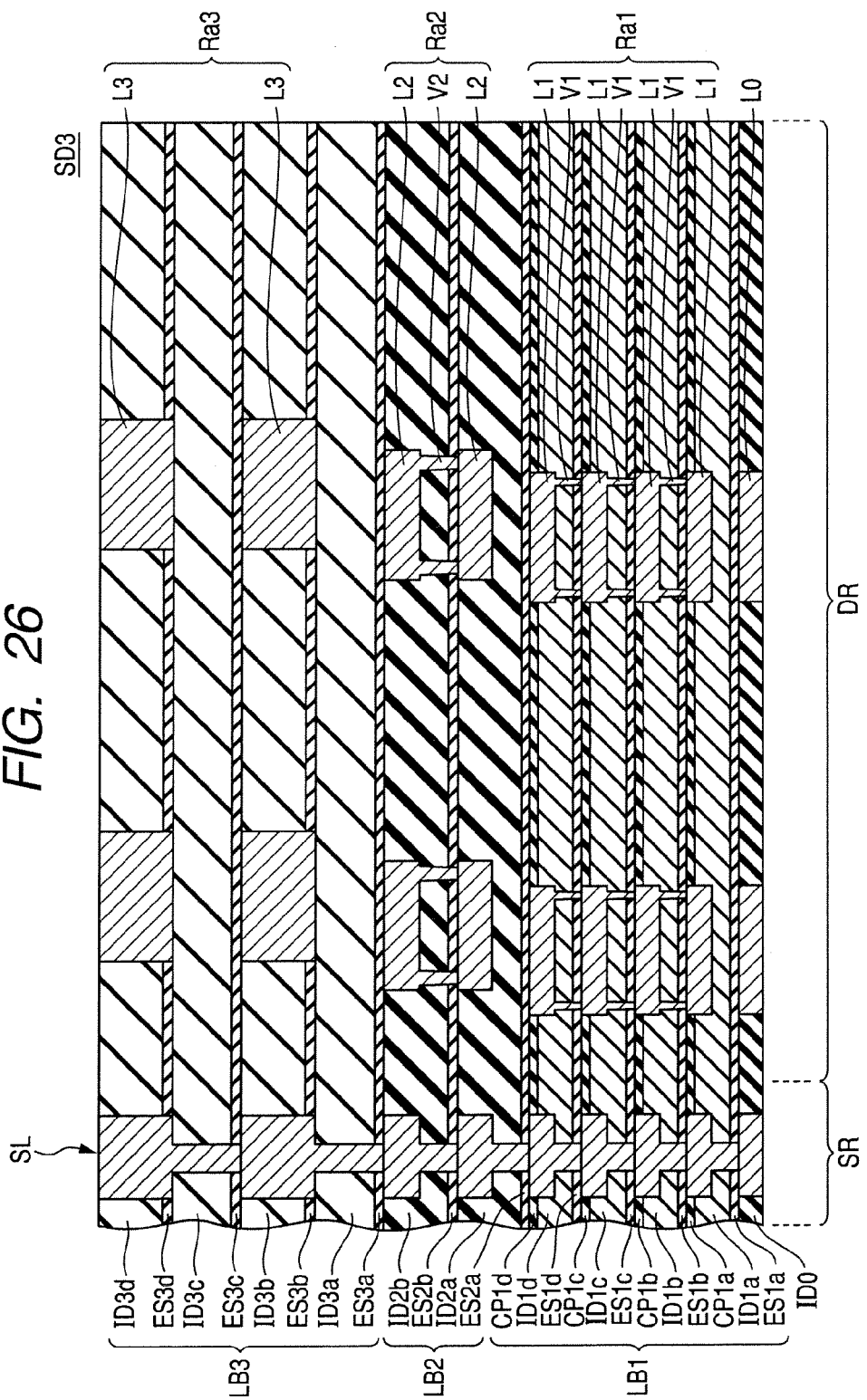
FIG. 26 is a partial sectional view showing schematically the configuration of the semiconductor device of the third embodiment.
Figure 27:
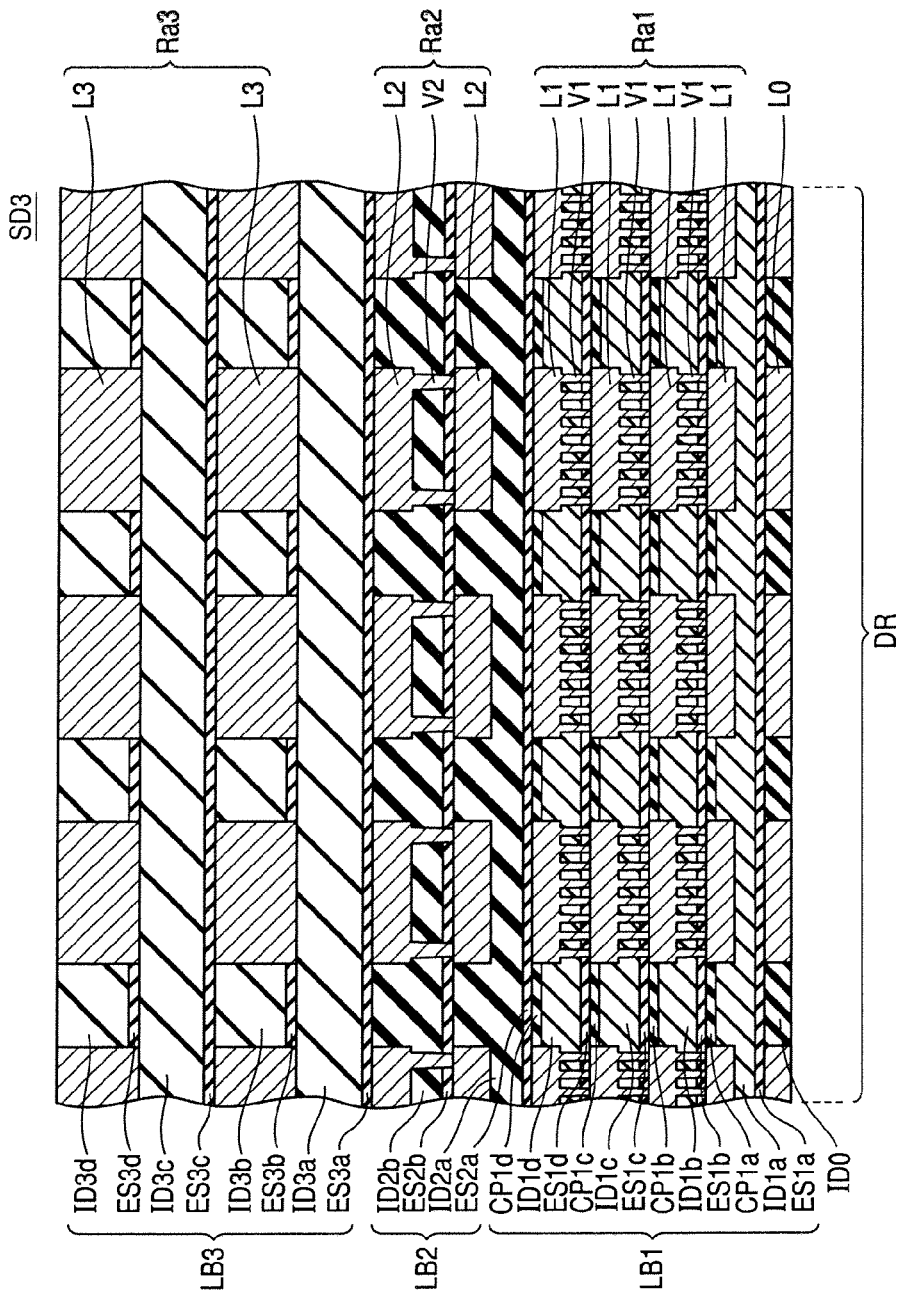
FIG. 27 is a partial sectional view showing schematically the configuration of the semiconductor device of the third embodiment.

FIGS. 25 to 27 are partial sectional views showing schematically a semiconductor device according to a third embodiment of the present invention. Sectional positions of FIGS. 25 to 27 correspond to those of FIGS. 21 to 23, respectively, in the second embodiment.

Referring mainly to FIGS. 25 to 27, the semiconductor device, indicated at SD3, of this third embodiment includes first, second and third regions Ra1, Ra2, Ra3 instead of the first, second and third regions Rb1, Rb2, Rb3, respectively, used in the semiconductor device SD2 (FIG. 21) of the second embodiment.

As to the other points in configuration than the above, they are almost the same as in the above second embodiment. Therefore, the same or corresponding elements are identified by the same reference numerals as in the second embodiment and explanations thereof will be omitted.

Figure 28:
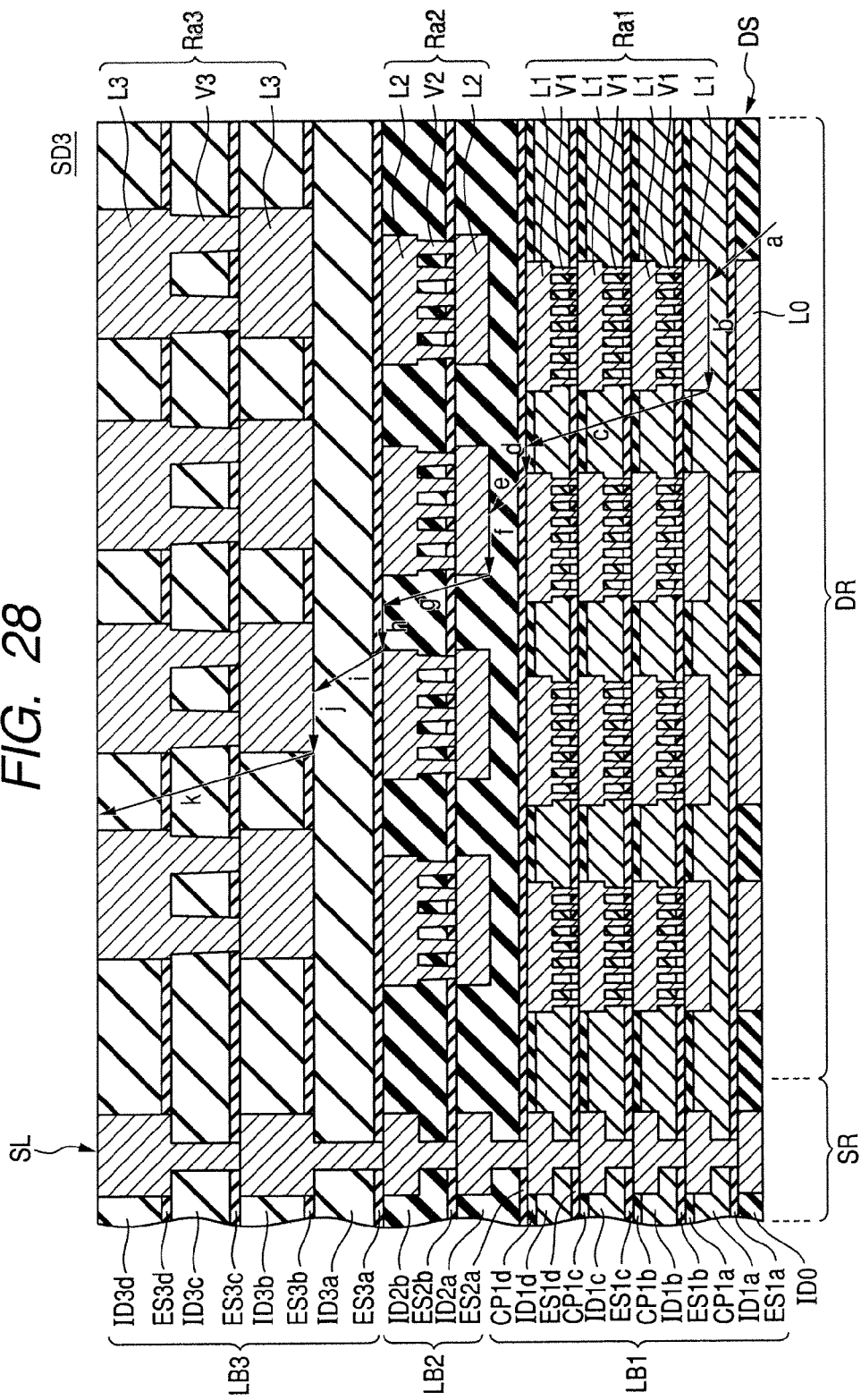
FIG. 28 is a partial sectional view showing schematically an example of a crack expanding course in the semiconductor device of the third embodiment.

FIG. 28 is a partial sectional view showing schematically an example of a crack advancing course in the semiconductor device of the third embodiment. FIG. 28 corresponds to FIG. 24 in the second embodiment.

Referring to FIG. 28, the second regions Ra2 which close from above the portion sandwiched in between the first and second regions Ra1, Ra2 are provided at positions deviated from the positions of the first regions Ra1 so as to be away from the sealing ring SL. Therefore, a crack of arrow, f, expanded in this portion can advance upwards (see arrow, g) without being obstructed by the second regions Ra2 at a position (a right-hand position in the figure) more distant from the seal ring region SR.

Likewise, the third regions Ra3 which close from above the portion sandwiched in between the second and third regions Ra2, Ra3 are provided at positions deviated from the positions of the second regions Ra2 so as to be away from the sealing ring SL. Therefore, a crack of arrow, j, expanded in this portion can advance upwards (see arrow, k) without being obstructed by the third regions Ra3 at a position (a right-hand position in the figure) more distant from the sealing ring region SR.

Thus, as compared with the case where the position of each second region Ra2 and that of each third region Ra3 are not deviated from each other, a crack is easier to advance upwards through the semiconductor device SD3. Consequently, the occurrence of destruction of the sealing ring SL by cracking is suppressed and hence a high reliability of the semiconductor device SD3 is ensured.

A plurality of first metallic layers L1 in each first region Ra1 are coupled together by vias V1. Consequently, a crack is difficult to be developed in the region between a pair of first metallic layers L1 opposed to each other because the region is reinforced by vias V1. Thus, it is less possible that a crack will pass between the first metallic layers L1 in the first region positioned immediately adjacent to the arrow, c, on the sealing SL side (left side in the drawing). That is, as indicated with arrow, c, the crack can be conducted more positively up to the upper end of the first laminate LB1. Accordingly, as indicated with arrow, e, a crack expanded into the second laminate LB2 over the first laminate LB1 can be developed at a position (a right-hand position in the drawing) more distant from the sealing ring region SR.

A plurality of second metallic layers L2 in each second region Ra2 are coupled together by vias V2. Consequently, a crack is difficult to be developed in the region between a pair of second metallic layers L2 opposed to each other because the region is reinforced by vias V2. Therefore, it is less possible that a crack will pass between the second metallic layers L2 in the second region Ra2 positioned immediately adjacent to the arrow, g, on the sealing ring SL side (left side in the drawing). That is, as indicated with arrow, g, the crack can be conducted more positively up to the upper end of the second laminate LB2. Thus, as indicated with arrow, i, a crack expanded into the third laminate LB3 over the second laminate LB2 can be developed at a position (a right-hand position in the drawing) more distant from the sealing ring region SR.

Further, a plurality of third metallic layers L3 in each third region Ra3 are coupled together by vias V3. Therefore, a crack is difficult to be developed in the region between a pair of third metallic layers L3 opposed to each other because the region is reinforced by vias V3. Therefore, it is less possible that a crack will pass between the third metallic layers L3 in the third region Ra3 positioned immediately adjacent to the arrow, k, on the sealing ring SL side (left side in the drawing). That is, as indicated with arrow, k, the crack can be conducted more positively up to the upper end of the third laminate LB3. Thus, it is possible to let the crack pass upwards through the semiconductor device SD3 at a position (a right-hand position in the drawing) more distant from the sealing ring region SR.

Fourth Embodiment

Figure 29:
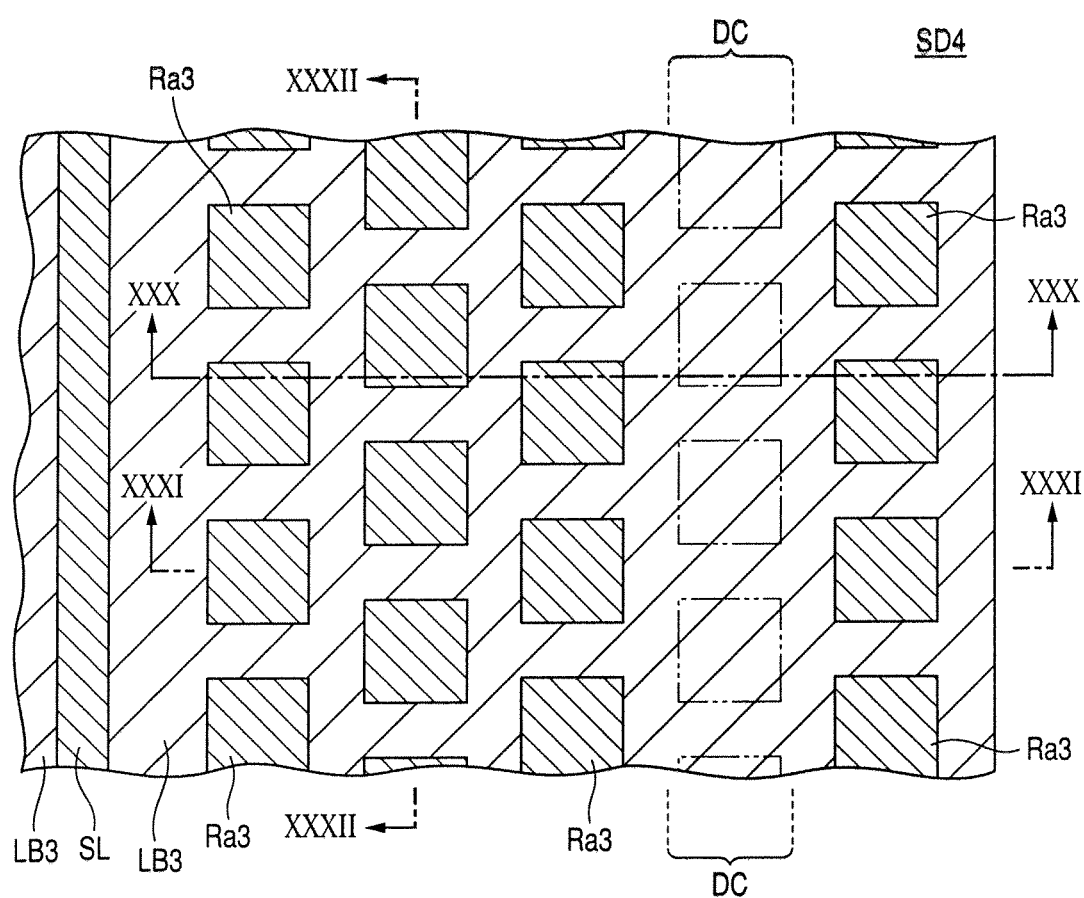
FIG. 29 is a partial sectional view showing schematically the configuration of a semiconductor device according to a fourth embodiment of the present invention.
Figure 30:
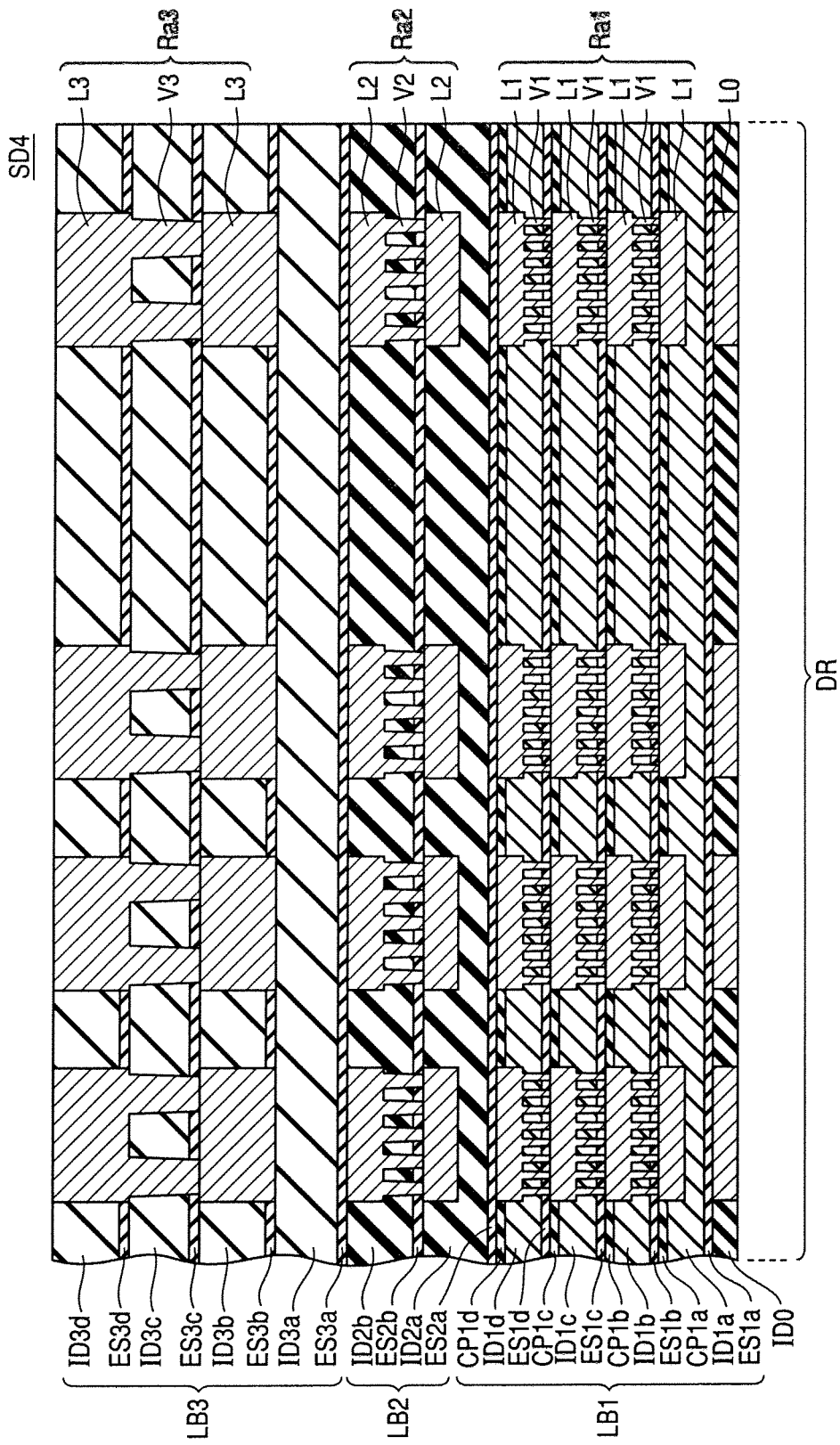
FIG. 30 is a schematic sectional view taken along line XXX-XXX in FIG. 29.
Figure 31:
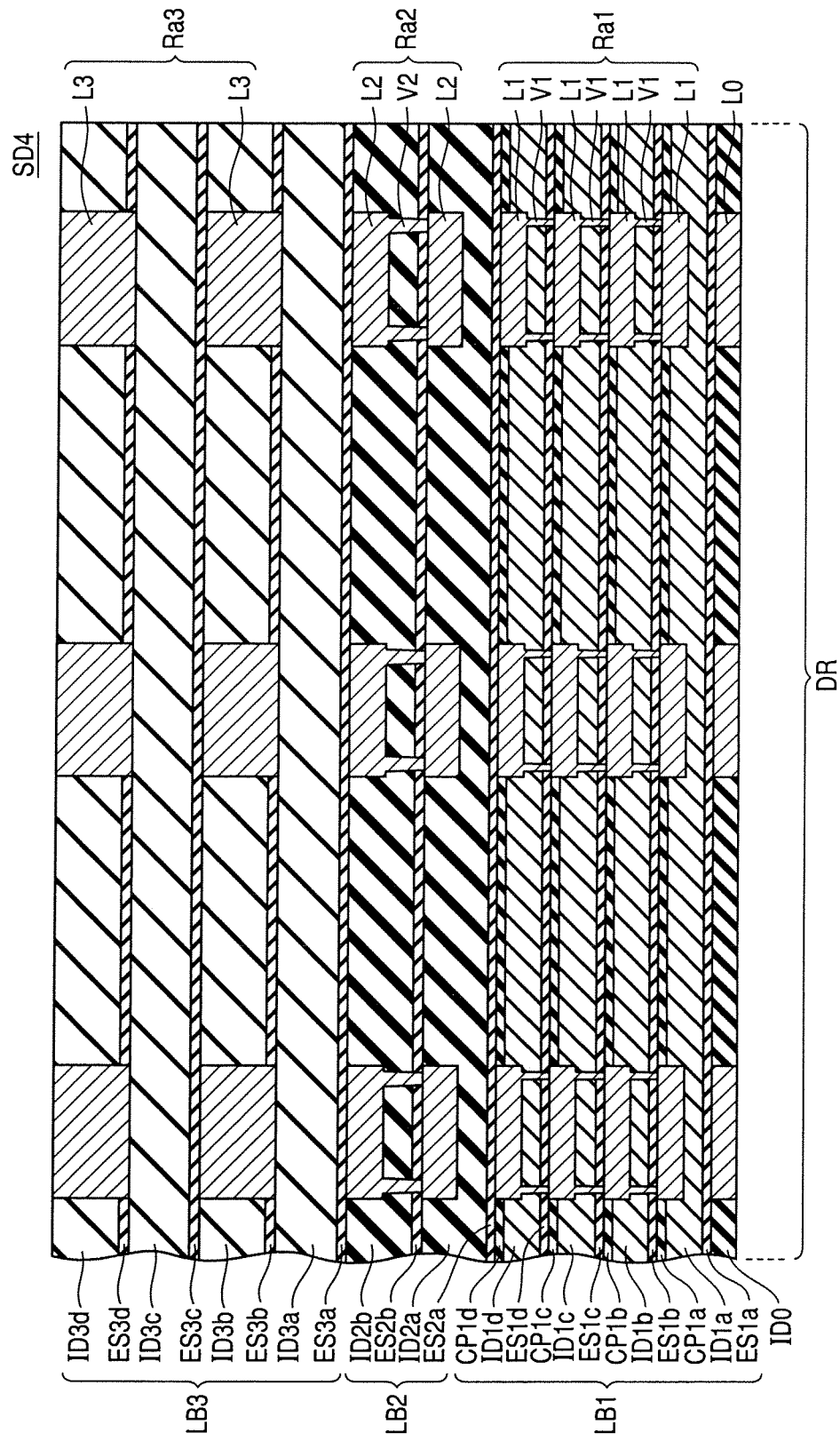
FIG. 31 is a schematic sectional view taken along line XXXI-XXXI in FIG. 29.
Figure 32:
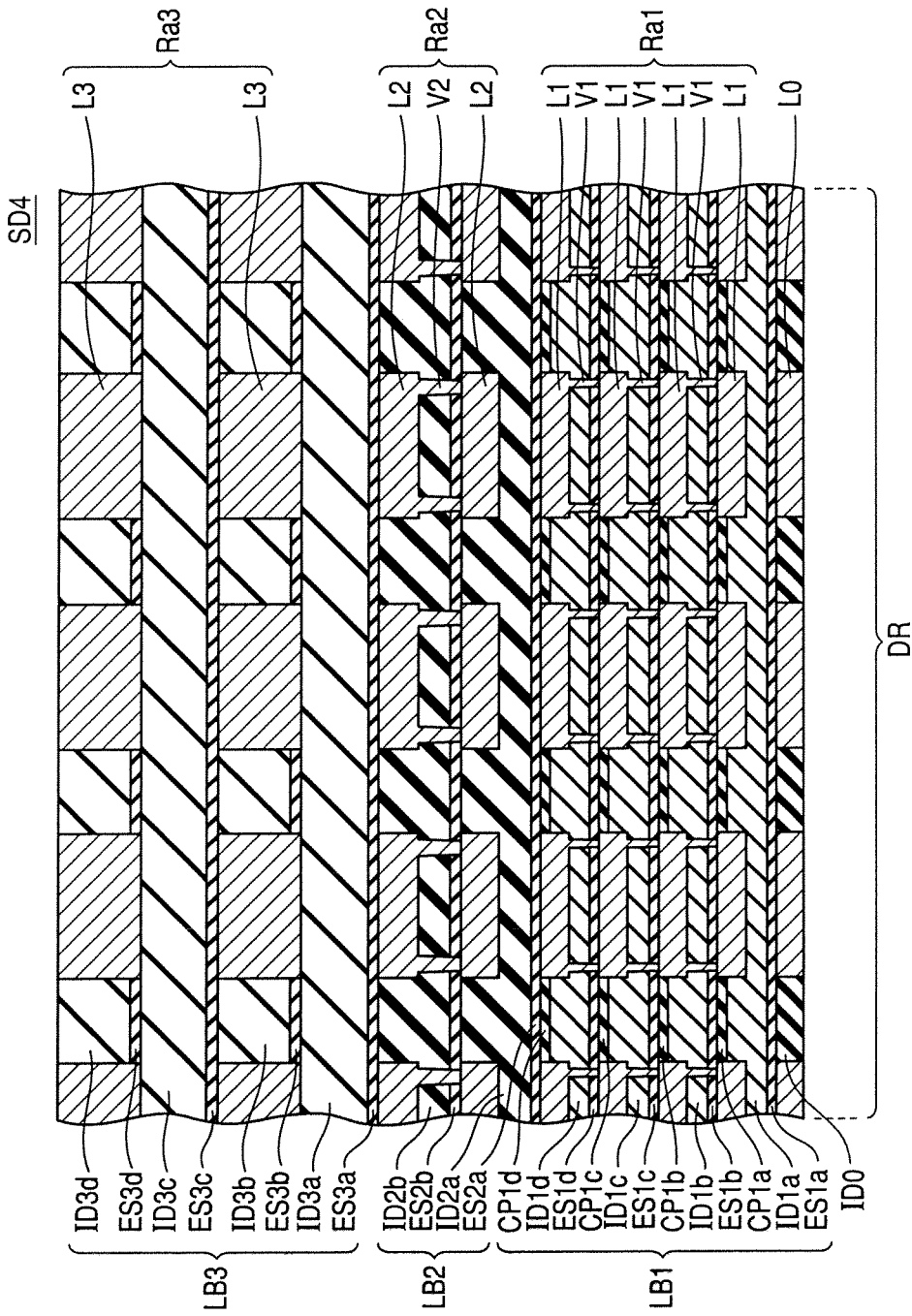
FIG. 32 is a schematic sectional view taken along line XXXII-XXXII in FIG. 29.

FIG. 29 is a partial sectional view showing schematically the configuration of a semiconductor device according to a fourth embodiment of the present invention. FIGS. 30 to 32 are schematic sectional views taken along lines XXX-XXX, XXXI-XXXI, and XXXII-XXXII, respectively, in FIG. 29. Sectional positions of FIGS. 29 to 32 correspond to FIGS. 4 to 7, respectively, in the first embodiment.

Referring mainly to FIG. 29, in the semiconductor device, indicated at SD4, of this fourth embodiment, a planar layout of third regions Ra3 comprises individual patterns arranged in a zigzag fashion at equal intervals in principle in a direction (the lateral direction in FIG. 29) orthogonal to the extending direction of a sealing ring SL. However, in the region defined by broken lines DC, a portion of the patterns are dropped out halfway in the layout, with third regions Ra3 being not formed therein.

Also as to planar layouts of first and second regions Ra1, Ra2, they are the same as the above planar layout of the third regions Ra3.

As to the other points in configuration than the above, they are almost the same as in the first embodiment. Therefore, as to the same or corresponding elements, they are identified by the same reference numerals as in the first embodiment and explanations thereof will be omitted.

Figure 33:
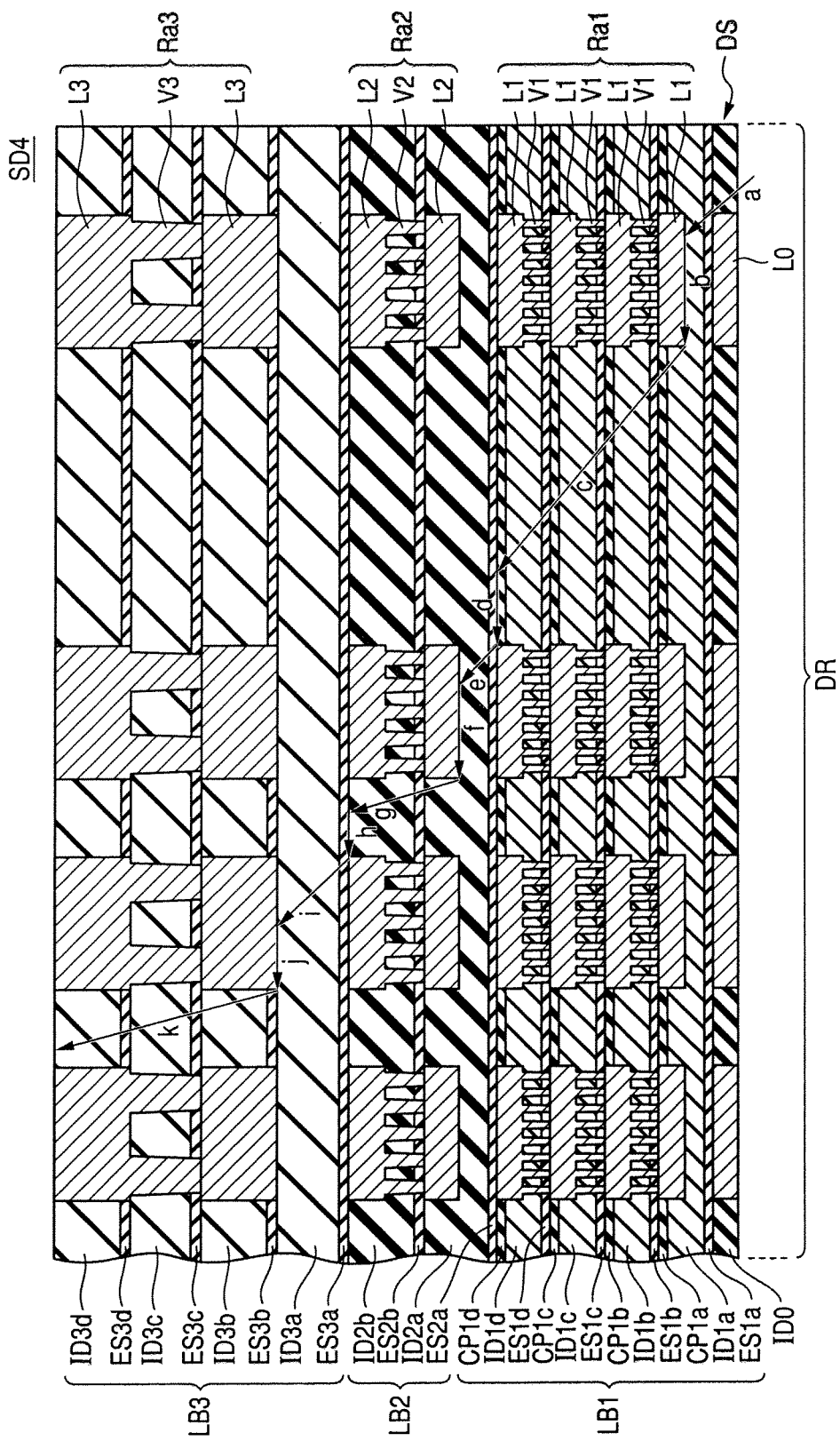
FIG. 33 is a partial sectional view showing schematically an example of a crack expanding course in the semiconductor device of the fourth embodiment.

FIG. 33 is a partial sectional view showing schematically an example of a crack advancing course in the semiconductor device of this fourth embodiment. FIG. 33 corresponds to FIG. 16 in the first embodiment.

Referring mainly to FIG. 33, in this embodiment, as compared with the first embodiment (FIG. 16), the spacing between a first region Ra1 located over an arrow, b, and a first region Ra1 adjacent thereto on the sealing ring SL side (left side in the figure) is large. That is, there is ensured a sufficient distance between a crack of the arrow, b, and the underside of a first region Ra1 which is spaced away from the crack in the sealing ring SL direction (leftwards in the figure), i.e., an easily cracked surface. Consequently, an immediate expansion of the crack of arrow, b, to the underside of he first region Ra1 located on the sealing ring SL side (left side in the figure), i.e., a lateral expansion of the crack instead of advancing in the direction of arrow, c, is suppressed. That is, as indicated with arrow, c, the crack can be conducted more positively up to the upper end of the first laminate LB1. Thus, it is possible to let the crack advance upwards through the semiconductor device SD4 in a positive manner.

Fifth Embodiment

Figure 34:
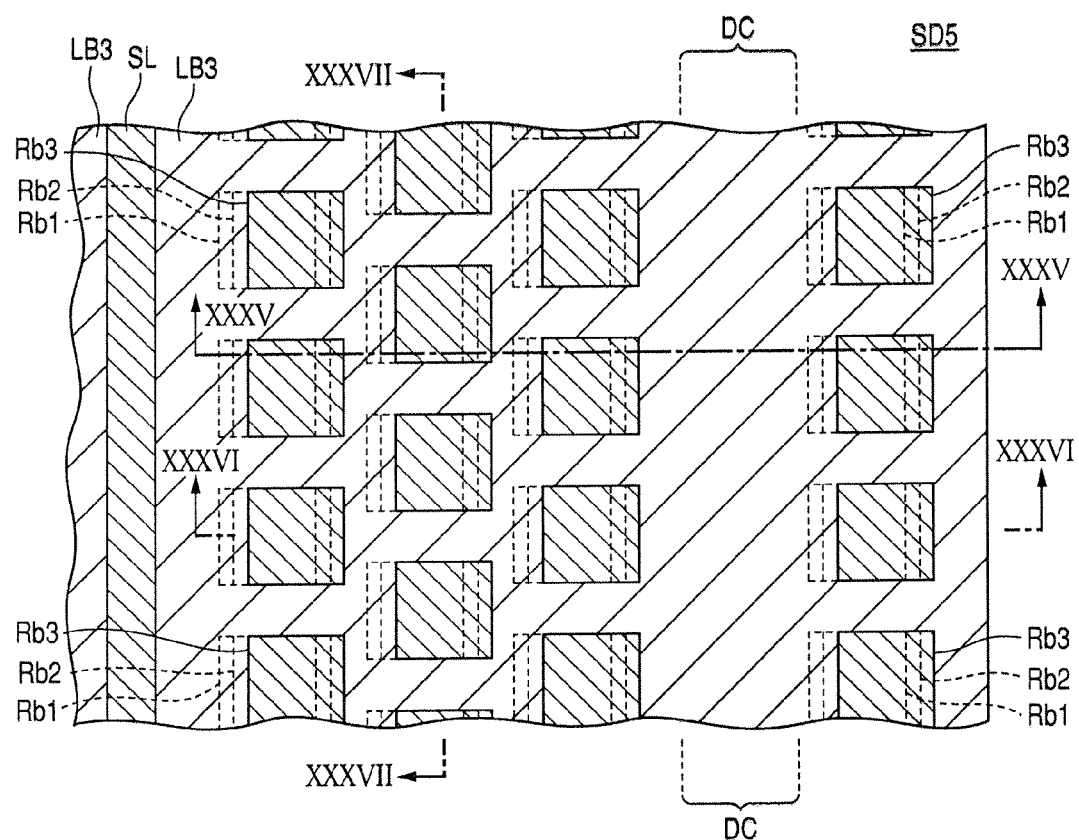
FIG. 34 is a partial sectional view showing schematically the configuration of a semiconductor device according to a fifth embodiment of the present invention.
Figure 35:
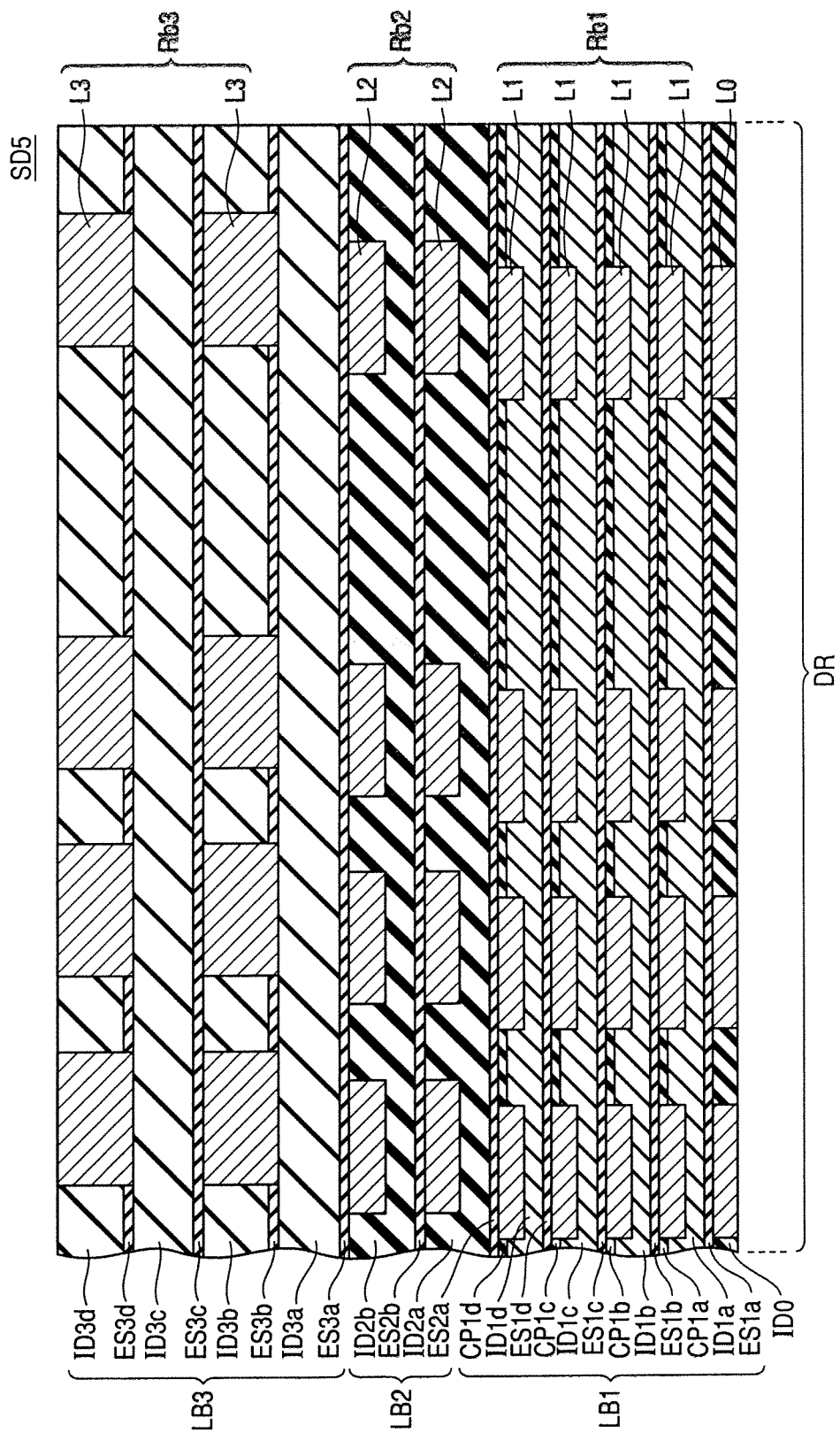
FIG. 35 is a schematic sectional view taken along line XXXV-XXXV in FIG. 34.
Figure 36:
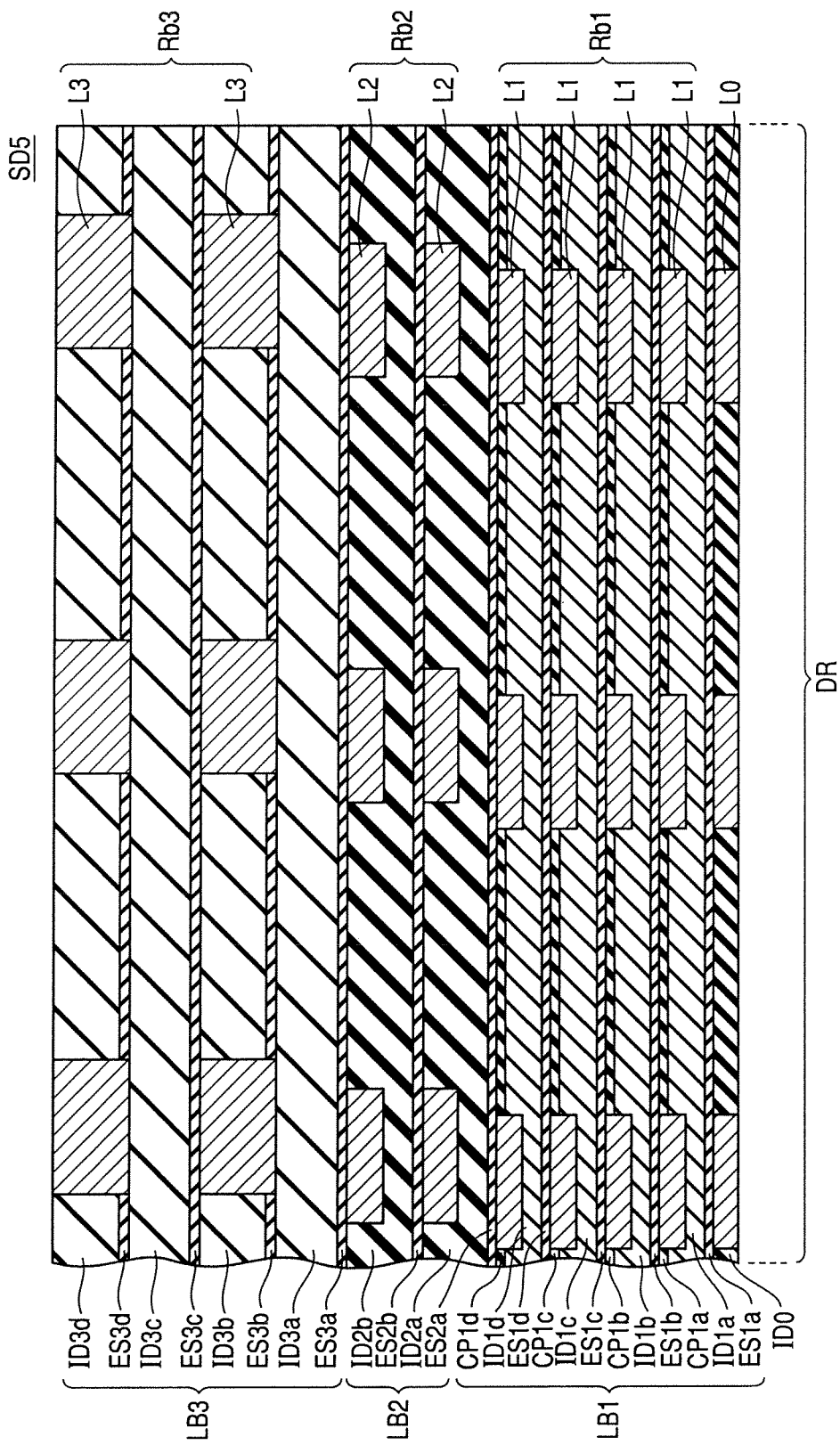
FIG. 36 is a schematic sectional view taken along line XXXVI-XXXVI in FIG. 34.
Figure 37:
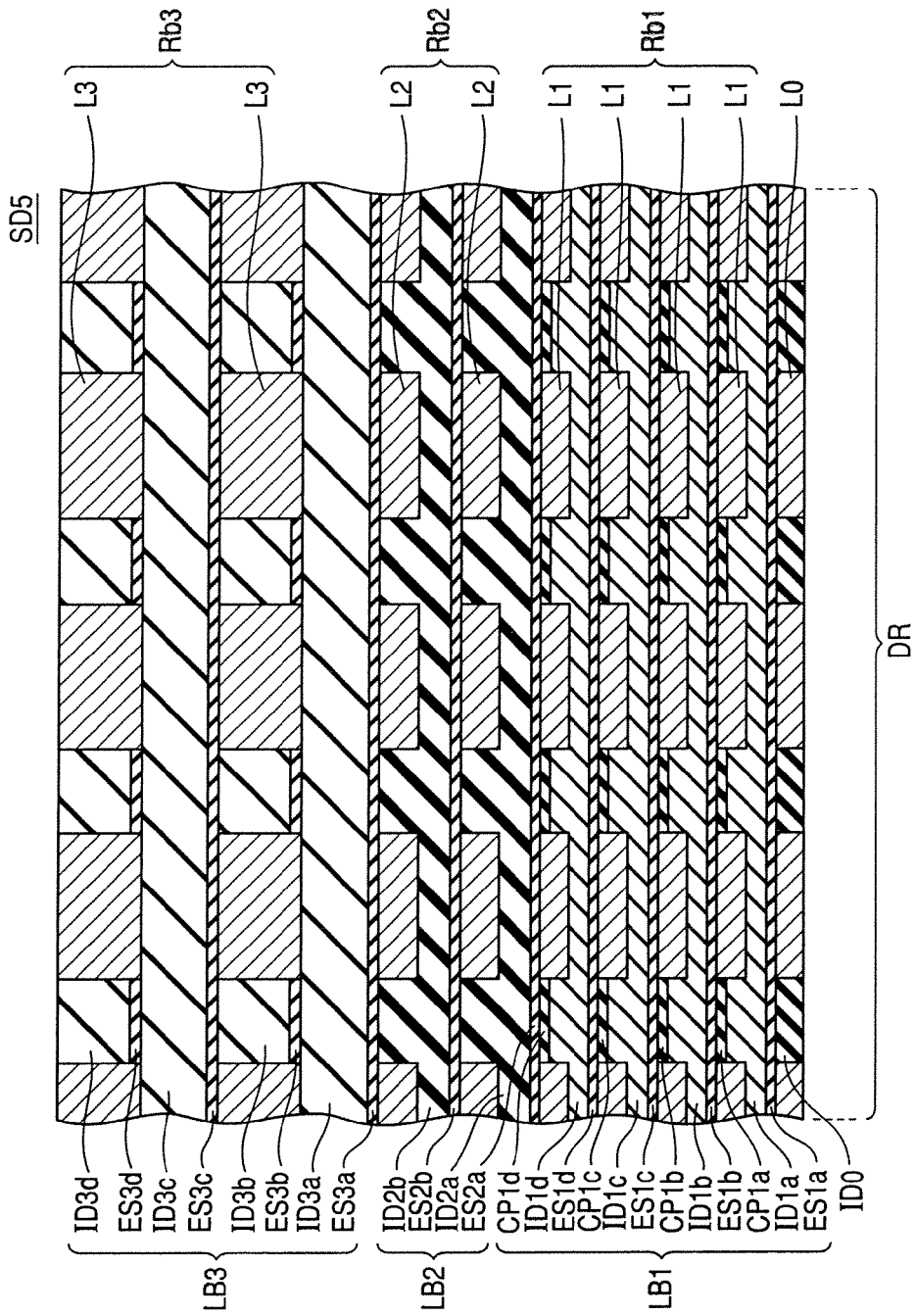
FIG. 37 is a schematic sectional view taken along line XXXVII-XXXVII in FIG. 34.

FIG. 34 is a partial sectional view showing schematically the configuration of a semiconductor device according to a fifth embodiment of the present invention. FIGS. 35 to 37 are schematic sectional views taken along lines XXXV-XXXV, XXXVI-XXXVI, and XXXVII-XXXVII, respectively, in FIG. 34. Sectional positions of FIGS. 34 to 37 correspond to FIGS. 20 to 23, respectively, in the second embodiment.

Referring mainly to FIG. 34, a planar layout of third regions Rb3 comprises individual patterns arranged in a zigzag fashion at equal intervals in principle in a direction (the lateral direction in FIG. 34) orthogonal to the extending direction of the sealing ring SL. However, in the region defined by broken lines DC, a portion of the patterns are dropped out halfway in the layout, with third regions Rb3 being not formed therein.

Also as to planar layouts of first and second regions Rb1, Rb2, they are the same as the above planar layout of the third regions Rb3, with a portion of the patterns being dropped out halfway in each layout.

As to the other points in configuration than the above, they are almost the same as in the above second embodiment. Therefore, as to the same or corresponding elements, they are identified by the same reference numerals as in the second embodiment and explanations thereof will be omitted.

According to this embodiment, as in the fourth embodiment, it is possible to conduct a crack upwards more positively in the region defined by the broken lines DC (FIG. 34). Thus, it is possible to let the crack advance upwards through the semiconductor device SD5 in a more positive manner.

Sixth Embodiment

Figure 38:
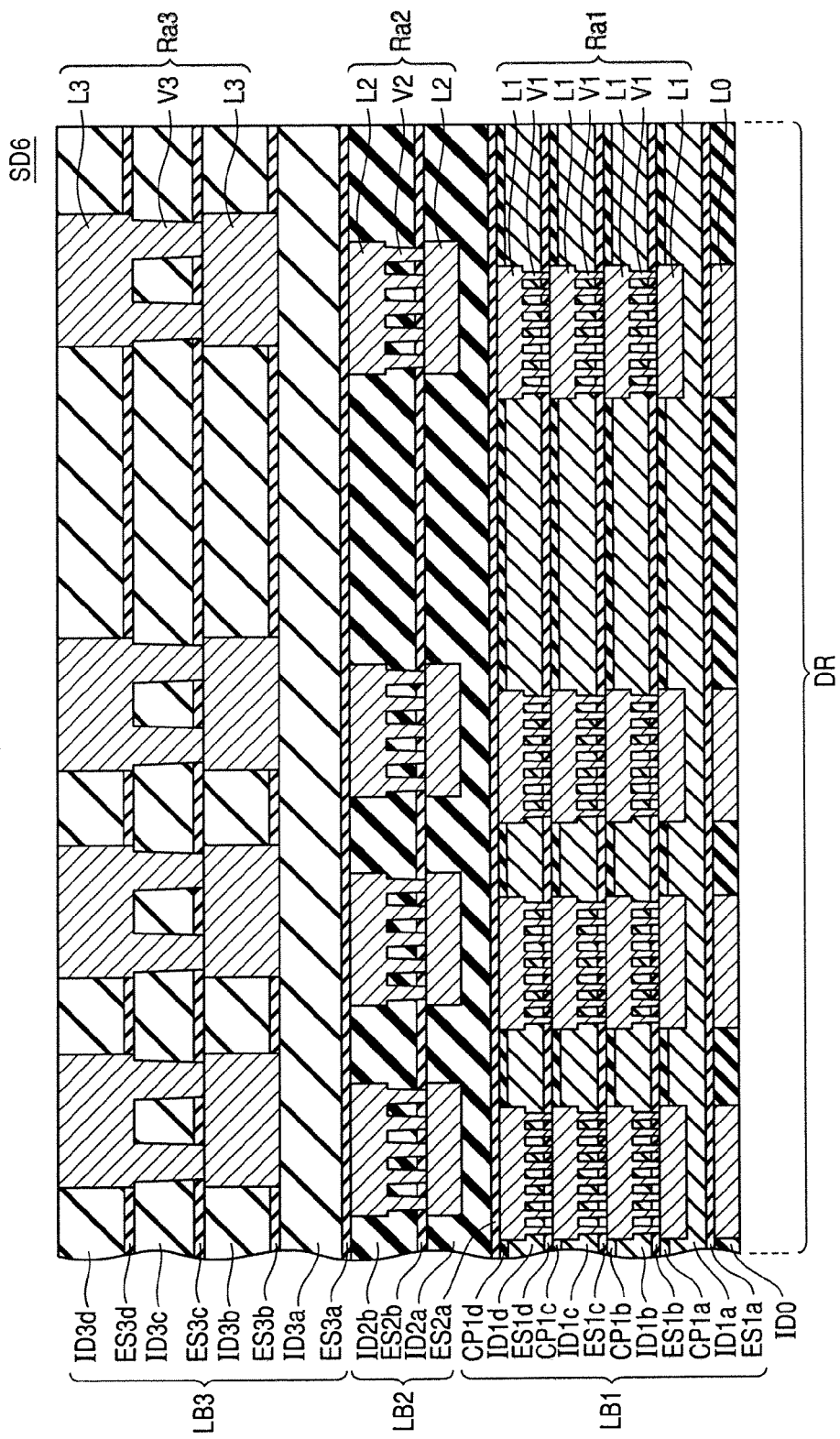
FIG. 38 is a partial sectional view showing schematically the configuration of a semiconductor device according to a sixth embodiment of the present invention.
Figure 39:
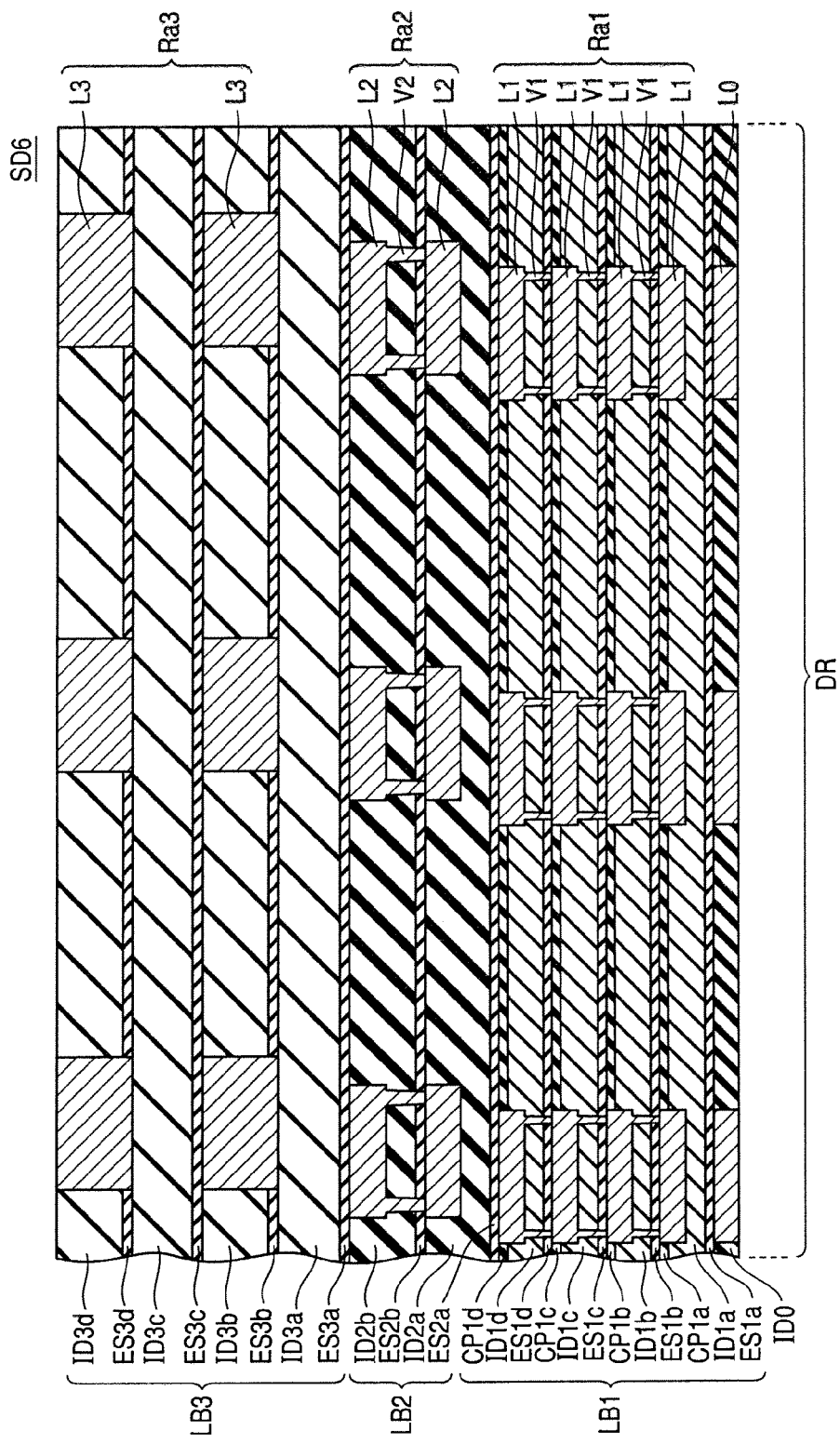
FIG. 39 is a partial sectional view showing schematically the configuration of a semiconductor device according to the sixth embodiment of the present invention.
Figure 40:
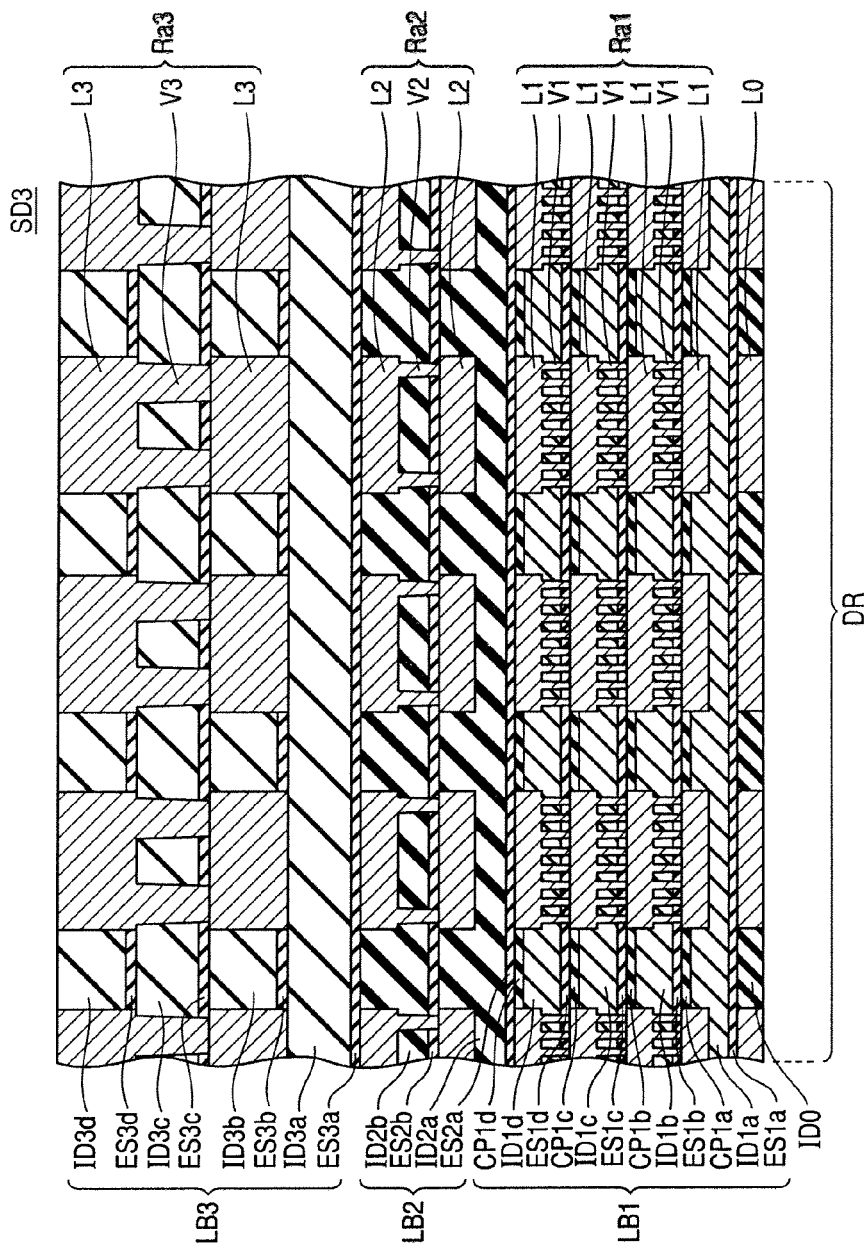
FIG. 40 is a partial sectional view showing schematically the configuration of the semiconductor device of the sixth embodiment.

FIGS. 38 to 40 are partial sectional views showing schematically the configuration of a semiconductor device according to a sixth embodiment of the present invention. Sectional positions of FIGS. 38 to 40 correspond to FIGS. 35 to 37, respectively, in the fifth embodiment.

Referring mainly to FIGS. 38 to 40, the semiconductor device, indicated at SD6, of this sixth embodiment includes first, second and third regions Ra1, Ra2, Ra3 instead of the first, second and third regions Rb1, Rb2 and Rb3, respectively, used in the semiconductor device SD5 (FIGS. 35 to 37) of the fifth embodiment.

As to the other points in configuration than the above, they are almost the same as in the fifth embodiment. Therefore, as to the same or corresponding elements, they are identified by the same reference numerals and explanations thereof will be omitted.

According to this sixth embodiment there is obtained the same effect as in the fifth embodiment. A plurality of first metallic layers L1 in each first region Ra1 are coupled together by vias V1. The region between a pair of first metallic layers L1 opposed to each other is difficult to be cracked because it is reinforced by vias V1. Consequently, it becomes less possible that a crack will pass between opposed first metallic layers L1 in each first region Ra1. Thus, it is possible to conduct a crack more positively up to the upper end of the first laminate LB1.

A plurality of second metallic layers L2 in each second region Ra2 are coupled together by vias V2. The region between a pair of second metallic layers L2 opposed to each other is difficult to be cracked because it is reinforced by vias V2. Consequently, it becomes less possible that a crack will pass between opposed second metallic layers L2 in each second region Ra2. Thus, it is possible to conduct a crack more positively up to the upper end of the second laminate LB2.

A plurality of third metallic layers L3 in each third region are coupled together by vias V3. The region between a pair of third metallic layers L3 opposed to each other is difficult to be cracked because it is reinforced by vias V3. Consequently, it is less possible that a crack will pass between opposed third metallic layers L3 in each third region Ra3. Thus, it is possible to let a crack advance upwards through the semiconductor device SD6 at a position (a right-hand position in the drawing) more distant from the sealing ring region SR.

Seventh Embodiment

Figure 41:
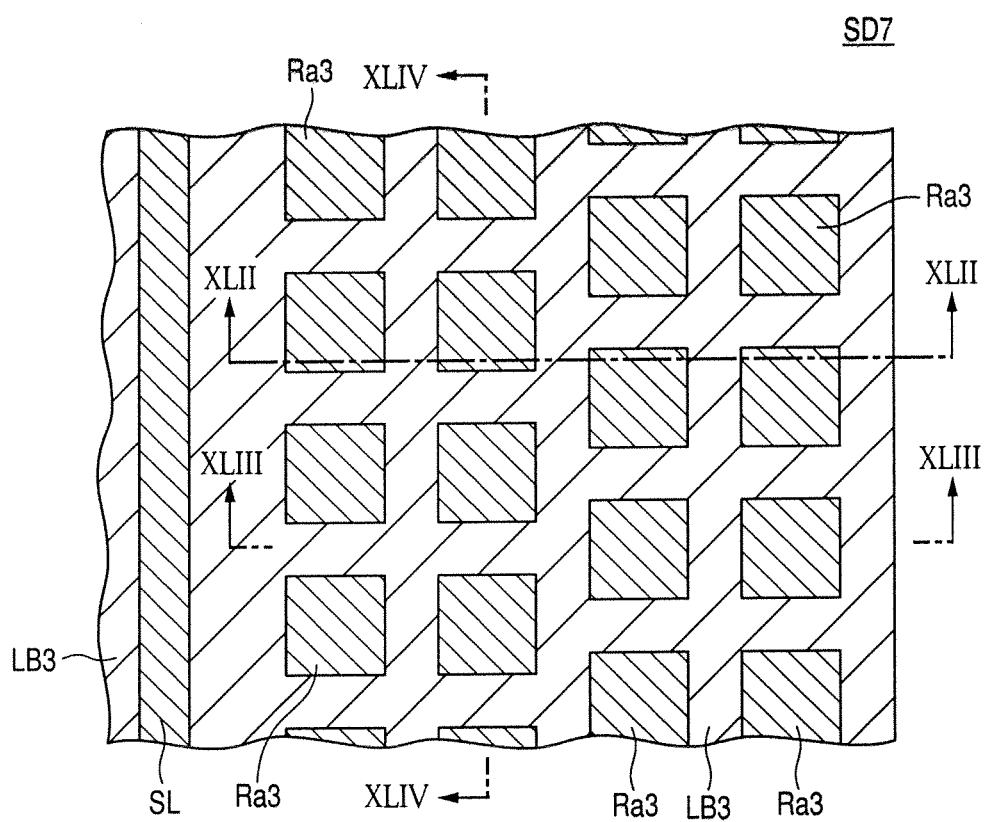
FIG. 41 is a partial sectional view showing schematically the configuration of a semiconductor device according to a seventh embodiment of the present invention.
Figure 42:
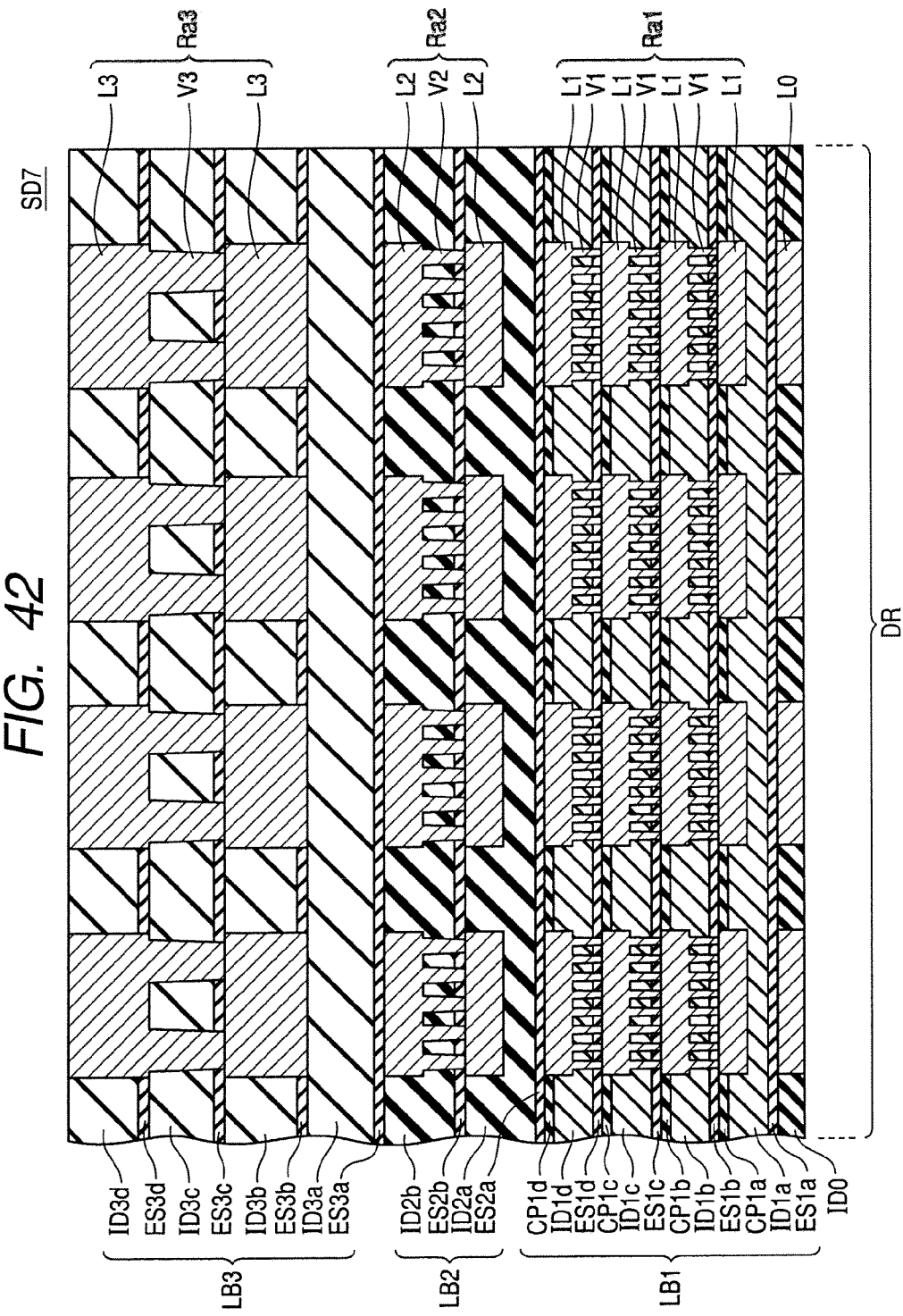
FIG. 42 is a schematic sectional view taken along line XLII-XLII in FIG. 41.
Figure 43:
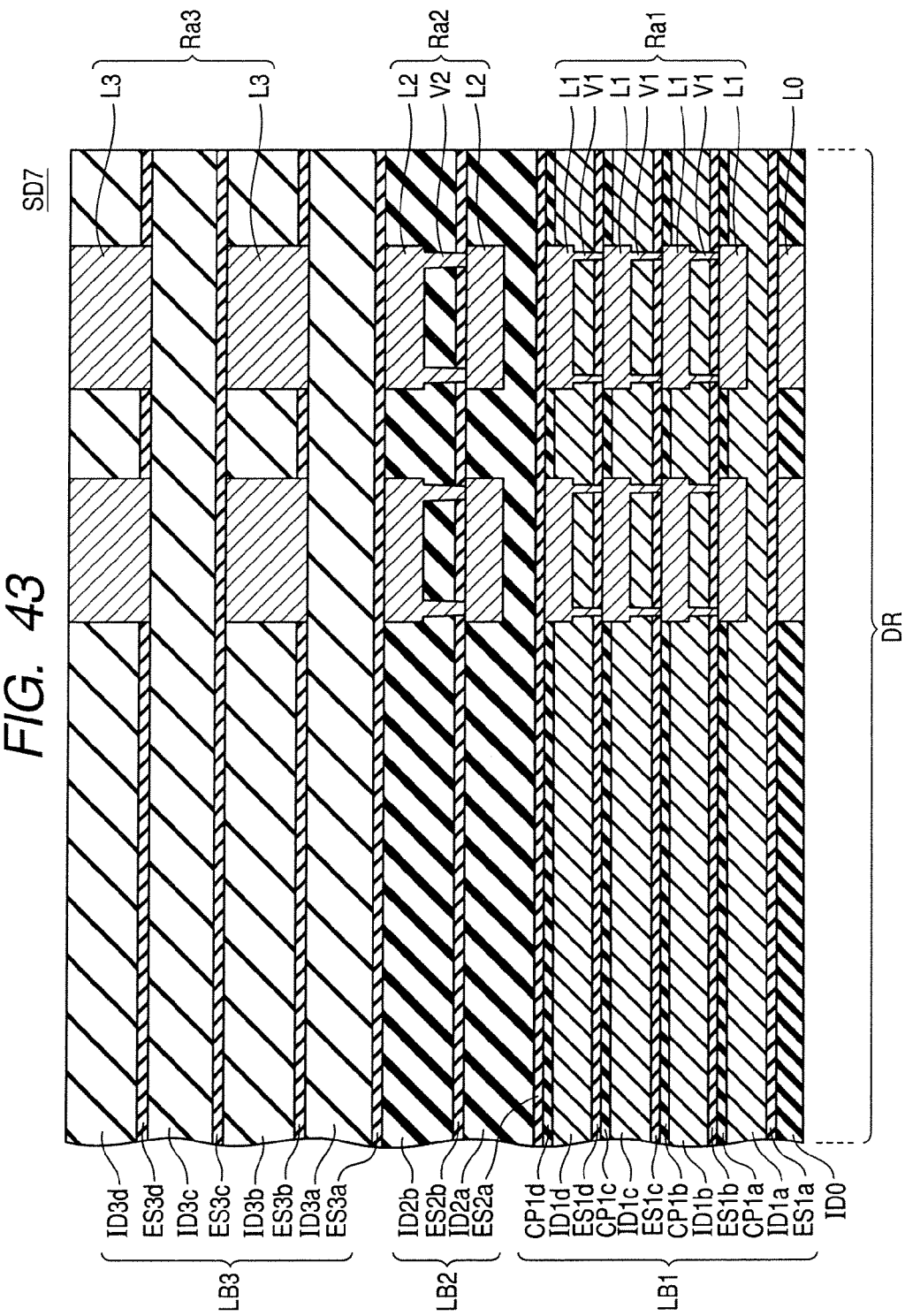
FIG. 43 is a schematic sectional view taken along line XLIII-XLIII in FIG. 41.
Figure 44:
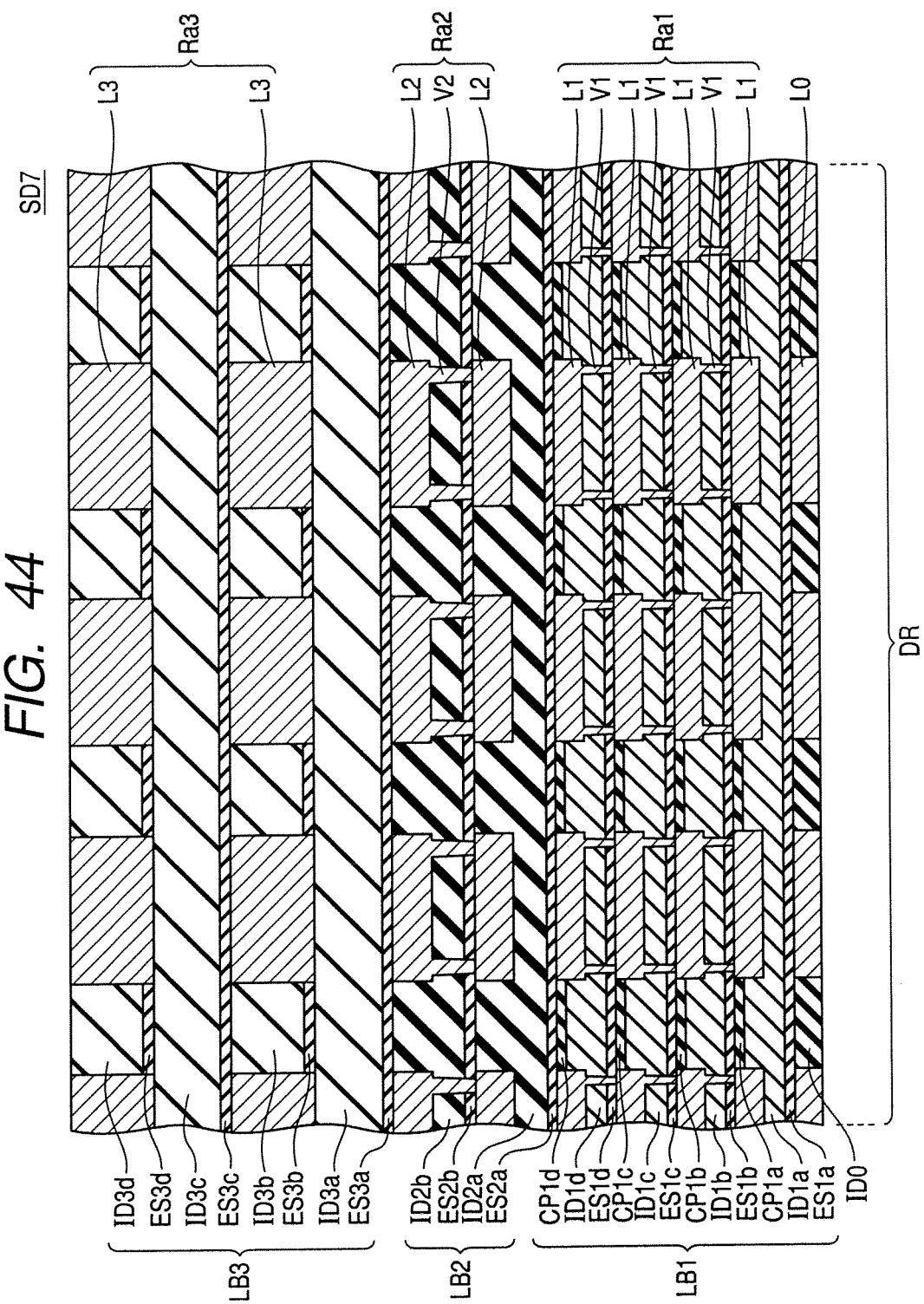
FIG. 44 is a schematic sectional view taken along line XLIV-XLIV.

FIG. 41 is a partial sectional view showing schematically the configuration of a semiconductor device according to a seventh embodiment of the present invention. FIGS. 42 to 44 are sectional views taken along lines XLII-XLII, XLIII-XLIII, and XLIV-XLIV, respectively, in FIG. 41. Sectional positions of FIGS. 41 to 44 correspond to FIGS. 4 to 7, respectively, in the first embodiment.

Referring mainly to FIG. 41, in the semiconductor device, indicated at SD7, of this seventh embodiment, third regions Ra3 are arranged two as one set in a zigzag fashion in a direction (the lateral direction in FIG. 41) orthogonal to the extending direction of the sealing ring SL.

As to the other points in configuration than the above, they are almost the same as in the first embodiment. Therefore, the same or corresponding elements are identified by the same reference numerals as in the first embodiment and explanations thereof will be omitted.

According to this seventh embodiment, as in the first embodiment, the occurrence of a crack which is rectilinear in a direction (the lateral direction in the drawing) orthogonal to the extending direction of the sealing ring SL and which does not undergo the action of third regions Ra3, between the sealing ring SL and the dicing face DS, is suppressed. This is also true of first and second regions Ra1, Ra2.

Eighth Embodiment

Figure 45:
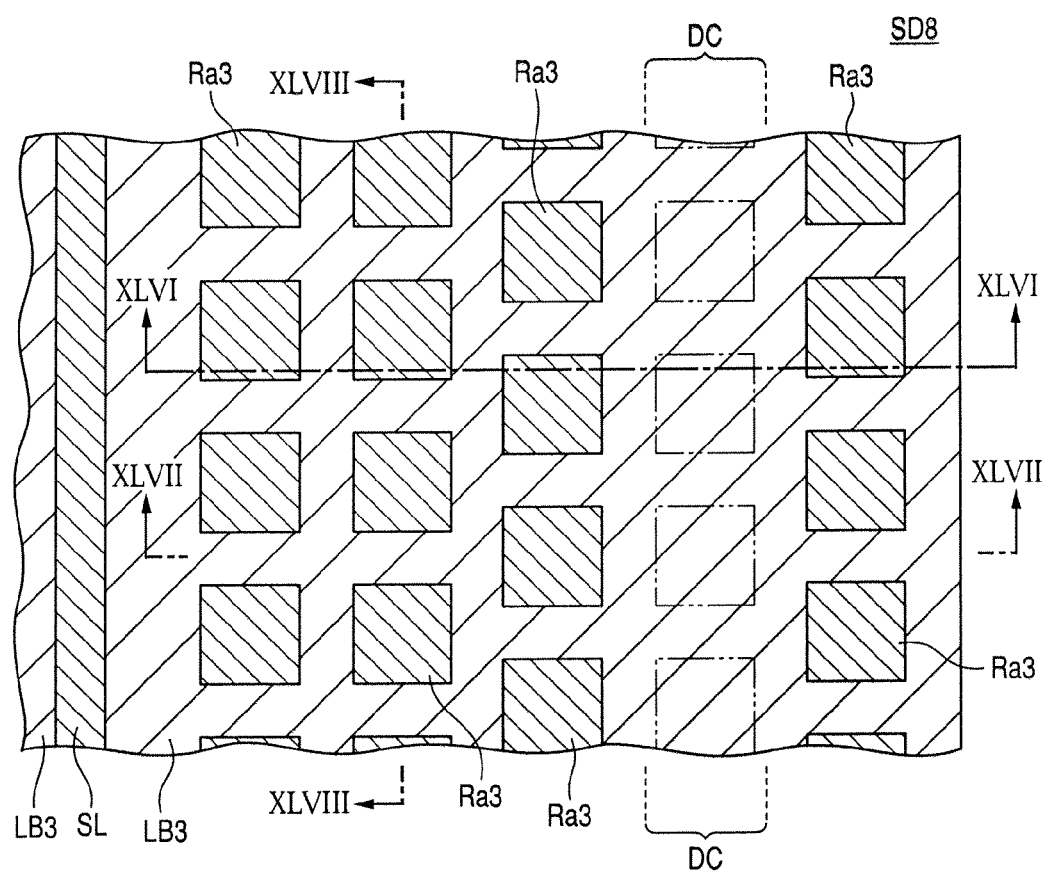
FIG. 45 is a partial sectional view showing schematically the configuration of a semiconductor device according to an eighth embodiment of the present invention.
Figure 46:
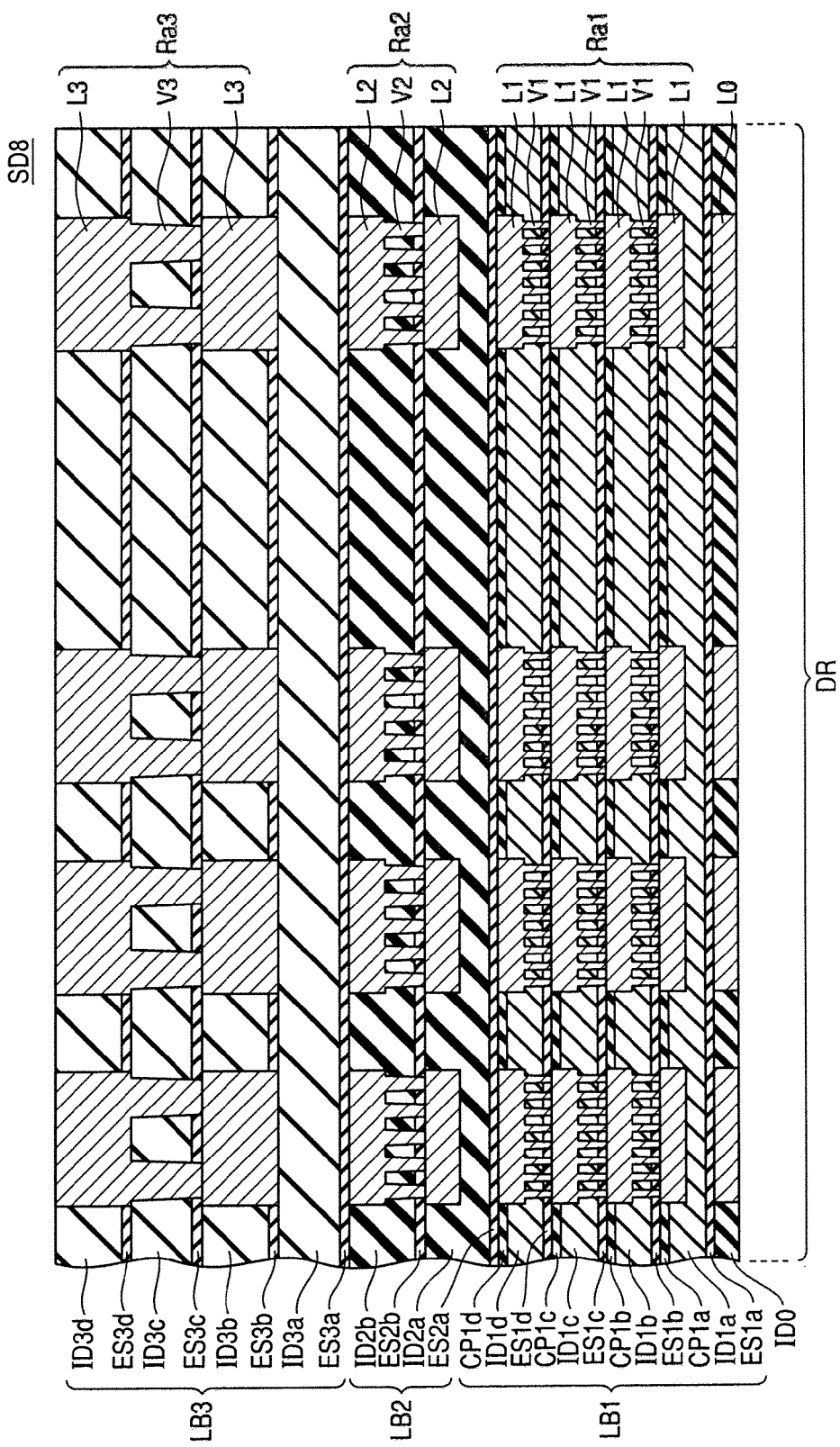
FIG. 46 is a schematic sectional view taken along line XLVI-XLVI in FIG. 45.
Figure 47:
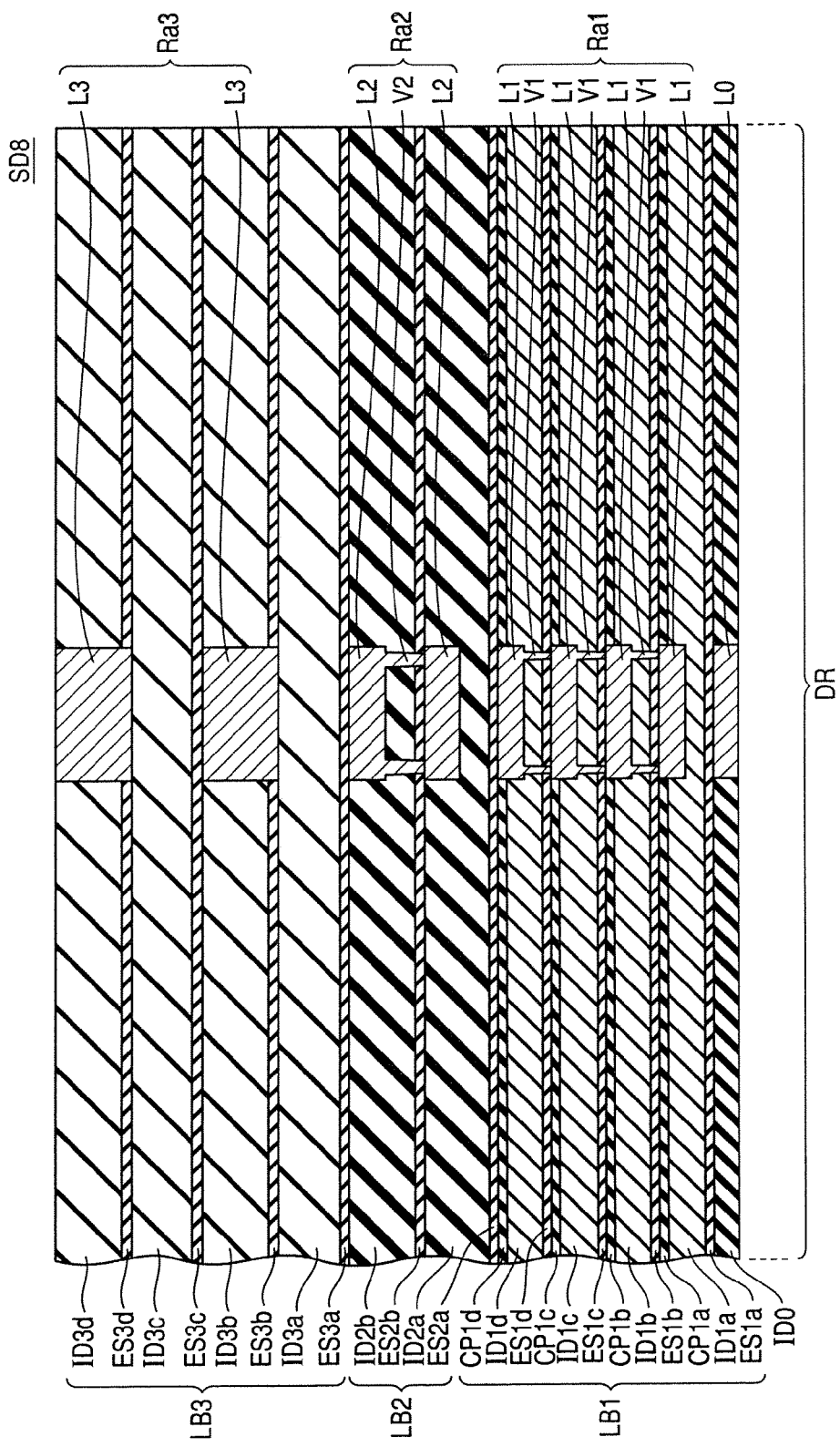
FIG. 47 is a schematic sectional view taken along line XLVII-XLVII in FIG. 45.
Figure 48:
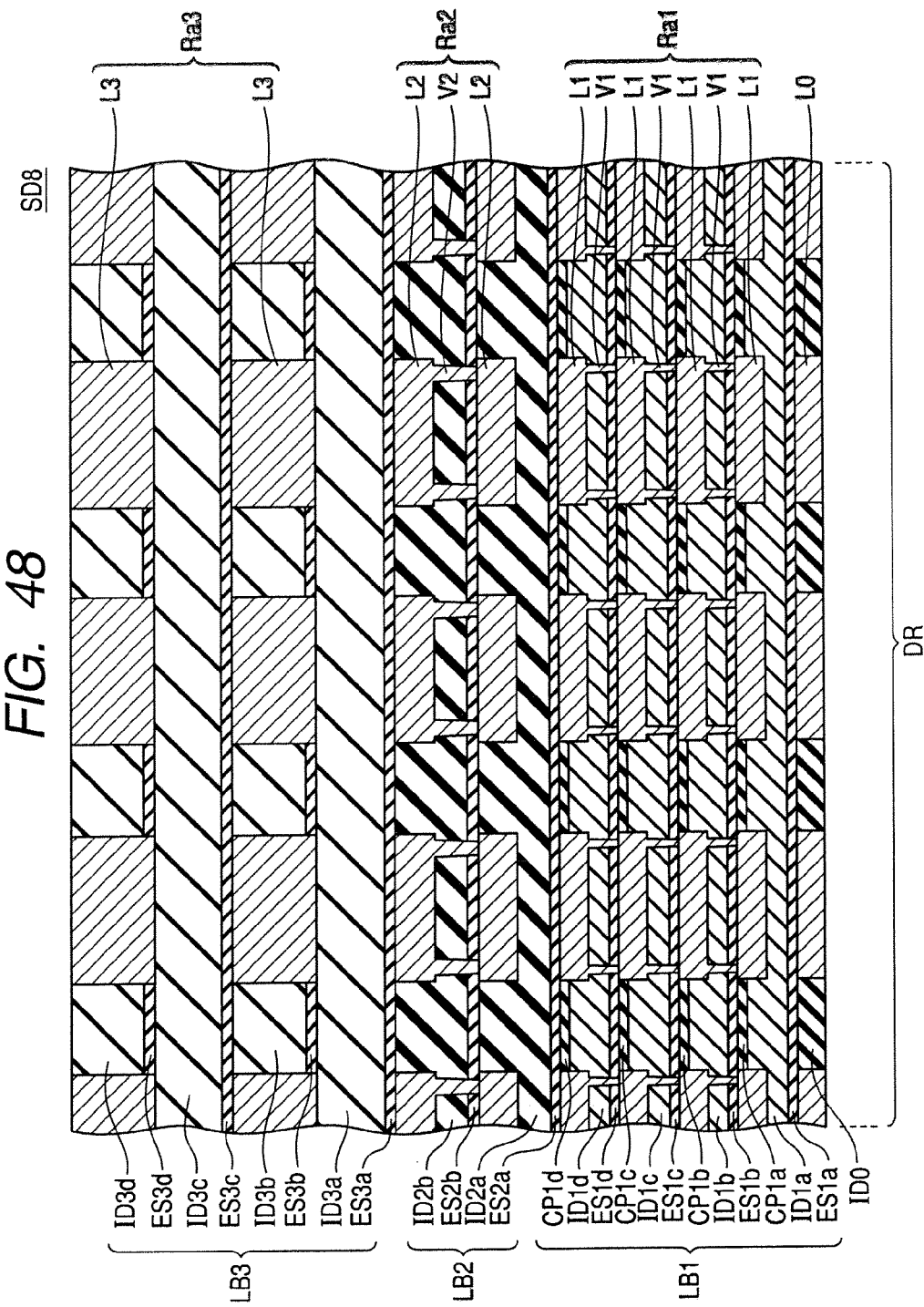
FIG. 48 is a schematic sectional view taken along line XLVIII-XLVIII in FIG. 45.

FIG. 45 is a partial sectional view showing schematically the configuration of a semiconductor device according to an eighth embodiment of the present invention. FIGS. 46 to 48 are schematic sectional views taken along lines XLVI-XLVI, XLVII-XLVII, and XLVIII-XLVIII, respectively, in FIG. 45. Sectional positions of FIGS. 45 to 48 correspond to FIGS. 41 to 44, respectively, in the seventh embodiment.

Referring mainly to FIG. 45, in the semiconductor device, indicated at SD8, of this eighth embodiment, a planar layout of third regions Ra3 comprise individual patterns arranged two as one set in a zigzag fashion in principle in a direction (the lateral direction in FIG. 45) orthogonal to the extending direction of the sealing ring SL. However, in the region defined by broken lines DC, a portion of the patterns are dropped out halfway in the layout, with third regions Ra3 being not formed therein, as indicated with dash-double dot lines. Also in planar layouts of first and second regions Ra1, Ra2, like the above planar layout of third regions Ra3, a portion of the patterns are dropped out halfway in the layouts.

As to the other points in configuration than the above, they are almost the same as in the seventh embodiment. Therefore, the same or corresponding portions are identified by the same reference numerals as in the seventh embodiment and explanations thereof will be omitted.

According to this eighth embodiment there is obtained the same effect as in the seventh embodiment. Moreover, like the fourth embodiment, a crack can be conducted upwards through the semiconductor device SD8 in a more positive manner in the region defined by broken lines DC (FIG. 45).

Ninth Embodiment

Figure 49:
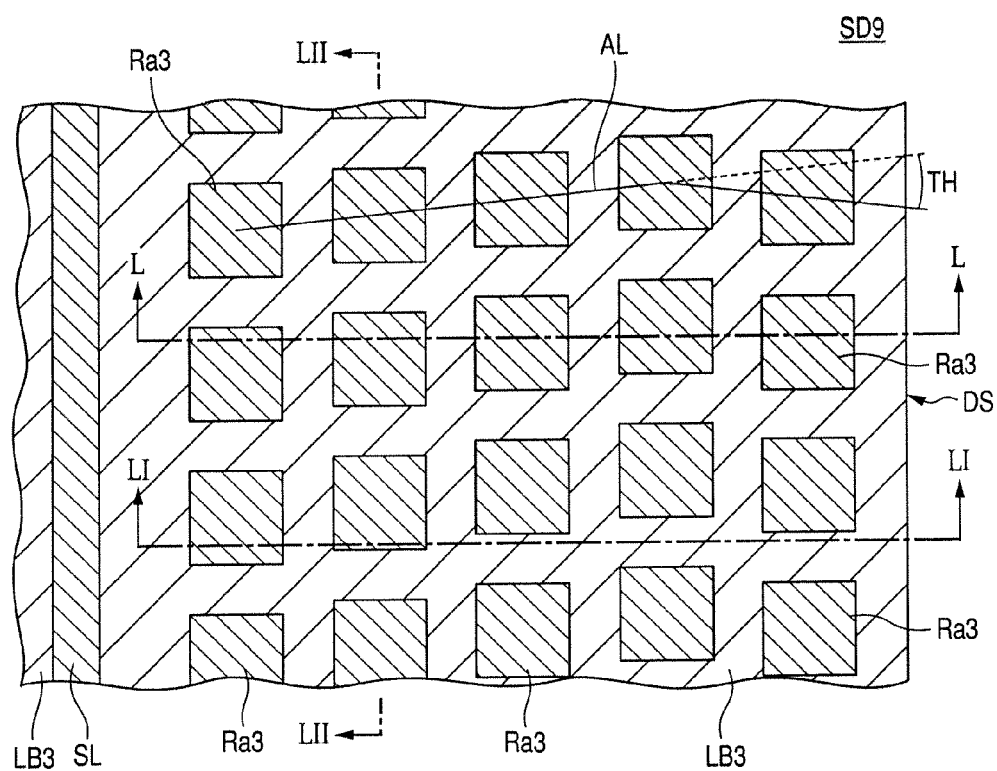
FIG. 49 is a partial sectional view showing schematically the configuration of a semiconductor device according to a ninth embodiment of the present invention.
Figure 50:
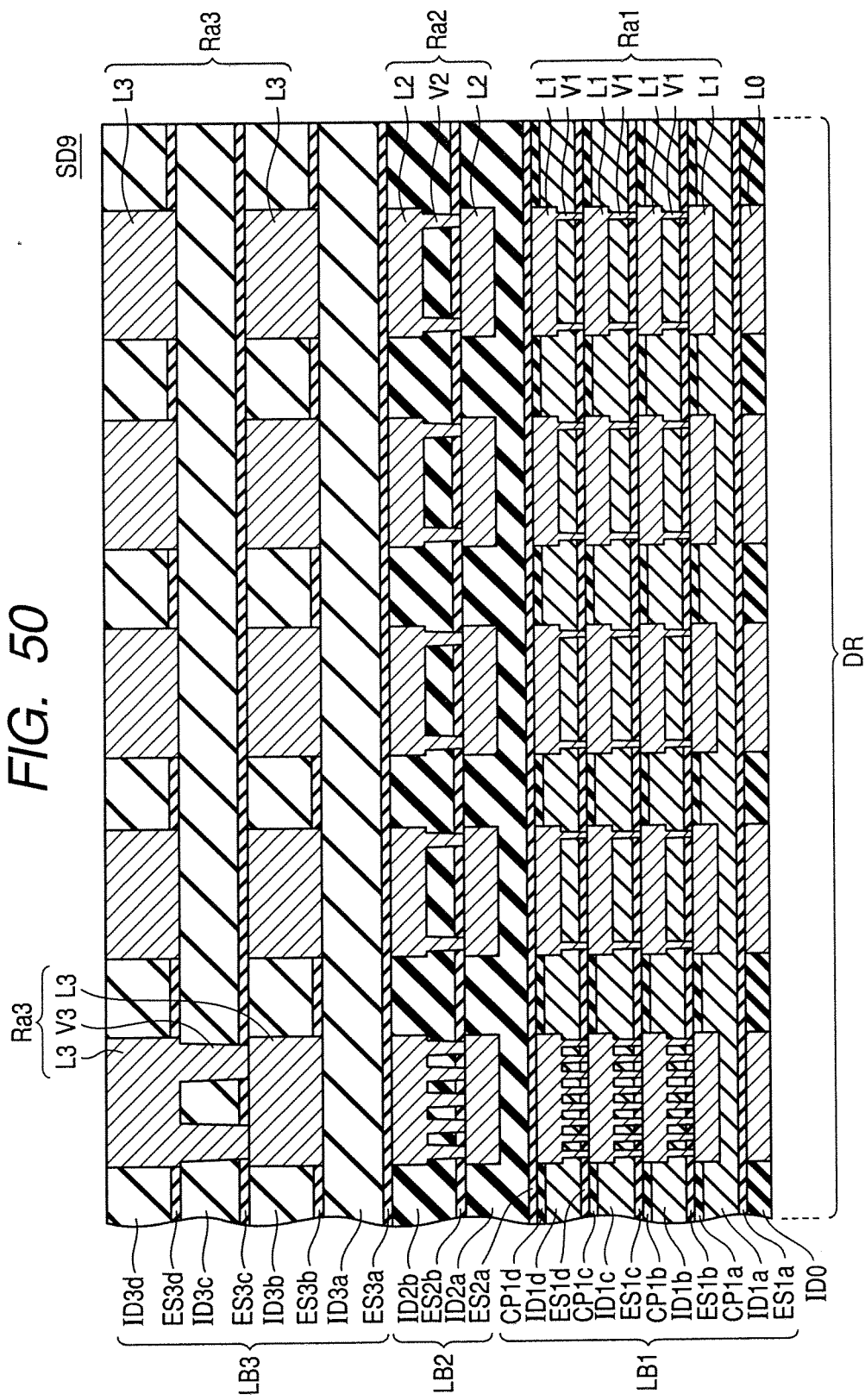
FIG. 50 is a schematic sectional view taken along line L-L in FIG. 49.
Figure 51:
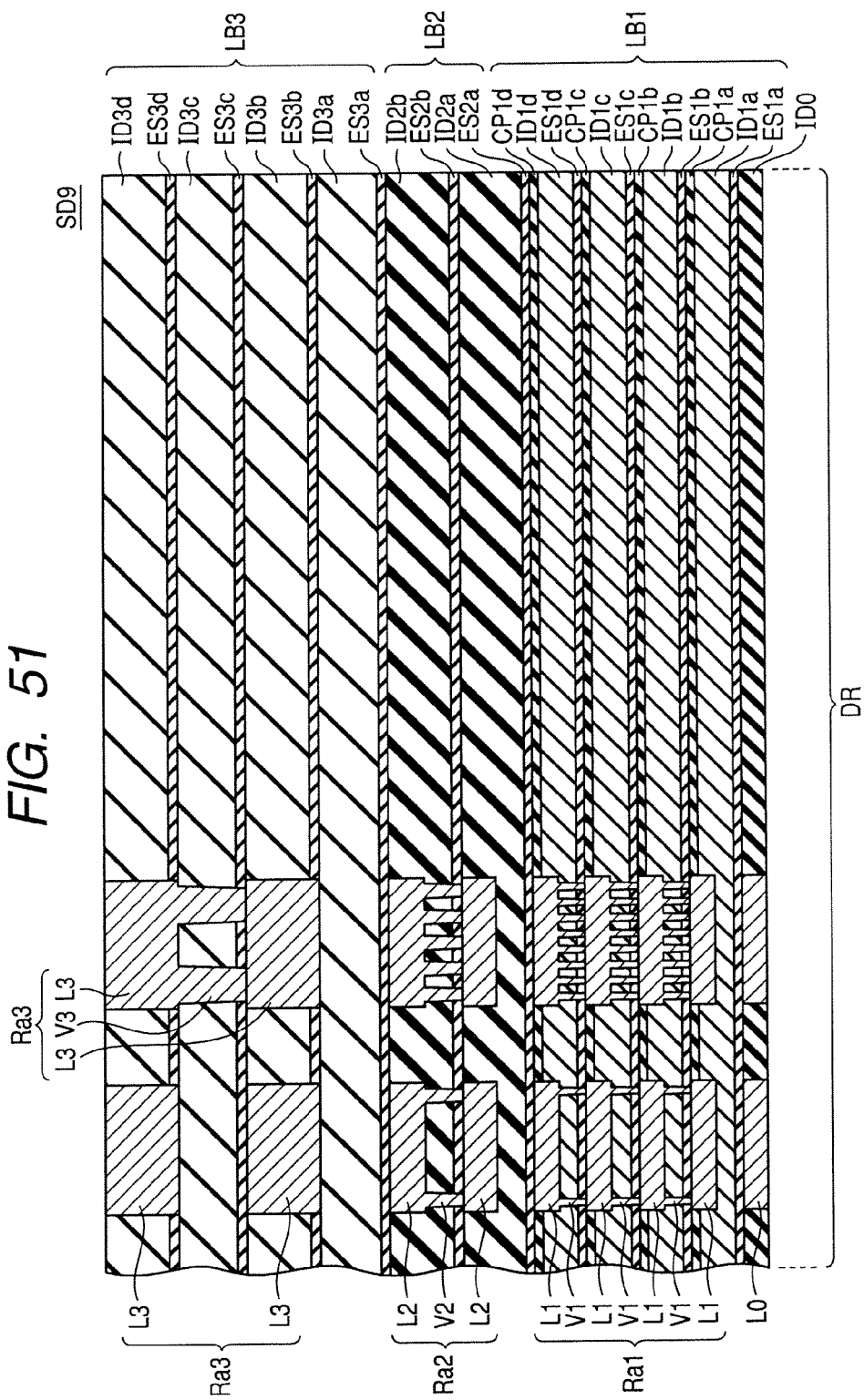
FIG. 51 is a schematic sectional view taken along line LI-LI in FIG. 49.
Figure 52:
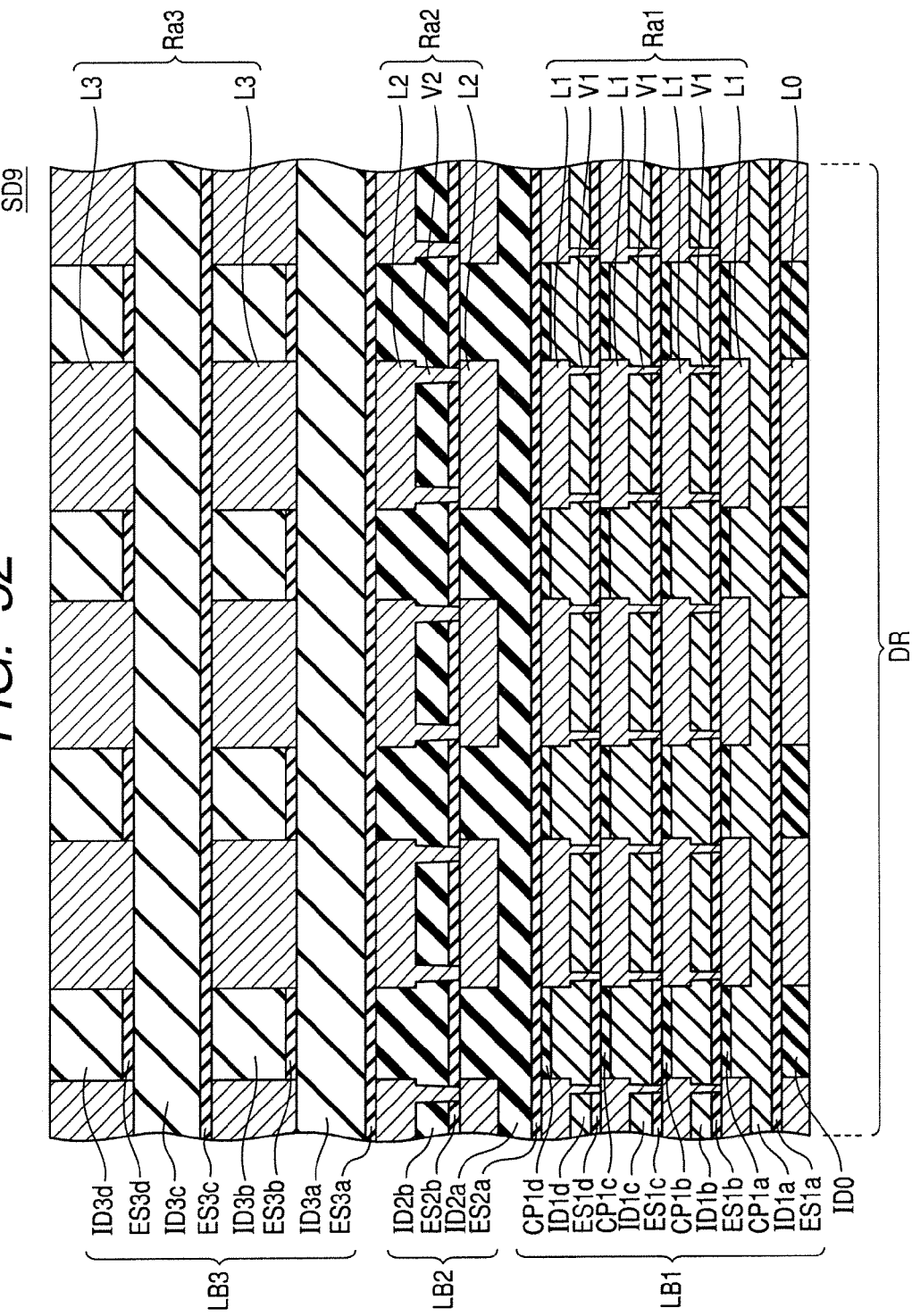
FIG. 52 is a schematic sectional view taken along line LII-LII in FIG. 49.

FIG. 49 is a partial sectional view showing schematically the configuration of a semiconductor device according to a ninth embodiment of the present invention. FIGS. 50 to 52 are schematic sectional views taken along lines L-L, LI-LI, and LII-LII, respectively, in FIG. 49. Sectional positions of FIGS. 49 to 52 correspond to FIGS. 4 to 7, respectively, in the first embodiment.

Referring mainly to FIG. 49, the semiconductor device, indicated at SD9, of this ninth embodiment, third regions Ra3 has a layout in a direction AL orthogonal to the extending direction of the sealing ring SL and a layout in a direction deviated at an angle of TH relative to the direction AL. First and second regions Ra1, Ra2 also have the same layout in plan.

As to the other points in configuration than the above, they are almost the same as in the first embodiment. Therefore, the same or corresponding elements are identified by the same reference numerals as in the first embodiment and explanations thereof will be omitted.

According to this ninth embodiment, each of the layouts of the first, second and third regions Ra1, Ra2, Ra3 includes the layout in the direction deviated at the angle TH relative to the direction AL. With this layout, a crack advancing in the direction AL is prevented from reaching the sealing ring SL rectilinearly through only an interlayer dielectric film from the dicing face DS.

Like the semiconductor devices SD1 and SD2 of the first and second embodiments, the semiconductor devices SD3 to SD9 of the third to ninth embodiments have the insulation films 75, 76, wiring 77, protective film 78, opening OP, layer M1 and the structure (the semiconductor substrate SB side) underlying the layer M1 (those are not shown in the third to ninth embodiments).

It should be understood that the above embodiments are illustrative and not limitative in all the points. The scope of the present invention is defined not by the above description but by the scope of the appended claims. It is intended that there are included all changes in the meaning and scope equivalent to the scope of the appended claims.

The present invention is applicable particularly advantageously to a semiconductor device having a sealing ring which surrounds a chip region, as well as a method for manufacturing the semiconductor device.

What is claimed is:

1. A semiconductor device comprising:
a semiconductor substrate;
a chip region which is formed over the semiconductor substrate;
a seal ring which surrounds the chip region in plan formed over the semiconductor substrate;
an outer region which surrounds an outer periphery of the seal ring in plan formed over the semiconductor substrate;
a first insulating layer which is provided in the chip region and the outer region over the semiconductor substrate and includes a first interlayer dielectric film having a first dielectric constant;
a second insulating layer which is provided in the chip region and the outer region over the first insulating layer and includes a second interlayer dielectric film having a second dielectric constant larger than the first dielectric constant;
a first wire which is provided within the first insulating layer in the chip region;
a second wire and a via which are provided within the second insulating layer in the chip region, and the second wire being electrically connected to the first wire by the via;
a plurality of first metallic patterns which are provided within the first insulating layer in the outer region; and
a plurality of second metallic patterns which are provided within the second insulating layer in the outer region,
wherein each of the second metal patterns is provided at a position deviated from each of the first metal patterns, so as to overlap a part of the each of the first metal patterns located under the each of the second metal patterns in a direction perpendicular to a surface of the semiconductor substrate, and is spaced away from the seal ring farther than the overlapped first metal pattern.

2. The semiconductor device according to claim 1,
wherein the plurality of second metal patterns are arranged in a plurality of rows extending substantially parallel to an adjacent portion of the seal ring,
wherein the second metal patterns in immediately adjacent rows are staggered relative to each other in plan.

3. The semiconductor device according to claim 1,
wherein a portion of the second interlayer dielectric film is sandwiched between the second metal patterns and the first metal patterns.

4. The semiconductor device according to claim 1,
wherein each of the first metallic patterns comprises a plurality of first metallic layers which are vertically stacked, and the plurality of first metallic layers are arranged in a mutually completely superimposed manner while assuming one and same shape in plan,
wherein each of the second metallic patterns comprises a plurality of second metallic layers which are vertically stacked, and the plurality of second metallic layers are arranged in a mutually completely superimposed manner while assuming one and same shape in plan.

5. The semiconductor device according to claim 1,
wherein each of the first and second patterns has four sides in plan.

6. The semiconductor device according to claim 1,
wherein, when seen in plan, each of the first and second metal patterns has a pattern with an area ranging from 1 to 4 square micrometers.

7. The semiconductor device according to claim 2,
wherein, when the rows are seen in plan they are shifted in a same pitch from other such that they are arranged in a zigzag fashion.

* * * * *